(12) United States Patent
Lewis et al.

(10) Patent No.: US 11,487,199 B2
(45) Date of Patent: Nov. 1, 2022

(54) SECONDARY ELECTRON GENERATING COMPOSITION

(71) Applicant: The University of Manchester, Manchester (GB)

(72) Inventors: Scott Lewis, Manchester (GB); Stephen Yeates, Manchester (GB); Richard Winpenny, Manchester (GB)

(73) Assignee: The University of Manchester, Manchester (GB)

( * ) Notice: Subject to any disclaimer, the term of this patent is extended or adjusted under 35 U.S.C. 154(b) by 151 days.

(21) Appl. No.: 16/803,871

(22) Filed: Feb. 27, 2020

(65) Prior Publication Data

US 2020/0201174 A1 Jun. 25, 2020

Related U.S. Application Data

(62) Division of application No. 15/128,683, filed as application No. PCT/GB2015/050884 on Mar. 24, 2015, now Pat. No. 10,599,032.

(30) Foreign Application Priority Data

Mar. 25, 2014 (GB) .................................. 1405335

(51) Int. Cl.
*G03F 7/004* (2006.01)
*G03F 1/78* (2012.01)
(Continued)

(52) U.S. Cl.
CPC .............. *G03F 7/0044* (2013.01); *G03F 1/78* (2013.01); *G03F 7/0042* (2013.01); *G03F 7/038* (2013.01);
(Continued)

(58) Field of Classification Search
CPC .......... H01L 21/30604; H01L 21/3081; H01L 21/52; H01L 21/563; H01L 21/76838;
(Continued)

(56) References Cited

U.S. PATENT DOCUMENTS 6,171,757 B1 1/2001 Angelopoulos et al.
6,436,605 B1 8/2002 Angelopoulos et al.
(Continued)

FOREIGN PATENT DOCUMENTS

EP 0097417 A2 1/1984
EP 2137110 A1 12/2009
(Continued)

OTHER PUBLICATIONS

PCT/GB2015/050884 International Search Report and Written Opinion dated Jul. 1, 2015; 10 pages.
(Continued)

*Primary Examiner* — Caleen O Sullivan
(74) *Attorney, Agent, or Firm* — Nixon Peabody LLP

(57) ABSTRACT

The present invention relates to a resist composition, especially for use in the production of electronic components via electron beam lithography. In addition to the usual base polymeric component (resist polymer), a secondary electron generator is included in resist compositions of the invention in order to promote secondary electron generation. This unique combination of components increases the exposure sensitivity of resists in a controlled fashion which facilitates the effective production of high-resolution patterned substrates (and consequential electronic components), but at much higher write speeds.

17 Claims, 13 Drawing Sheets

(51) Int. Cl.

| | |
|---|---|
| *H01L 23/00* | (2006.01) |
| *H01L 21/78* | (2006.01) |
| *H01L 21/768* | (2006.01) |
| *H01L 21/56* | (2006.01) |
| *H01L 21/52* | (2006.01) |
| *H01L 21/308* | (2006.01) |
| *H01L 21/306* | (2006.01) |
| *G03F 7/40* | (2006.01) |
| *G03F 7/32* | (2006.01) |
| *G03F 7/16* | (2006.01) |
| *G03F 7/038* | (2006.01) |
| *G03F 7/20* | (2006.01) |
| *G03F 7/039* | (2006.01) |

(52) U.S. Cl.
CPC .............. *G03F 7/039* (2013.01); *G03F 7/162* (2013.01); *G03F 7/168* (2013.01); *G03F 7/2059* (2013.01); *G03F 7/325* (2013.01); *G03F 7/40* (2013.01); *H01L 21/3081* (2013.01); *H01L 21/30604* (2013.01); *H01L 21/52* (2013.01); *H01L 21/563* (2013.01); *H01L 21/76838* (2013.01); *H01L 21/78* (2013.01); *H01L 24/81* (2013.01); *H01L 2224/8138* (2013.01)

(58) Field of Classification Search
CPC . H01L 21/78; H01L 24/81; H01L 2224/8138; H01L 23/48; G03F 7/2063; G03F 7/004; G03F 7/0044; G03F 1/78; G03F 7/0042; G03F 7/038; G03F 7/039; G03F 7/162; G03F 7/168; G03F 7/2059; G03F 7/325; G03F 7/40
USPC ........................................ 438/113; 430/270.1
See application file for complete search history.

(56) References Cited

U.S. PATENT DOCUMENTS

| | | | |
|---|---|---|---|
| 11,143,961 B1 * | 10/2021 | Lewis | ................... G03F 7/325 |
| 2005/0233259 A1 | 10/2005 | Endo et al. | |
| 2007/0123312 A1 | 5/2007 | Friedman et al. | |
| 2011/0293888 A1 * | 12/2011 | Stowers | ................ G03F 7/0043 428/141 |
| 2012/0141693 A1 | 6/2012 | Ward et al. | |
| 2013/0029270 A1 | 1/2013 | Hatakeyama | |
| 2013/0043389 A1 | 2/2013 | Schiavone et al. | |
| 2013/0224652 A1 | 8/2013 | Bass et al. | |
| 2014/0193749 A1 | 7/2014 | Takizawa et al. | |
| 2017/0256418 A1 | 9/2017 | Chang et al. | |

FOREIGN PATENT DOCUMENTS

| | | |
|---|---|---|
| EP | 2392969 A2 | 12/2011 |
| JP | 2010152136 A | 7/2010 |
| JP | 2012185484 A | 9/2012 |
| TW | 200501465 A | 1/2005 |
| WO | 2000052531 A1 | 9/2000 |
| WO | 2015145144 A1 | 10/2015 |

OTHER PUBLICATIONS

GB 1405335.9 UKIPO Search Report dated Jan. 27, 2015; 4 pages.
Rodriguez-Canto et al. Novel Patternable and Conducting Metal-Polymer Nanocomposites: a step towards advanced multifunctional materials. Proceedings of SPIE (2013). 8682; 10 pages.
Examination Report of EP 15713799.3, dated Sep. 16, 2019, 5 Pages.
Japanese Office Action of JP 2016-558672, dated Sep. 13, 2019, 2 Pages.
Notice of Allowance, U.S. Appl. No. 15/128,683, dated Nov. 20, 2019, 8 pages.
Search Report for TW 110131029 dated Apr. 29, 2022, 3 pages.

* cited by examiner (a)

(b)

(c)

(d)

(e)

SECONDARY ELECTRON GENERATING COMPOSITION

CROSS-REFERENCE TO RELATED APPLICATIONS

This application is a Divisional of U.S. application Ser. No. 15/128,683 filed Sep. 23, 2016, now U.S. Pat. No. 10,599,032, which is the National Phase of International Application No. PCT/GB2015/050884 filed Mar. 24, 2015, which designated the U.S. and that International Application was published under PCT Article 21(2) in English. This application also includes a claim of priority under 35 U.S.C. § 119(a) and § 365(b) to British patent application No. GB 1405335.9 filed Mar. 25, 2014, the entirety of which is hereby incorporated by reference.

INTRODUCTION

The present invention relates to a composition, especially a secondary electron generating composition ("SEG composition"), and in particular to a resist composition for use in the production of electronic components (e.g. via electron beam lithography). The present invention also provides a method for preparing a resist composition, a resist-coated material and a method for its preparation, an exposed resist-coated material and a method for its preparation, a patterned substrate and a method for its preparation, a plated substrate and a method for its preparation, an electronic component, and various uses of a resist composition, a resist-coated material, an exposed resist-coated material, a patterned substrate, or a plated substrate.

BACKGROUND

There is a continuous drive in the electronics industry to miniaturize integrated circuits, for a variety of reasons well known to those skilled in the art. Significant developments in the semiconductor industry were made possible by advances in photolithography, from the micron scale to the nanometer scale, but the physical resolution limits of optical lithography have now almost been reached, thus constraining further advancement. However, continued growth of the semiconductor industry depends on increasing the performance and reducing the cost of integrated circuits on a silicon substrate.

Recent developments in extreme ultraviolet (EUV) lithography, at 13.5 nm, has enabled some further scaling/miniaturization of integrated circuits, but enormous challenges still obstruct the full implementation of this technique in the semiconductor industry.

Electron-beam lithography (e-beam, EBL) has been considered as a potential complement to optical lithography on account of its high resolution. However, EBL is a notoriously slow process because it essentially involves slowly writing with an electron beam rather than simply exposing a photoresist to diffuse radiation through a photomask, as with of photolithography. To produce the dimensions required of an integrated circuit, an e-beam must be directed and held at a specific place on a resist material for a specific amount of time ("dwell time", usually nanoseconds) before being gradually moved across the resist in a desired pattern. The "step size", which determines the resolution (i.e. the size of each incremental step the e-beam makes during EBL), is typically of the order of about 10 nm, meaning that the overall EBL process is extremely protracted for a typical wafer 45 cm in size.

It is therefore an object of the present invention to solve at least one of the problems of the prior art.

Another object of the invention is to increase electron beam lithography write-speeds.

Another object of the invention is to decrease the intensity of incident exposure radiation required by lithography (whether e-beam or another form of radiation).

Another object of the invention is to reduce the amount of materials used in lithography, such as resist-coating materials.

Another object is to increase aspect ratios in lithography.
Another object is to increase resolution in lithography.

BRIEF SUMMARY OF THE DISCLOSURE

The present invention provides a composition comprising a secondary electron generator. As such the composition may be termed a secondary electron generating (SEG) composition. The present invention also provides various methods of using the SEG composition, and products prepared by such methods. The SEG compositions of the invention are especially useful as resist compositions, for instance, in the fabrication of electronic components or tools (e.g. photomasks) used in the fabrication of electronic components (e.g. integrated circuits).

Though the SEG compositions of the invention are often herein referred to as resist compositions, such resist compositions may be considered a subset of SEG compositions along with other subsets including non-resist compositions. As such, references herein to a "resist composition" may be suitably translated as a reference to an "SEG composition" in general (which may be either a resist composition or a non-resist composition), except where the context dictates otherwise, for instance, where such compositions are referenced specifically in the context of their resist behavior.

According to a first aspect of the present invention, there is provided a resist composition comprising:
(i) a base polymeric component; and
(ii) a secondary electron generator.

According to a second aspect of the present invention, there is provided a resist composition comprising:
(i) a base polymeric component; and
(ii) a secondary electron generator comprising a metal compound, wherein the metal compound comprises a metal species which has an atomic number (Z) greater than or equal to 21.

According to a third aspect of the invention, there is provided a resist composition comprising:
(i) a base polymeric component; and
(ii) a secondary electron generator comprising a compound having an effective atomic number ($Z_{eff}$) greater than or equal to 15 (optionally where $Z_{eff}$ excludes any solvates having a boiling point less than or equal to 150° C. at 100 kPa pressure).

Suitably the "effective atomic number ($Z_{eff}$)" is calculated as:

$$Z_{eff} = \Sigma \alpha_i Z_i$$

Where $Z_i$ is the atomic number of the ith element in the compound, and $\alpha_i$ is the fraction of the sum total of the atomic numbers of all atoms in the compound (i.e. the total number of protons in the compound) constituted by said ith element.

According to a fourth aspect of the present invention, there is provided a method of preparing a resist composition, the method comprising mixing together the individual components of the resist composition, optionally in the presence of a solvent or carrier.

According to a fifth aspect of the present invention, there is provided a resist-coated material comprising a base substrate coated with a coating of a resist composition as defined herein, wherein the coating is optionally a cured and/or dried coating.

According to a sixth aspect of the present invention, there is provided a method of forming a resist-coated material comprising, coating a base substrate with a coating of resist composition as defined herein, and optionally thereafter curing and/or drying the coating.

According to a seventh aspect of the present invention, there is provided a resist-coated material obtainable by, obtained by, or directly obtained by the method of forming a resist-coated material as defined herein.

According to an eighth aspect of the present invention, there is provided an exposed resist-coated material comprising a resist-coated material as defined herein, wherein parts of the coating of the resist-coated material are developer-soluble coating portions, and parts of the coating are developer-insoluble coating portions.

According to a ninth aspect of the present invention, there is provided a method of preparing an exposed resist-coated material (or a method of exposing a resist-coated material), the method comprising exposing part(s) of the coating of the resist-coated material to radiation; and optionally performing a post-exposure bake. Suitably, this exposure (and the optional post-exposure bake) gives rise to the afore described developer-solubility properties.

According to a tenth aspect of the present invention, there is provided an exposed resist-coated material obtainable by, obtained by, or directly obtained by the method of preparing an exposed resist-coated material (or method of exposing a resist-coated material) as defined herein.

According to an eleventh aspect of the present invention, there is provided a patterned substrate comprising a base substrate coated with a pattern layer, wherein:
the pattern layer comprises developer-insoluble coating portions of (or derived from) a coating defined herein in relation to an exposed resist-coated material (i.e. coating portions derived from the resist composition of the invention);
the pattern layer comprises an array of grooves (and suitably ridges) extending through the pattern layer; and
the pattern layer is optionally a cured and/or dried pattern layer.

According to a twelfth aspect of the present invention, there is provided a method of preparing a patterned substrate (or a method of patterning a resist-coated material), the method comprising:
(i) preparing an exposed resist-coated material (or exposing a resist-coated material) as defined herein;
(ii) developing the exposed resist-coated material to generate a pattern layer; and
(iii) optionally curing and/or drying the pattern layer;
wherein:
the pattern layer comprises developer-insoluble coating portions, suitably of (or derived from) a coating defined herein in relation to an exposed resist-coated material (i.e. coating portions derived from the resist composition of the invention);
the pattern layer comprises an array of grooves (and suitably ridges) extending through the pattern layer.

According to a thirteenth aspect of the present invention, there is provided a patterned substrate obtainable by, obtained by, or directly obtained by the method of preparing a patterned substrate (or method of patterning a resist-coated material) as defined herein.

According to a fourteenth aspect of the present invention, there is provided a plated substrate comprising a base substrate coated with a pattern layer, wherein:
the pattern layer comprises developer-insoluble coating portions of (or derived from) a coating defined herein in relation to an exposed resist-coated material (i.e. coating portions derived from the resist composition of the invention);
the pattern layer comprises an array of grooves (and suitably ridges) extending through the pattern layer;
the pattern layer is optionally a cured and/or dried pattern layer;
wherein some or all of the grooves (or optionally instead some or all of the ridges) of the pattern layer comprise a plating material therein (or optionally thereupon in relation to the ridges).

According to a fifteenth aspect of the present invention, there is provided a method of preparing a plated substrate (or a method of plating a patterned substrate), the method comprising:
(i) preparing a patterned substrate (or patterning a resist-coated material) as defined herein; and
(ii) depositing a plating material within some or all of the grooves (or optionally instead upon some or all of the ridges) of the pattern layer of the patterned substrate.

According to a sixteenth aspect of the present invention, there is provided a plated substrate obtainable by, obtained by, or directly obtained by the method of preparing a plated substrate (or method of plating a patterned substrate) as defined herein.

According to a seventeenth aspect of the present invention, there is provided an electronic component comprising a plated substrate as defined herein, wherein the plating material of the plated substrate forms an array of electrically conductive tracks positioned within the grooves (or optionally instead upon the ridges) of the pattern layer.

According to a eighteenth aspect of the present invention, there is provided a use of a resist composition, a resist-coated material, an exposed resist-coated material, a patterned substrate, or a plated substrate, as defined herein to produce an electronic component.

According to an nineteenth aspect of the present invention, there is provided a use of a secondary electron generator, as defined herein, to achieve one or more of the following effects:
a) increased exposure sensitivity of a resist composition or coating thereof;
b) decreased intensity of incident exposure radiation;
c) increased write-speed during electron beam exposure;
d) decreased resist-coating thickness;
e) increased resolution.

According to a twentieth aspect of the present invention, there is provided a use of a resist composition, as defined herein, to achieve one or more of the following effects:
a) increased exposure sensitivity of a resist composition or coating thereof;
b) decreased intensity of incident exposure radiation;
c) increased write-speed during electron beam exposure;
d) decreased resist-coating thickness;
e) increased etch resistance;
f) increased resolution.

As explained hereinbefore, unless the context dictates otherwise, references herein to a "resist composition" may be translated as a reference to an SEG composition. Likewise, unless the context dictates otherwise, any product or method described herein in relation to or as derived from a "resist composition" may be translated as a product or method related to or derived from a corresponding "SEG composition". Thus references herein to a "coating of a resist composition", a "resist coating", a "resist-coated material", and a "resist-coated substrate" may be suitably and respectively translated as a reference to a "coating of an SEG composition" (whether a resist or non-resist composition), an "SEG coating" (whether a resist or non-resist coating), an "SEG-coated material" (whether a resist- or non-resist-coated material), and an SEG-coated substrate (whether a resist- or non-resist-coated substrate).

Moreover, though SEG compositions (particularly where they are referred to as "resist compositions"), and/or products/methods related thereto and/or derived therefrom, may be defined herein by reference to a "base polymeric component", any such reference may be suitably translated as a reference to any "base component", whether polymeric or otherwise (e.g. macromolecular, a complex, etc.). Suitably the base component may act as a vehicle for the secondary electron generator. Suitably the base component is sensitive and/or suitably transformed upon exposure to radiation, though in some embodiments the base component may be (substantially) insensitive and/or (substantially) untransformed upon exposure to radiation. Optionally, the base component may be absent altogether. The base component may suitably be a base polymeric component or a non-polymeric base component, or may be otherwise absent altogether.

By way of example, in an aspect of the present invention there is provided a secondary electron generating (SEG) composition, comprising:

a secondary electron generator (suitably as defined herein); and optionally a base component, where the base component may be selected from a base polymeric component (or polymeric base component) and/or a non-polymer base component.

Features, including optional, suitable, and preferred features of any aspect of the present invention may, where appropriate, be also features, including optional, suitable, and preferred features of any other aspect of the present invention.

BRIEF DESCRIPTION OF THE DRAWINGS

For a better understanding of the present invention, and to show how embodiments of the same are put into effect, reference is now made, by way of example, to the following figures, in which.

DETAILED DESCRIPTION OF THE INVENTION

Definitions

Figure 1A:
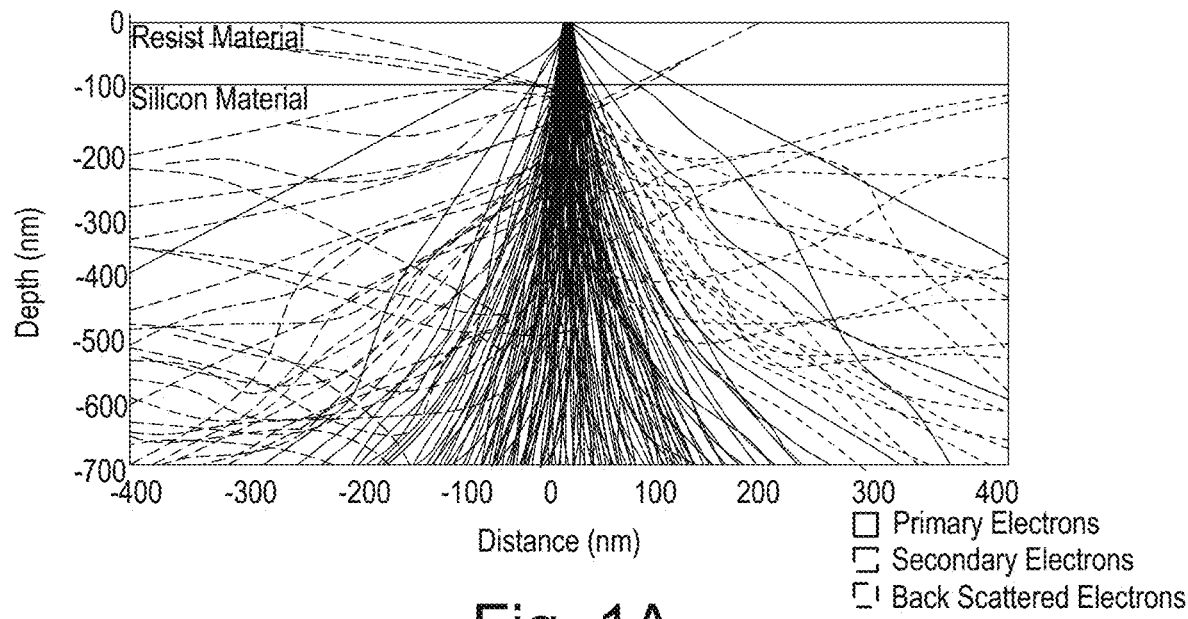
FIG. 1A-1D shows internal electron scattering interactions inside (1A) PMMA exposed to an acceleration voltage of 30 KeV; (1B) PMMA films that were loaded with 10% $HAuCl_4.4H_2O$ exposed to an acceleration voltage of 30 KeV; (1C) PMMA films that were loaded with 16% $HAuCl_4.4H_2O$ exposed to an acceleration voltage of 30 KeV; and (1D) PMMA films that were loaded with 23% $HAuCl_4.4H_2O$ exposed to an acceleration voltage of 30 KeV. Primary, Secondary electrons and backscattered electrons are indicated in black and dark and light Grey respectively.
Figure 1B:
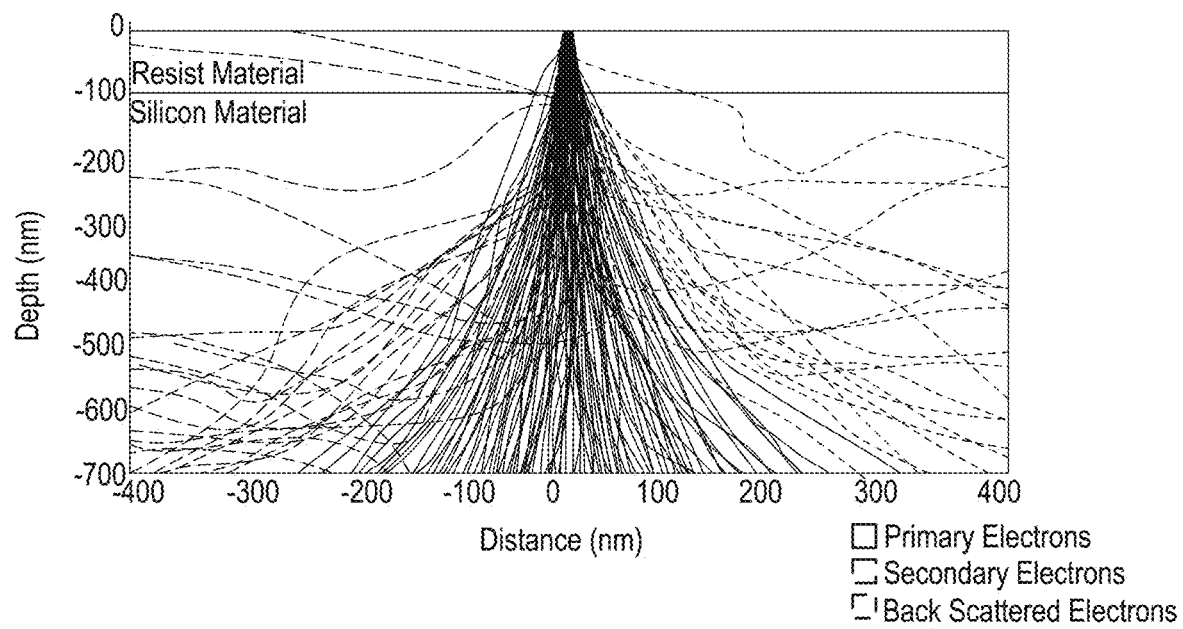
Figure 1C:
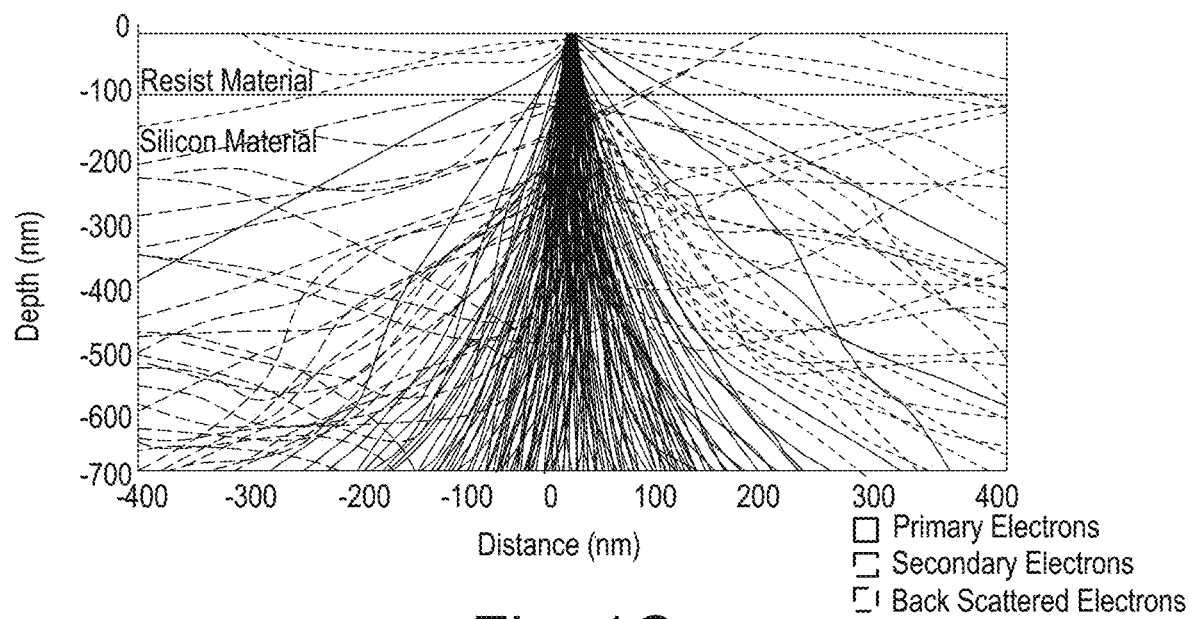
Figure 1D:
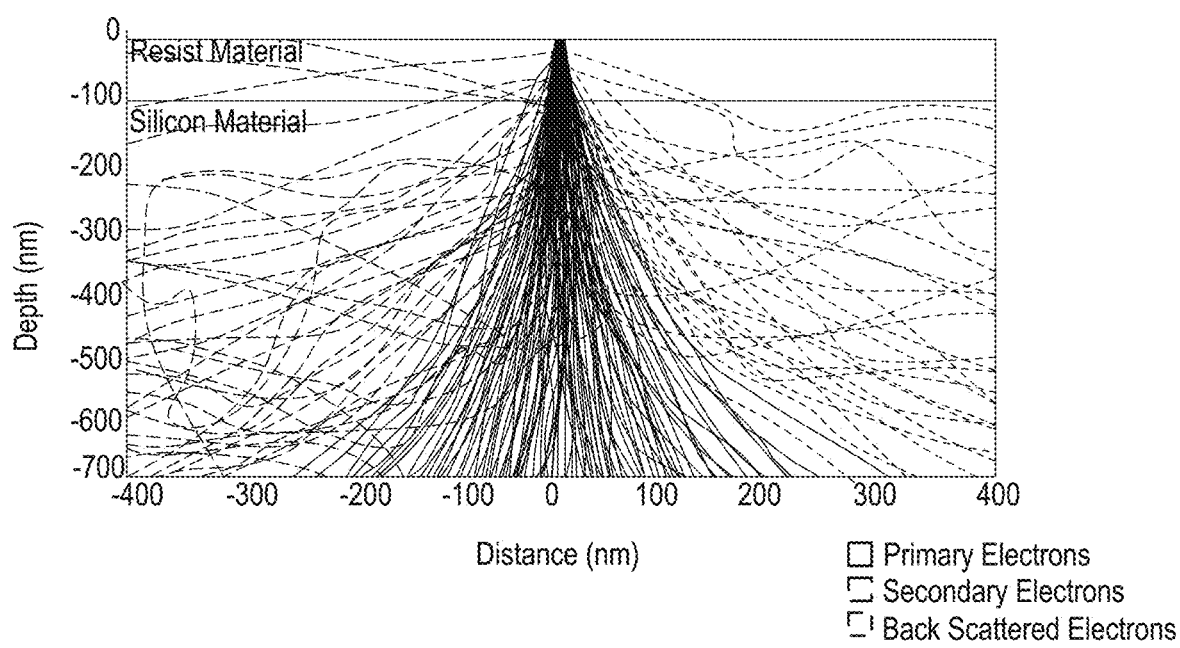

Herein, unless stated otherwise, the terms "radiation" and "irradiation" refer to the exposure of the resist composition, or coating thereof, to radiation that causes a physical or chemical change in the resist composition thereby allowing it to be "developed". The radiation in question may be any suitable radiation. The radiation is most suitably either electron beam radiation (e.g. suitably for use in ebeam lithography) or visible/ultraviolet radiation (e.g. suitably for use in photolithography).

Herein, a secondary electron generating composition (or SEG composition) is a composition capable of generating secondary electrons, especially when exposed to appropriate radiation. The SEG composition may be a resist composition or a non-resist composition.

Herein, a "secondary electron generator" is a component which releases secondary electrons following irradiation, suitably with ionizing radiation. In a particular embodiment, the secondary electron generator releases electrons when exposed to an electron beam.

Herein, the "effective atomic number ($Z_{eff}$)" of a compound is the average atomic number obtained from a weighted summation of the atomic constituents of a compound.

Though the skilled person will be aware of a variety of ways to calculate and/or measure $Z_{eff}$ (e.g. F. W. Spiers, *Effective Atomic Number and Energy Absorption in Tissues*, Br. J. radiol., 19, 52, 1946), for the purpose of the present invention "effective atomic number ($Z_{eff}$)" is suitably calculated as a simple mass-weighted average, suitably using the formula:

$$Z_{eff} = \Sigma \alpha_i Z_i$$

Where $Z_1$ is the atomic number of the ith element in the compound, and $\alpha_i$ is the fraction of the sum total of the atomic numbers of all atoms in the compound (i.e. the total number of protons in the compound) constituted by said ith element. This formula may otherwise be expressed as:

$$Z_{eff} = \alpha_1 Z_1 + \alpha_2 Z_2 + \ldots + (\alpha_n Z_n)$$

for a compound comprising n elements.

This is similar to the Spiers equation (F. W. Spiers, *Effective Atomic Number and Energy Absorption in Tissues*, Br. J. radiol., 19, 52, 1946) but without the exponents used by Spiers. The Spiers equation states $Z_{eff}$ as follows:

$$Z_{eff}^p = \Sigma \alpha_i Z_i^p$$

where the exponent p is suitably approximately 3 (e.g. p=2.94). Though in certain embodiments, this Spiers definition (especially with p=2.94) of $Z_{eff}$ may be used, and any preferred, optional, and suitable values of $Z_{eff}$ disclosed herein may equally apply to the Spiers definition, preferably the abovementioned simple mass-weighted average definition of $Z_{eff}$ should be used.

The secondary electron generator may suitably be or comprise a compound having an effective atomic number ($Z_{eff}$) greater than or equal to 15 (optionally when the effective atomic number calculation excludes any solvates having a boiling point less than or equal to 150° C. at 100 kPa pressure) By way of example, though the metal compound/complex $HAuCl_4 \cdot 4H_2O$ (hydrogen tetrachloroauratetetrahydrate) has an effective atomic number ($Z_{eff}$) of 40.76 when the solvate ($4 \times H_2O$) is included in the calculation, $HAuCl_4 \cdot 4H_2O$ has an effective atomic number ($Z_{eff}$) of 49.99 when water (which has a boiling point less than 150° C.) is excluded from the calculation, because:

firstly, the $4H_2O$ part of the compound is excluded from the calculation because water is a solvate (or hydrate) having a boiling point of less than or equal to 150° at 100 kPa pressure (its boiling point is 150° at 100 kPa pressure);

The relevant atomic numbers of $HAuCl_4 \cdot 4H_2O$ are therefore:

$$Z_H = 1$$

$$Z_{Au} = 79$$

$$Z_{Cl} = 17$$

The sum total of all atomic numbers in $HAuCl_4 \cdot 4H_2O$, excluding $4H_2O$ (i.e. $HAuCl_4$), is:

$$Z_H + Z_{Au} + (4 \times Z_{Cl}) = 1 + 79 + (4 \times 17) = 148$$

The relevant atomic number fractions for $HAuCl_4 \cdot 4H_2O$ are:

$$\alpha_H = 1/148 = 0.00676$$

$$\alpha_{Au} = 79/148 = 0.53378$$

$$\alpha_{Cl} = (4 \times 17)/148 = 0.45946$$

The $Z_{eff}$ calculated using the equation $Z_{eff} = \alpha_H Z_H + \alpha_{Au} Z_{Au} + \alpha_{Cl} Z_{Cl}$ is:

$$Z_{eff} = (0.00676 \times 1) + (0.53378 \times 79) + (0.45946 \times 17)$$

$$Z_{eff} = 0.00676 + 42.168 + 7.81082 = 49.99$$

The effective atomic number of organic compounds can be calculated in exactly the same fashion—typically there will be no need to discount solvate molecules in such cases, since solvates are more commonly associated with metal complexes. The effective atomic number of polymers may also be calculated in the same manner, though it is simplest to perform such calculations upon the monomer only, since this yields the same result. As such, the $Z_{eff}$ of PMMA (or methylmethacrylate) is approximately ~5.85. The effective atomic number of co-polymers may again be calculated in the same manner, though this time weighted averages of the respective monomers should be built into the equation. Likewise, though not generally relevant to the present invention, the effective atomic number of compound mixtures or compositions may also be calculated by including weighted averages of the respective components thereof. The skilled person is perfectly capable of calculating the effective atomic number ($Z_{eff}$) for all compounds and compositions.

Herein, a "base component" in the context of a composition (i.e. SEG composition, resist composition, non-resist composition) is a component which accompanies the secondary electron generator. Such a "base component" may act as a vehicle for the secondary electron generator and/or serve another function, such as undergoing a change (e.g. of solubility) upon exposure to radiation (e.g. to enable a resist composition to serve its function). Where the composition is a resist composition, the base component is suitably a polymeric component.

Herein, a "base polymeric component" in a (resist) composition is a polymeric component (suitably a polymeric resin) which undergoes a change upon exposure to the relevant radiation (e.g. electron beam radiation, ionizing radiation, ultraviolet radiation).

Herein, the term "developer-insoluble" is intended to denote that a given coating portion has a relatively lower solubility in a developer than corresponding "developer-soluble" coating portions. It does not necessarily exclude where "developer-insoluble" coating portions have partial or even full solubility (if development times were sufficiently long) in a developer. As will be appreciated by those skilled in the art, coating portions are differentially designated as "developer-soluble" and "developer-insoluble" to indicate that parts of the coating (e.g. radiation-exposed parts) have different solubility properties, and thus typically a different chemical nature, to other parts of the coating (e.g. non-radiation-exposed parts). The nature of the developer is immaterial since this can be judiciously selected, depending on which portions of coating are intended for removal, on the basis of the differential solubility properties of the respective coating portions. Generally speaking, the term "solubility", as used in the context of developing, relates to kinetic solubility rather than thermodynamic solubility, since the speed of solubilisation is key though thermodynamic solubility may correlate with kinetic solubility, as would be understood by the skilled person.

Herein, any parameters given in relation to compound(s) (e.g. $Z_{eff}$, density, mean free path, scattering cross-sectioning, mean ionization potential/stopping power, electron emission yield) suitably relate to the (substantially) pure or isolated form of said compound(s) and not to said compound(s) when in admixture with other components (i.e. in a composition). The following Tables illustrate exemplified values for such parameters in relation to specific compounds:

| Material | Molecular Weight (g/mol) | Effective Atomic Number | Density (g/cm³) |
|---|---|---|---|
| PMMA | 10.1 (*) 100.12 | 5.85 | 1.19 |
| AlCl3 | 133.34 | 16.14 | 2.48 |
| ScCl3 | 151.31 | 18.16 | 2.39 |
| YCl3 | 195.26 | 26.53 | 2.67 |
| LaCl3 | 371.37 | 38.11 | 3.84 |
| HAuCl4 · 4H2O | 409 | 40.76 | 2.89 |
| HAuCl4 | 339.785 | 49.99 | 3.9 |
| ErCl3 | 381.71 | 46.07 | 4.1 |
| AuCl3 | 303.325 | 55 | 4.7 |

(*) the molecular weight given for PMMA is that of the monomer repeat unit, since this is what is considered in the Monte Carlo simulation since it is the unit cell that is relevant given that it is repeated over the volume of the material space within the model, in this case 800 × 800 × 100 nm.

The following table shows all of the values for the elastic and inelastic scattering cross sections and also their associated mean free paths. All values are determined from equations 2, 3, 4 and 7 outlined herein.

| Material | Elastic scattering cross section (cm/atom) | Inelastic scattering cross section (cm/atom) | Elastic Mean Free Path (Å) | Inelastic Mean Free Path (Å) |
|---|---|---|---|---|
| PMMA | 1.77E−18 | 1.25E−10 | 7986 | 33297 |
| AlCl3 | 6.86E−18 | 5.98E−11 | 1306 | 7617 |
| ScCl3 | 8.01E−18 | 6.04E−11 | 1317 | 7983 |
| YCl3 | 1.32E−17 | 5.35E−11 | 923 | 6333 |
| LaCl3 | 2.14E−17 | 4.67E−11 | 498 | 3847 |
| HAuCl4 · 4H2O | 2.34E−17 | 7.34E−11 | 1015 | 8025 |
| HAuCl4 | 3.07E−17 | 4.94E−11 | 473 | 4000 |
| ErCl3 | 2.76E−19 | 4.31E−11 | 403 | 3319 |
| AuCl3 | 3.46E−19 | 4.03E−11 | 311 | 7617 |

Unless stated otherwise, any reference herein to an "average" value is intended to relate to the mean value.

Herein, unless stated otherwise, the term "parts by weight" (pbw) when used in relation to multiple ingredients/components, refers to relative ratios between said multiple ingredients/components. Though in many embodiments the amounts of individual components within a composition may be given as a "wt %" value, in alternative embodiments any or all such wt % values may be converted to parts by weight to define a multi-component composition. This is so because the relative ratios between components is often more important than the absolute concentrations thereof. Where a composition comprising multiple ingredients is described in terms of parts by weight alone (i.e. to indicate only relative ratios of ingredients), it is not necessary to stipulate the absolute amounts or concentrations of said ingredients (whether in toto or individually) because the advantages of the invention stem from the relative ratios of the respective ingredients rather than their absolute quantities or concentrations. However, suitably, the resist composition comprises at least 1 wt % of all the stipulated ingredients combined (excluding any diluents/solvents), suitably at least 5 wt %, suitably at least 10 wt %, suitably at least 15 wt %. Suitably the resist composition comprises at most 50 wt % of all the stipulated ingredients combined (excluding any diluents/solvents), suitably at most 30 wt %, suitably at most 20 wt % thereof. The balance (i.e. the remainder of the resist composition not constituted by the stipulated ingredients, excluding diluents/solvents) may consist essentially of a diluent(s)/solvent(s).

Herein, unless stated otherwise, the weight percentage (wt %) of any given component within a composition suitably means the percentage by weight of said component based on the overall weight of the composition.

Herein, the term "consist essentially of", when used to describe the proportion of a given ingredient within a material, suitably means the material comprises at least 70 wt % of the given ingredient, more suitably at least 80 wt %, more suitably at least 90 wt %, more suitably at least 95 wt %, and most suitably at least 99 wt %.

General Methodology and Advantages of the Invention

The present invention provides novel resist compositions, such as eBeam resist and photoresist compositions (whether positive or negative tone resist), which provide access to enhanced quality resist patterns deployable in the production of high-precision, high-specification electronic components. The novel resist compositions of the invention also provide for improved methods of exposure and development of resists.

In some aspects, the deliberate inclusion of a secondary electron generator within a resist composition allows the generation of secondary electrons (something those skilled in the art historically tried to avoid) to be thoroughly exploited during exposure of a resist. Instead of viewing the production of secondary electrons as problematic, and trying to quell them, some resist compositions of the present invention deliberately include a secondary electron generator to promote secondary electron generation. The energy of the secondary electrons is harnessed to allow for increased exposure sensitivity of a resist composition or coating thereof; decreased energy and/or intensity of incident exposure radiation (which in itself reduces damage to the resist from primary radiation); increased write-speed during electron beam exposure; decreased resist-coating thickness; increased aspect ratio; and/or increased resolution in the patterning of the resists.

This disclosure equips the skilled person to judiciously select appropriate secondary electron generators, with sufficient secondary electron generating potential, for any particular resist system. The examples and data provided herein, in conjunction with the validated predictive models, provide a highly credible demonstration of the broad applicability of the invention to a range of secondary electron generators. Typically, the secondary electron generators of the invention have one or more desirable characteristics (e.g. sufficient Z or $Z_{eff}$, sufficient density, sufficient "stopping power"/innovation potential, solubility in custody solvent(s) etc).

The technology of the present invention may be adapted for use with either positive or negative tone resists since, generally speaking, a positive resist can be modified to produce a negative resist by techniques well known in the art (e.g. adding a cross-linking agent).

Moreover, the technology of the present invention may be adapted for use with various forms of exposure radiation. The principles disclosed herein can be applied broadly to benefit any number of resists to yield the advantages outlined herein.

SEG Compositions

The present invention provides an SEG composition comprising a secondary electron generator. As aforementioned, unless the context dictates otherwise, any reference herein to a resist composition may be translated as a reference to an SEG composition more generally, or to another subset of the SEG composition (e.g. a non-resist composition). The SEG composition may comprise (or inherit) any of the components, attributes, properties, and/or applications defined herein in relation to resist compositions, unless the specific context dictates to the contrary. Most suitably, the SEG composition may comprise a secondary electron generator and a base component.

The SEG composition may suitably be a non-resist composition. Where the context allows (e.g. where a given composition is not being used in the specific context of a resist, such as in IC fabrication and lithographic techniques relating thereto), this may include compositions described as "resist compositions".

In a particular embodiment, the SEG composition is a resist composition.

Resist Composition

The present invention provides a resist composition as defined herein.

The resist composition may be suitably a negative tone resist composition or a positive tone resist composition. In general, a negative resist composition will further comprise a negative resist agent, such as a cross-linking agent, suitably to facilitate effective curing of radiation-exposed part(s) of the negative resist composition, or a coating thereof (e.g. suitably to render the radiation-exposed part(s) (substantially) insoluble in a developing medium, i.e. developer-insoluble). A positive resist composition, on the other hand, suitably lacks a negative resist agent, suitably so that radiation-exposed portions of the positive resist composition, or a coating thereof, are (substantially) soluble in a developing medium (i.e. developer-soluble).

In a particular embodiment, the resist composition is a negative resist composition, suitably which further comprises a cross-linking agent. Suitably radiation-exposed part(s) of the negative resist composition, or a coating thereof, become relatively insoluble in a developing medium (i.e. developer-insoluble), as compared to radiation-unexposed part(s) thereof (i.e. which are developer-soluble).

In a particular embodiment, the resist composition is a positive resist composition, suitably which is (substantially) free of a cross-linking agent, suitably (substantially) free of any cross-linking agent(s) defined in relation to a negative resist composition. Suitably radiation-exposed part(s) of the positive resist composition, or a coating thereof, become relatively soluble (i.e. developer-soluble) in a developing medium, as compared to radiation-unexposed part(s) thereof (i.e. which are developer-insoluble).

The resist composition may be suitably an electron beam resist composition (i.e. "Ebeam resist") or a photoresist (i.e. visible/UV-resist) composition. In general, a photoresist composition suitably comprises additional ingredients (e.g. a photocatalyst, photoacid generator—see below) which facilitate production of or produce electrons upon exposure to electromagnetic radiation (suitably visible or UV-radiation). In general, an Ebeam resist composition does not require such additional ingredients, since an incident electron beam will provide a primary source of electrons, which is then optionally further amplified in the presence of a secondary electron generator.

Suitably the resist composition is (substantially) free of any particulate matter. Suitably the resist composition is (substantially) free of any nanoparticles, especially free of any metal(0) nanoparticles.

Suitably the resist composition (e.g. pre-coating) comprises a solvent. Suitably the resist composition comprises between 20 and 99 wt % solvent, suitably between 50 and 97 wt %, more suitably between 80 and 95 wt % solvent. As such, the resist composition suitably comprises between 1 and 80 wt % non-solvent components, suitably between 3 and 50 wt % non-solvent components, more suitably between 5 and 20 wt % non-solvent components. Suitably the resist composition is a solution, suitably which is free of any dispersed or suspended particulate matter.

In a particular embodiment, the resist composition comprises:
 20-95 pbw base polymeric component; and
 20-95 pbw secondary electron component.
(This can also be expressed as a weight ratio of 20-95:5-60 of the respective compounds, or otherwise 20:60 to 95:5).

In a particular embodiment, the resist composition comprises:
 30-100 pbw base polymeric component; and
 5-60 pbw secondary electron component.

In a particular embodiment, the resist composition comprises:
 50-100 pbw base polymeric component; and
 5-50 pbw secondary electron component.

In a particular embodiment, the resist composition comprises:
 70-100 pbw base polymeric component; and
 10-30 pbw secondary electron component.

In a particular embodiment, the resist composition comprises:
 50-75 pbw base polymeric component; and
 5-30 pbw secondary electron component.

In a particular embodiment, the resist composition comprises:
 50-75 pbw base polymeric component; and
 50-75 pbw secondary electron component.

Where the resist composition is a negative resist composition, the resist composition suitably comprises 5-50 pbw cross-linking agent relative to the pbw of the other ingredients stated in relation to any of the above embodiments, more suitably 10-40 pbw, most suitably 20-30 pbw cross-linking agent.

Base Component

As aforementioned, the SEG composition, and indeed any resist composition or non-resist composition, may comprise a base component. Also as aforementioned, unless the context dictates otherwise, any reference herein to a base polymeric component may be translated as a reference to a base component more generally, or to another subset of the base component (e.g. a non-polymeric base component).

The base component may comprise (or inherit) any of the components, attributes, properties, and/or applications defined herein in relation to a base polymeric component, unless the specific context dictates otherwise. Alternatively, where the context allows (e.g. where a given composition is not being used in the specific context of a resist, or where the given composition is being used in the specific context of a resist but need not necessarily comprise a base component that is strictly polymeric in nature), the base component may be non-polymeric and thus distinct from any "polymeric" base polymeric components defined herein. Alternatively, the base component may be (substantially) absent—i.e. the SEG composition (whether a resist composition or non-resist composition) may be (substantially) free of a base component.

The SEG composition suitably comprises a secondary electron generator and a base component. In a particular embodiment, the SEG composition comprises a base component that is or comprises a polymer (i.e. a base polymeric component as described herein). In another embodiment, the SEG composition comprises a base component that is or comprises a non-polymer (e.g. a macromolecule, a complex, a suitable carrier compound or diluents, preferably a solid diluent).

Base Polymeric Component (or Base Component)

The base polymeric component is suitably a resist material (e.g. a resist polymer), and thus suitably a radiation-sensitive material which undergoes transformation upon exposure to the relevant radiation (e.g. be it Ebeam or UV/visible). Suitably base polymeric component that is radiation-exposed (and thus "transformed") has different solubility properties to base polymeric component that is unexposed (and thus "untransformed"), suitably such that selective exposure of the base polymeric component provides a solubility differential allowing for subsequent "development" and selective removal of the exposed or unexposed part(s) of the base polymeric component (depending on whether the resist is positive or negative tone).

The base polymeric component may be any suitable base polymeric component. A variety of base polymeric components are known to those skilled in the art for use in resist compositions, and any of these may be suitably used (optionally tuned accordingly) depending on the desired properties of the resist composition. In a particular embodiment, the base polymeric component is an Ebeam resist base polymeric component. In another embodiment, the base polymeric component is a photoresist base polymeric component.

The base polymeric component suitably has a density greater than or equal to 0.8 g/cm$^3$, suitably greater than or equal to 0.9 g/cm$^3$, suitably greater than or equal to 0.95 g/cm$^3$, suitably greater than or equal to 1.0 g/cm$^3$. The base polymeric component suitably has a density less than or equal to 2 g/cm$^3$, suitably less than or equal to 1.5 g/cm$^3$, suitably less than or equal to 1.3 g/cm$^3$, suitably less than or equal to 1.2 g/cm$^3$. Suitably the base polymeric component has a lower density than the secondary electron generator, suitably at least 1.0 g/cm$^3$ lower, suitably at least 2.0 g/cm$^3$ lower.

The base polymeric component suitably is or comprises a compound having an effective atomic number ($Z_{eff}$) less than or equal to 25. Suitably this $Z_{eff}$ is less than or equal to 15, suitably less than or equal to 10, suitably less than or equal to 8. PMMA, which is one of the suitably base polymeric components used in accordance with the invention, has a $Z_{eff}$ of 5.85 by virtue of the following calculation:

Using the monomeric unit "methylmethacrylate" ($C_5H_8O_2$ because this yields the same $Z_{eff}$ as the polymer thereof), the relevant atoms and atomic numbers are:

$Z_C=6$ $Z_H=1$ $Z_O=8$

The sum total of all atomic numbers in the molecule is:

$(5 \times Z_C) + (8 \times Z_H) + (2 \times Z_O) = 30 + 8 + 16 = 54$ $\alpha_C = 30/54 = 0.556$ $\alpha_H = 8/54 = 0.148$ $\alpha_O = 16/54 = 0.296$ The $Z_{eff}$ calculated using the equation $Z_{eff} = \alpha_C Z_C + \alpha_H Z_H + \alpha_O Z_O$ is:

$Z_{eff} = (0.556 \times 6) + (0.148 \times 1) + (0.296 \times 8)$ $Z_{eff} = 3.336 + 0.148 + 2.368 = 5.85$ Suitably the base polymeric component may be selected from the group including:

poly(methylmethacrylate), poly(1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide), polyhydroxystyrene or any suitable mixture or copolymer thereof.

In a particular embodiment, the base polymeric component is poly (methylmethacrylate) (PMMA), suitably with a weight average molecular weight between 10-1500 kDalton (kDa), suitably between 50-1200, suitably 100-1100. Suitably PMMA or any other suitable base polymeric component is used in conjunction with an appropriate cross-linking agent (e.g. di pentaerythriolpentaacrylate DPEPA or pentaerythritoltetraacrylate (PET)), suitably to form a particularly advantageous negative resist composition.

Suitably the base polymeric component constitutes at least 1 wt % of the resist composition, suitably at least 5 wt %, suitably at least 10 wt %, suitably at most 70 wt %, suitably at most 55 wt %. In some embodiments, the base component (or base polymeric component) is (substantially) absent. In a particular embodiment, the base component (or base polymeric component) constitutes no more than 1 wt % of the composition, suitably no more than 0.5 wt %, suitably no more than 0.1 wt %, suitably no more than 0.01 wt %, suitably no more than 0.0001 wt %.

Secondary Electron Generator

The secondary electron generator suitably yields secondary electrons, suitably upon impact with primary electrons (e.g. from an electron beam, or from a photocatalyst, suitably from an electronic beam), but in some circumstances upon exposure to primary radiation in general (e.g. whether electrons, ions, or photons of sufficient energy, e.g. photons with an energy >50 eV).

The secondary electron generator suitably generates secondary electrons, as ionization products, in response to exposure to primary radiation. The primary radiation is suitably an electron beam or electromagnetic radiation. The electromagnetic radiation may suitably be ionizing radiation (e.g. high UV, ~13.4 nm), and the secondary electrons may therefore be photoelectrons resulting from the directly ionization of the secondary electron generator. Alternatively, the electromagnetic radiation may suitably be non-ionizing radiation (e.g. low UV, ~193 nm), and secondary electrons may be generated indirectly, potentially following the intervening generation of a primary electron from a photoacid generator which thereafter collides with the secondary electron generator to precipitate a secondary electron. As such, a photoacid cannot be considered a secondary electron generator in the context of the present invention.

The secondary electron generator and/or compound(s) thereof by definition yield more secondary electrons (i.e. have a higher secondary electron omission yield) than the base polymeric component, suitably at least by a factor of 2, suitably at least by a factor of 3, suitably at least by a factor of 4.

Secondary electrons generally scatter "laterally" (suitably 80° from an incident beam), thereby spreading the "write" effect, increasing the sensitivity of a resist and thereby decreasing the "dose" required from the primary radiation.

Generally speaking, a primary electron will undergo elastic and inelastic collisions as it passes through a given material (e.g. a resist material), and lose energy along the way as it collides with atoms in its path. Energy loss rates increase if:

(a) the number of collisions are increased or mean free path is decreased; and/or (b) the "stopping power" of the material is increased.

The number of collisions can be increased by increasing the scattering cross section of a given material. Mean free path can be decreased by using denser materials. "Stopping power" can be increased by using materials having a higher "mean ionization potential" (where the term "mean ionization potential" is used as per the Bethe equation, and as approximated by Bloch:

$I = (10 \text{ eV}) \times Z$ where I is mean ionization potential and Z is the atomic number of atoms in a material. The more effectively a material absorbs the energy of a primary electron, the more ionization events will occur and the more secondary electrons will be generated. Therefore, secondary electron generators with high density and/or high "mean ionization potentials" (generally high atomic numbers as per Bloch approximation), are especially suitable for use in the present invention.

The secondary electron generator suitably is or comprises a compound having an effective atomic number ($Z_{eff}$) greater than or equal to 15 (where optionally the $Z_{eff}$ calculation excludes any solvates, having a boiling point less than or equal to 150° C. at 100 kPa pressure, associated with said compound, suitably any solvates having a boiling point less than or equal to 120° C. at said pressure, suitably 105° C. at said pressure). Suitably this $Z_{eff}$ is greater than or equal to 18, suitably greater than or equal to 23, suitably greater than or equal to 25, suitably greater than or equal to 30, suitably greater than or equal to 32, suitably greater than or equal to 40. Suitably this $Z_{eff}$ is less than or equal to 70, suitably less than or equal to 66, suitably less than or equal to 61, suitably less than or equal to 60, suitably less than or equal to 55. The secondary electron generator or compound(s) thereof suitably has a higher $Z_{eff}$ than the base polymeric component, suitably at least 10 units higher, suitably at least 20 units higher, suitably at least 30 units higher.

Suitably, the secondary electron generator is or comprises a compound having a molecular weight less than or equal to 500 g/mol.

The secondary electron generator suitably is or comprises a metal compound. It cannot be or comprise an elemental metal (i.e. metal(0)). In fact, the resist composition is suitable (substantially) free of any metal (0)). Suitably any metal species of the metal compound are metal ions.

References to the secondary electron generator or compound(s) thereof generally relate to the pre-mixed (i.e. prior to mixing with other components of the resist composition) form thereof (e.g. in terms of any cationic-anionic associations in relevant metal compound(s)), and suitably also relate to the pre-coated, pre-cured, pre-exposed, pre-developed form thereof. It will be appreciated by those skilled in the art that, upon mixing with other components of the resist composition (and/or after coating, curing, exposing, and/or developing), any relevant cations and anions of metal compound(s) may, in some embodiments (though not all), dissociate and possibly become associated with other counterions and/or ligands. Therefore, references to a resist composition (or indeed a coating, or a cured-, exposed-, or developed-product thereof) suitably indicates a resist composition (or a coating, or a cured-, exposed-, or developed-product thereof) "formed by" (or derived from) mixing the relevant compound(s) with any other ingredients of the resist composition or "formed by" curing, exposing, and/or developing the relevant product. It is straightforward for those skilled in the art, using standard techniques, to determine the input compound(s) from a resist composition or a coated, cured-, exposed-, or developed-product thereof.

The compound(s) of the secondary electron generator suitably has a density greater than that of the base polymeric component. The compound(s) of the secondary electron generator suitably has a density greater than or equal to 1.7 g/cm$^3$, suitably greater than or equal to 2 g/cm$^3$, suitably greater than or equal to 2.5 g/cm$^3$, suitably greater than or equal to 3 g/cm$^3$, suitably greater than or equal to 4 g/cm$^3$, more suitably greater than or equal to 4.1 g/cm$^3$, suitably greater than or equal to 4.5 g/cm$^3$, more suitably greater than or equal to 4.7 g/cm$^3$, most suitably greater than or equal to 5 g/cm$^3$. The compound(s) of the secondary electron generator suitably has a density less than or equal to 9 g/cm$^3$, suitably less than or equal to 8.5 g/cm$^3$, suitably less than or equal to 8 g/cm$^3$. In a particular embodiment, the compound(s) of the secondary electron generator suitably has a density between 3.5 and 8.3 g/cm$^3$. Suitably the density is at least 2 times higher than the density of the base polymeric component, suitably at least 3 times higher.

Suitably, the compound(s) of the secondary electron generator have a mean ionization potential (i.e. employing the "stopping power" meaning, suitably as provided by the well-known Bethe equation and the Monte Carlo model described herein and elsewhere) of ≥200 eV, suitably ≥300 eV.

Suitably the compound(s) has a low mean free path ($\lambda$)—i.e. the distance between successive electron collisions is low. Suitably the compound(s) has a lower mean free path ($\lambda$) than the base polymeric component. Suitably the compound(s) of the secondary electron generator has an elastic mean free path of less than or equal to 900 nm, suitably less than or equal to 100 nm, suitably less than or equal to 50 nm, suitably less than or equal to 825 nm. Suitably the compound(s) of the secondary electron generator has an inelastic mean free path of less than or equal to 825 nm.

Suitably the compound(s) has a high elastic scattering cross-section ($\sigma$)—i.e. the chances of a collision is high. Suitably the compound(s) has a higher elastic scattering cross-section ($\sigma$) than the base polymeric component. Suitably the compound(s) of the secondary electron generator has an elastic scattering cross-section ($\sigma$) of greater than or equal to $7\times10^{-19}$ cm/atom, suitably greater than or equal to $1\times10^{-18}$, suitably greater than or equal to $2\times10^{-17}$, suitably greater than or equal to $4\times10^{-18}$, suitably greater than or equal to $7\times10^{-18}$. Suitably the base polymeric component (or the primary component thereof) has an elastic scattering cross-section ($\sigma$) of less than or equal to $1\times10^{-18}$ cm/atom, suitably less than or equal to $7\times10^{-19}$ cm/atom. In a particular embodiment, the compound(s) of the secondary electron generator has an elastic scattering cross-section ($\sigma$) of greater than or equal to $7\times10^{-19}$ cm/atom whereas the base polymeric component (or the primary component thereof) has an elastic scattering cross-section ($\sigma$) of less than or equal to $7\times10^{-19}$ cm/atom. In a particular embodiment, the compound(s) of the secondary electron generator has an elastic scattering cross-section ($\sigma$) of greater than or equal to $2\times10^{-18}$ cm/atom whereas the base polymeric component (or the primary component thereof) has an elastic scattering cross-section ($\sigma$) of less than or equal to $7\times10^{-19}$ cm/atom.

Any, some, or all of the definitions relating to any of the aforesaid parameters (e.g. $Z_{eff}$, density, mean free path, scattering cross-sectioning, mean ionization potential/stopping power, electron emission yield) may suitably relate to a form of the compound(s) which excludes any solvates having a bp ≤150° C. at 100 kPa pressure, suitably ≤120° C., suitably ≤105° C., e.g. excluding hydrates. This is reasonable since such solvates may be removed during processing.

Suitably any metal compound(s) of the secondary electron generator comprises a metal species which has an oxidation state of +1 or higher, suitably +2 or higher, suitably +3 or higher. Suitably any metal compound(s) of the secondary electron generator comprises a metal species which has an oxidation state of +4 or lower. Suitably any metal compound(s) of the secondary electron generator comprises a metal species which has an oxidation state of +3.

Suitably any metal compound(s) of the secondary electron generator comprises a single metal species or otherwise a predominant metal species (i.e. metal species constituting at least 50 wt % of the total metal species, suitably at least 80 wt %, suitably at least 90 wt %, suitably at least 95 wt %). The metal species or metal ions (whether single or predominant) of such metal compound(s) of the secondary electron generator suitably have an oxidation state of +1 or higher, suitably +2 or higher, suitably +3 or higher. The metal species or metal ions (whether single or predominant) of such metal compound(s) of the secondary electron generator suitably have an oxidation state of +4 or lower. The metal species or metal ions (whether single or predominant) of such metal compound(s) of the secondary electron generator suitably have an oxidation state of +3. In an embodiment, the metal species or metal ions of such metal compound(s) of the secondary electron generator have an oxidation state of +2.

Any metal compound(s) of the secondary electron generator suitably comprises a metal species (or a single or predominant metal species) having an atomic number (Z) greater than or equal to 21 (i.e. scandium or heavier). Any metal compound(s) of the secondary electron generator suitably comprises a metal species (or a single or predominant metal species) having an atomic number (Z) greater than or equal to 22 (i.e. titanium or heavier). Any metal compound(s) of the secondary electron generator suitably comprises a metal species (or a single or predominant metal species) having an atomic number (Z) greater than or equal to 39 (i.e. yttrium or heavier). Any metal compound(s) of the secondary electron generator suitably comprises a metal species (or a single or predominant metal species) having an atomic number (Z) greater than or equal to 49 (i.e. indium or heavier). Any metal compound(s) of the secondary electron generator suitably comprises a metal species (or a single or predominant metal species) having an atomic number (Z) greater than or equal to 57 (i.e. lanthanum or heavier). Any metal compound(s) of the secondary electron generator suitably comprises only metal species (or a single or predominant metal species) having an atomic number (Z) less than or equal to 82 (i.e. lead or lighter). Any metal compound(s) of the secondary electron generator suitably comprises only metal species (or a single or predominant metal species) having an atomic number (Z) less than or equal to 80 (i.e. mercury or lighter). The metal species of the metal compound(s) may suitably be a d-block, p-block, or f-block metal species, or a mixture thereof. Suitably the metal compound(s) is non-radioactive.

Suitably the secondary electron generator is or comprises a metal halide, or a complex thereof (e.g. $HAuCl_4$). Suitably the secondary electron generator is a metal (I), metal (II), metal (III), or metal (IV) halide, or a complex thereof. Suitably the secondary electron generator is a metal (III) halide or a metal(I) halide, or a complex thereof. Suitably the secondary electron generator is a metal chloride, suitably a metal (I), metal (II), metal (III), or metal (IV) chloride. Suitably the secondary electron generator is a metal chloride, suitably a metal (I) or a metal (III) chloride.

The secondary electron generator may be a metal(II) halide (e.g. $HgCl_2$), or a complex thereof. In a particular embodiment, the secondary electron generator is a metal(II) chloride.

The secondary electron generator may suitably be selected from the group including, $AlCl_3$, $TiCl_3$, $TiCl_4$, $CrCl_3$, $GaCl_3$, $YCl_3$, $MoCl_3$, $AgCl$, $InCl_3$, $SbCl_3$ $HfCl_3$ $TaCl_3$, $WCl_3$, $OsCl_3$, $IrCl_3$, $AuCl$, $AuCl_3$, $HAuCl_4$, $HgCl_2$, $CeCl_3$, $NdCl_3$ $ErCl_3$, $OsO_4$ or any suitable complex (including any suitable salt or salt complex) thereof. In a particular embodiment, the metal compound is chloroauric acid (hydrogen chloroaurate, $HAuCl_4$) or the hydrate thereof ($HAuCl_4.4H_2O$). In another embodiment, the metal compound is sodium chloroaurate ($NaAuCl_4$) or a hydrate thereof (e.g. $NaAuCl_4.2H_2O$). In a particular embodiment, the metal compound is a mercury dichloride.

In a particular embodiment, the secondary electron generator is a gold-based compound (preferably a compound comprising gold(III) species). In a particular embodiment, the secondary electron generator is a mercury-based compound (preferably a compound comprising mercury(II) species). In a particular embodiment, the secondary electron generator is an indium-based compound (preferably a compound comprising indium(III) species). In a particular embodiment, the secondary electron generator is an yttrium-based compound (preferably a compound comprising yttrium (III) species). In a particular embodiment, the secondary electron generator is a titanium-based compound (suitably a compound comprising titanium (IV) species).

The secondary electron generator is suitably an anhydrous metal compound. Suitably the metal compound of the secondary electron generator has a water content of less than or equal to 0.1 wt %, suitably less than or equal to 0.05 wt %, suitably less than or equal to 0.01 wt %, suitably less than or equal to 0.001 wt %. It is thought that higher water content can have an adverse effect on the secondary electron generation capacity, possible by virtue of a density effect. However, in some embodiments, a secondary electron generator metal compound may be a solvate, e.g. a hydrate.

The secondary electron generator is suitably non-particulate, especially within the resist composition where it is suitably dissolved within the solvent. The secondary electron generator is suitably soluble in the resist composition. This enables its uniform distribution in the ultimately applied resist coating, and may facilitate metal-organic nanocomposite coating formation.

Any of the aforementioned metal compound(s) may be a complex thereof.

Suitably the secondary electron generator constitutes at least 1 wt % of the resist composition, suitably at least 5 wt %, suitably at least 10 wt %, suitably at most 70 wt %, suitably at most 55 wt %.

The secondary electron generator may be a single compound (or complex) or a mixture of compounds (and/or complexes). References herein to "a secondary electron generator" may refer to a single compound, which is thus designated as the secondary electron generator.

A secondary electron generator may be included within existing resist compositions to provide the benefits achieved by the present invention. As such, appropriate retrofitting may enhance existing resist technologies.

Cross-Linking Agent

A cross-linking agent is suitably present in any negative resist compositions, or coatings or pattern layers derived there from.

A cross-linking agent suitably facilitates formation of a developer-insoluble resist following radiation exposure. It is thought that though the base polymeric component may under initial scission upon exposure to radiation, subsequent reaction(s) with the cross-linking agent may reconstitute the base polymeric component into a transformed component which is developer-insoluble, whilst the unexposed base polymeric component may remain developer-soluble.

Any suitably cross-linking agent may be used, though most advantageously the cross-linking agent is judiciously selected for maximum compatibility with the radiation source and base polymeric component.

In preferred embodiments, especially where eBeam radiation is used exposing, the cross-linking agent is dipentaerythriolpentaacrylate (DPEPA) or pentaerythritoltetraacrylate (PET), or any other suitable miscible multifunctional acrylate and/or mixtures thereof. Other crosslinking agents include epoxies (SU8) or if the copolymer used is for example polyhydroxystyrene a suitable photoacid generator maybe employed to bring about a solubility change Solvent Any suitable solvent system may be employed as a diluent for the resist composition. The solvent may, in fact, be a combination of one or more solvents. As such, references herein to a solvent may, unless stated otherwise, optionally include a mixture of solvents. Suitably the solvent dissolves the combination of solute components of the resist composition to thereby form a solution. Suitably the solvent is used within the resist composition in a proportion which dissolves the combination of non-solvent components therein to thereby form a solution. The resist composition is suitably a solution.

The dilution level can be varied to suit the system, and will depend entirely on the combination of ingredients, any solubility constraints, and the desired dilution level (e.g. for optimal casting of the resist). Suitably, however, the weight ratio of solvent(s) to base polymeric component is between 10:1 and 100:1.

Suitably solvents include hexane, heptane, pentane, anisole, toluene, xylene, n-propanol, iso-propanol, acetone, dichloromethane, butyl acetate, tetrahydrofuran, dimethylformamide, ethyl acetate, diethyl ether, or a combination thereof. In a particular embodiment, especially in positive tone resist compositions, the solvent includes acetone and anisole, suitably in a weight ratio of 1:1 to 1:100. In a particular embodiment, especially in negative tone resists, the solvent includes iso-propanol and anisole, suitably in a weight ratio of 1:1 to 1:100.

Additional Ingredient(s) (e.g. for Photoresist Compositions)

Where the resist composition is a photoresist composition (i.e. activated by photons, such as ultraviolet light), the photoresist material suitably comprises a photoresist material that either becomes soluble upon exposure to relevant photons (as per a positive tone photoresist) or insoluble upon exposure (as per a negative tone resist). Suitable photoresist materials are well known in the art, and may include a base polymeric component such as those described herein (e.g. polyhydroxystyrene), and suitably also a photoacid generator (many of which are well known in the art). The photoacid generator suitably produces a photoacid upon exposure to photons which precipitates a chemical reaction (typically involving the generation of electrons) rendering the base polymeric component soluble in a developer.

By way of example, a positive tone photoresist composition may include a base polymeric component (e.g. organic polymer comprising or otherwise associated with a dissolution inhibitor(s)) and a photoacid generator(s) (in general the dissolution inhibitors are controlling the distance that the secondary electrons travel and the photoacid generator generate secondary electron or free radicals or both that attack the polymer, so they are separate entities). The dissolution inhibitor(s) are suitably extended polymeric chains that are suitably (substantially) insoluble in the developer. When struck by a photon, the photoacid generator(s) produce a photoacid, which catalyses thermal deprotection of a dissolution inhibitor during post exposure bake PEB. This allows the resist to be subsequently developed to dissolve the exposed area. Such systems represent positive tone photoresists but, as well known in the art, such photoresists can be readily adapted to furnish negative tone resists.

Typically, photomasks are used during exposure to permit selective exposure of certain regions of a photoresist coating. Typically, a photoresist coating will be irradiated through a photomask with ultra violet (UV) radiation with a wavelength of 193 and/or 13.5 nm to cause the exposed areas of the photoresist to undergo a chemical transformation by altering the solubility of these areas of the photoresist in the developing stage. This chemical transformation typically involves photoacid generators (PAG) producing an acid which then interacts with the dissolution inhibitor and in turn generates an electron which performs chain scission. Secondary electron generators of the invention can amplify and facilitate this process. As such, a resist composition may be a photoresist composition comprising a base polymeric component (optionally as defined herein), a secondary electron generator (suitably as defined herein), and suitably also a photoacid generator.

Specific Embodiments

In a particular embodiment, the SEG composition comprises:
 (i) a secondary electron generator comprising a compound having an effective atomic number ($Z_{eff}$) greater than or equal to 15 (optionally where $Z_{eff}$ excludes any solvates having a boiling point less than or equal to 150° C. at 100 kPa pressure); and
 (ii) optionally a base component.

In a particular embodiment, the SEG composition comprises:
 (i) a secondary electron generator comprising a compound having an effective atomic number ($Z_{eff}$) greater than or equal to 30 and a density greater than or equal to 2.5 g/cm$^3$; and
 (ii) a base component having a density less than or equal to 2 g/cm$^3$.

In a particular embodiment, the SEG composition comprises:
 (iii) 20-95 pbw secondary electron generator comprising a compound having an effective atomic number ($Z_{eff}$) greater than or equal to 30 and a density greater than or equal to 2.5 g/cm$^3$; and
 (iv) 25-95 pbw base component having a density less than or equal to 2 g/cm$^3$.

In a particular embodiment, the resist composition is an electron beam resist composition comprising:
 a base polymeric component (suitably PMMA);
 a secondary electron generator comprising a metal compound (suitably a metal halide or complex thereof), wherein the metal compound has a density between 3.5 and 8.3 g/cm$^3$, and comprises a metal species which has an atomic number (Z) greater than or equal to 57; and
 optionally a cross-linking agent (suitably dipentaerythriolpentaacrylate (DPEPA) or pentaerythritoltetraacrylate (PET)).

In a particular embodiment, the resist composition comprises:
 (i) a base polymeric component; and
 (ii) a secondary electron generator comprising a compound having an effective atomic number ($Z_{eff}$) greater than or equal to 25 and a density greater than or equal to 2 g/cm$^3$; and
 (iii) optionally a cross-linking agent (suitably dipentaerythriolpentaacrylate (DPEPA) or pentaerythritoltetraacrylate (PET));
wherein the secondary electron generator is soluble in the resist composition;
wherein the secondary electron generator has a higher density than the base polymeric component;
wherein the secondary electron generator has a higher $Z_{eff}$ than the base polymeric component;
 (optionally where $Z_{eff}$ excludes any solvates having a boiling point less than or equal to 150° C. at 100 kPa pressure).

In a particular embodiment, the resist composition comprises:
 (i) a base polymeric component having a density less than or equal to 2 g/cm$^3$; and
 (ii) a secondary electron generator comprising a compound having an effective atomic number ($Z_{eff}$) greater than or equal to 30 and a density greater than or equal to 2.5 g/cm$^3$; and
 (iii) optionally a cross-linking agent (suitably dipentaerythriolpentaacrylate (DPEPA) or pentaerythritoltetraacrylate (PET));
wherein the secondary electron generator is soluble in the resist composition;
wherein the secondary electron generator has a higher $Z_{eff}$ than the base polymeric component;
 (optionally where either or both density and/or $Z_{eff}$ excludes any solvates having a boiling point less than or equal to 150° C. at 100 kPa pressure).

In a particular embodiment, the resist composition comprises:
 (i) a base polymeric component having an effective atomic number ($Z_{eff}$) less than or equal to 15 and having a density less than or equal to 2 g/cm$^3$; and
 (ii) a secondary electron generator comprising a compound having an effective atomic number ($Z_{eff}$) greater than or equal to 30 and a density greater than or equal to 2.5 g/cm$^3$; and (iii) optionally a cross-linking agent (suitably dipentaerythriolpentaacrylate (DPEPA) or pentaerythritoltetraacrylate (PET));
wherein the secondary electron generator is soluble in the resist composition and the resist composition is a solution;
(optionally where either or both density and/or $Z_{eff}$ excludes any solvates having a boiling point less than or equal to 150° C. at 100 kPa pressure).

In a particular embodiment, the resist composition comprises:
(i) a base polymeric component having an effective atomic number ($Z_{eff}$) less than or equal to 15 and having a density less than or equal to 2 g/cm$^3$; and
(ii) a secondary electron generator comprising a compound having an effective atomic number ($Z_{eff}$) greater than or equal to 30 and a density greater than or equal to 2.5 g/cm$^3$; and
(iii) optionally a cross-linking agent (suitably dipentaerythriolpentaacrylate (DPEPA) or pentaerythritoltetraacrylate (PET));
wherein the secondary electron generator is soluble in the resist composition and the resist composition is a solution;
wherein the compound(s) of the secondary electron generator has a mean ionization potential of greater than or equal to 200 eV;
wherein the compound(s) of the secondary electron generator has a lower mean free path ($\lambda$) than the base polymeric component;
wherein the compound(s) of the secondary electron generator has a higher scattering cross-section ($\sigma$) than the base polymeric component;
(optionally where any, some or all of density, $Z_{eff}$, mean ionization potential, mean free path ($\lambda$), and/or scattering cross-section ($\sigma$) excludes any solvates having a boiling point less than or equal to 150° C. at 100 kPa pressure).

In a particular embodiment, the resist composition comprises:
(i) a base polymeric component selected from the group including poly(methylmethacrylate), poly(1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide) (suitably PMMA with a molecular weight between 500-1500 kilodaltons (kDa)); and
(ii) a secondary electron generator comprising a metal compound having an effective atomic number ($Z_{eff}$) greater than or equal to 40 and a density greater than or equal to 2 g/cm$^3$; and
(iii) optionally a cross-linking agent (suitably dipentaerythriolpentaacrylate (DPEPA) or pentaerythritoltetraacrylate (PET));
wherein the resist composition is a solution;
(optionally where either or both density and/or $Z_{eff}$ excludes any solvates having a boiling point less than or equal to 150° C. at 100 kPa pressure).

In a particular embodiment, the resist composition comprises:
(i) a base polymeric component selected from the group including poly(methylmethacrylate), poly(1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide) (suitably PMMA with a molecular weight between 500-1500 kilodaltons (kDa)); and
(ii) a secondary electron generator comprising a metal compound having an effective atomic number ($Z_{eff}$) greater than or equal to 40, a density greater than or equal to 2 g/cm$^3$, and comprising a metal species having an atomic number (Z) greater than or equal to 21; and
(iii) optionally a cross-linking agent (suitably dipentaerythriolpentaacrylate (DPEPA) or pentaerythritoltetraacrylate (PET));
wherein the resist composition is a solution;
(optionally where either or both density and/or $Z_{eff}$ excludes any solvates having a boiling point less than or equal to 150° C. at 100 kPa pressure).

In a particular embodiment, the resist composition comprises:
(i) 20-95 pbw base polymeric component selected from the group including poly(methylmethacrylate), poly(1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide) (suitably PMMA with a molecular weight between 500-1500 kilodaltons (kDa)); and
(ii) 20-95 pbw secondary electron generator comprising a metal compound having an effective atomic number ($Z_{eff}$) greater than or equal to 40, a density greater than or equal to 2 g/cm$^3$, and comprising a metal species having an atomic number (Z) greater than or equal to 39 but less than or equal to 82; and
(iii) optionally 5-30 pbw cross-linking agent (suitably dipentaerythriolpentaacrylate (DPEPA) or pentaerythritoltetraacrylate (PET));
wherein the resist composition is a solution comprising between 20 and 99 wt % solvent;
(optionally where either or both density and/or $Z_{eff}$ excludes any solvates having a boiling point less than or equal to 150° C. at 100 kPa pressure).

In a particular embodiment, the resist composition comprises:
(i) a base polymeric component selected from the group including poly(methylmethacrylate), poly(1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide), or any suitable mixture thereof; and
(ii) a compound selected from the group including $AlCl_3$, $TiCl_3$, $CrCl_3$, $GaCl_3$, $MoCl_3$, $AgCl$, $InCl_3$, $SbCl_3$ $HfCl_3$ $TaCl_3$, $WCl_3$, $OsCl_3$, $IrCl_3$, $AuCl$, $AuCl_3$, $HAuCl_4$, $CeCl_3$, $NdCl_3$ $ErCl_3$, $OsO_4$ or any suitable complex thereof (optionally a solvate thereof); and
(iii) optionally a cross-linking agent (suitably dipentaerythriolpentaacrylate (DPEPA) or pentaerythritoltetraacrylate (PET)).

In a particular embodiment, the resist composition comprises:
(i) poly(methylmethacrylate); and
(ii) chloroauric acid or a hydrate thereof (e.g. $HAuCl_4.4H_2O$); and
(iii) optionally a cross-linking agent (suitably dipentaerythriolpentaacrylate (DPEPA) or pentaerythritoltetraacrylate (PET)).

In a particular embodiment, the resist composition comprises:
(i) 20-95 pbw poly(methylmethacrylate; and
(ii) 20-95 pbw chloroauric acid or a hydrate thereof (e.g. $HAuCl_4.4H_2O$); and (iii) optionally 5-30 pbw cross-linking agent (suitably dipentaerythriolpentaacrylate (DPEPA) or pentaerythritoltetraacrylate (PET)).

The definitions relating to any of the aforesaid parameters (e.g. $Z_{eff}$, density, mean free path, scattering cross-sectioning, mean ionization potential/stopping power) may suitably relate to a form of the compound(s) which excludes any solvates having a bp 150° C. at 100 kPa pressure, suitably 120° C., suitably 105° C., e.g. excluding hydrates.

SEG-Coated Material

The present invention provides an SEG-coated material, and a method of forming an SEG-coated material, suitably as defined herein (albeit sometimes in relation to a resist-coated material, which may be translated into a definition for the SEG-coated material).

As aforementioned, unless the context dictates otherwise, any reference herein to a resist-coated material may be translated as a reference to an SEG-coated material more generally, or to another subset of the SEG-coated material (e.g. a non-resist-coated material). The SEG-coated material may comprise (or inherit) any of the components, attributes, properties, and/or applications defined herein in relation to resist-coated materials, unless the specific context dictates to the contrary.

The SEG-coated material suitably comprises a base substrate coated with a coating of an SEG composition, wherein the coating is optionally a cured and/or dried coating.

The method of forming an SEG-coated material suitably comprises: coating a base substrate with a coating of SEG composition, and optionally thereafter curing and/or drying the coating. An SEG-coated material may be obtainable by, obtained by, or directly obtained by the method of forming an SEG-coated material as defined herein.

The coating itself may be an inner coating (e.g. where the SEG composition penetrates into internal pores of the base substrate during coating) and/or an outer coating (e.g. where the SEG composition coats an external or exposed surface off the base substrate). In a particular embodiment, the coating comprises an outer coating.

The SEG-coated material may suitably be a non-resist-coated material. In a particular embodiment, the SEG-coated material is a resist-coated material.

Resist-Coated Material

The present invention provides a resist-coated material, and a method of forming a resist-coated material, as defined herein.

The base substrate of the resist-coated material may be any suitable substrate. In a particular embodiment, the base substrate is an electronic component substrate. A suitable electronic component substrate may include a substrate comprising or be (substantially) made of silicon (e.g. a silicon wafer), copper, chromium, iron, aluminium, or glass. The base substrate may itself comprise a surface coating, e.g. as an undercoat to the resist coating to be applied thereto. In a particular embodiment the base substrate is a silicon substrate.

The resist-coated material suitably involves coating the base substrate with a resist composition as defined herein, and optionally thereafter curing and/or drying the coating, to form a coating of resist composition upon the base substrate.

Coating the base substrate, which suitably involves applying the resist composition to a surface(s) of the base substrate, may be performed by any number of methods well known to the person skilled in the art. In a particular embodiment, the resist composition is applied to the base substrate via spin-coating (e.g. using a spinner), suitably to thereby form a resist spin-coated base substrate.

After coating the base substrate with the resist composition, the coating may be cured and/or dried. Suitably, the coating is dried at a temperature and pressure and for a time suitable to form a resist film upon the base substrate. The temperature (and pressure, especially where reduced pressure is used) may be chosen for compatibility with the particular solvent of the resist composition (e.g. to boil off the solvent). In a particular embodiment, the coating (or coated-base substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds). Suitably such curing/drying may remove some, most, or all solvent(s) present in the resist composition. Where the secondary electron generator compound(s) are associated with a solvate, suitably some, most, or all of said solvate is removed by said curing and/or drying.

The average thickness of the coating is suitably 10-500 nm, suitably 50-200 nm. The maximum thickness of the coating is suitably 1000 nm, suitably 500 nm. The minimum thickness of the coating is suitably 5 nm, suitably 20 nm. The technology of the present invention allows effective, high quality patterning of extremely thin resist coatings.

The resist coatings of the invention provide good adhesion to base substrates, especially those suitable for electronic components.

Exposed SEG-Coated Material

The present invention provides an exposed SEG-coated material, and a method of forming an exposed SEG-coated material, suitably as defined herein (albeit sometimes in relation to an exposed resist-coated material, which may be translated into a definition for the exposed SEG-coated material).

As aforementioned, unless the context dictates otherwise, any reference herein to an exposed resist-coated material may be translated as a reference to an exposed SEG-coated material more generally, or to another subset of the exposed SEG-coated material (e.g. an exposed non-resist-coated material). The exposed SEG-coated material may comprise (or inherit) any of the components, attributes, properties, and/or applications defined herein in relation to exposed resist-coated materials, unless the specific context dictates to the contrary.

The exposed SEG-coated material suitably comprises an SEG-coated material as defined herein, wherein parts of the coating of the SEG-coated material are developer-soluble coating portions, and parts of the coating are developer-insoluble coating portions.

The method of preparing an exposed SEG-coated material (or the method of exposing an SEG-coated material) may suitably comprise: exposing part(s) of the coating of the SEG-coated material to radiation; and optionally performing a post-exposure bake. Suitably, this exposure (and the optional post-exposure bake) gives rise to the aforedescribed developer-solubility properties. The exposed SEG-coated material may be obtainable by, obtained by, or directly obtained by the method of preparing an exposed SEG-coated material as defined herein.

In a particular embodiment, the exposed SEG-coated material is an exposed resist-coated material.

Exposed Resist-Coated Material

The present invention provides an exposed resist-coated material, and a method for its production, as defined herein.

Exposing part(s) of the coating of the resist-coated material to radiation suitably involves selectively exposing said part(s), whilst other part(s) are selectively non-exposed. As such, the method suitably excludes exposing all of the coating to radiation.

Selective exposure of part(s) of the coating may involve direct irradiation of the relevant part(s) with a focused or targeted beam (e.g. such as an electron beam or laser beam, e.g. a UV-laser beam, preferred when using eBeam resists) or blanket flood exposure (i.e. unfocussed/untargeted) exposure of the coating through a mask (e.g. photomask, preferred when using photoresists) comprising pre-determined apertures corresponding with the position of the exposed part(s) of the coating. The particular exposure technique used may depend on the particular radiation being employed.

Suitably the exposed part(s) of the coating undergo a transformation, suitably a chemical transformation, suitably which changes the solubility properties thereof (suitably in relation to a pre-determined developing medium, for example, one of the developing media described herein), suitably whether before or after an optional post-exposure bake, suitably even before any such post-exposure bake.

Suitably, parts of the coating which are "radiation-exposed" have different solubility properties to parts of the coating which are not "radiation-exposed". This solubility differential suitably allows for development and selective removal of either the "radiation-exposed" or "non-radiation-exposed" parts of the coating (depending on whether the resist is positive or negative tone resist).

In general, the base polymeric component in the exposed part(s) of the coating is, at least partially, fragmented (i.e. through chemical bond-breakages, suitably via chain scission methods, suitably caused by irradiation), suitably into shorter polymeric or monomeric fragments. Such fragmentation is suitably caused by primary radiation (e.g. primary electrons of an eBeam) and/or secondary electrons (optionally produced by a secondary electron generator in response to primary radiation). Suitably, such shorter fragments have a higher solubility in the developing medium than the original base polymeric component.

Where the resist composition or resist coating is positive tone (i.e. a positive resist), suitably the exposed part(s) of the coating become more soluble (suitably in relation to a pre-determined developing medium, for example, one of the developing media described herein). As such, the net effect of irradiation (and optionally a post-exposure bake) is to increase the solubility of exposed part(s) of the resist coating. As such, suitably the exposed part(s) are intended to be removed after subsequent developing. Suitably, the increase solubility of the resist coating is the result of the aforementioned break down of the base polymeric component.

Where the resist composition or resist coating is negative tone (i.e. a negative resist), suitably the exposed part(s) of the coating become less soluble (suitably in relation to a pre-determined developing medium, for example, one of the developing media described herein). As such, the net effect of irradiation (and optionally a post-exposure bake) is to reduce the solubility of exposed part(s) of the resist coating. As such, suitably the exposed part(s) are intended to remain after subsequent developing. Since the aforementioned break down of the base polymeric component generally leads to elevated solubility, negative tone resist compositions suitably additionally comprise a negative resist agent, such as a cross linking agent. Such a cross-linking agent may suitably cross-link the base polymeric component, or any polymeric or monomeric fragments thereof (see above), during irradiation and/or during any optional post-exposure bake, to thereby provide a cross-linked polymeric component that is less soluble than the original base polymeric component. It will be readily recognized, by those skilled in the art, that radiation above a certain energy and/or intensity threshold may lead to negative resists becoming positive resist, merely because the negative resist agent (e.g. cross-linking agent) may itself be broken down and/or destroyed, thereby preventing it from performing its intended function. As such, a negative resist may only act as a negative resist within certain limits, which are straightforward for the skilled person to determine.

Exposure of the coating may lead directly to a developable substrate (i.e. a substrate which can undergo development to produce a patterned substrate). However, additional subsequent processing steps may be employed. Suitably, radiation exposure of the coating may be followed by a post-exposure bake. The post-exposure bake may comprise baking at a temperature and pressure and for a time suitable to form a developable substrate. The temperature (and pressure, especially where reduced pressure is used) may be chosen for compatibility with the particular solvent of the resist composition (e.g. to boil off the solvent). In a particular embodiment, the exposed coating (or exposed coated-base substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds).

Radiation

Any radiation suitable for use with resist compositions may be used. Suitably resist compositions are formulated for exposure with particular radiation, so the radiation may be selected base on the resist composition question.

Suitably the radiation in question is either electromagnetic radiation (especially ultraviolet) or an electron beam.

In a particular embodiment, the radiation is electron beam radiation (i.e. provided by an electron beam). Suitably the electron beam radiation is a focused, targeted beam, thereby allowing direct irradiation of the relevant part(s) of the coating (i.e. without any masking). As such, exposure of the coating using an electron beam may involve (effectively) writing upon the coating with the beam. The electron beam radiation (e.g. primary electrons) suitably has an initial energy (or acceleration voltage) between 10 and 80 keV, suitably between 15 and 60 keV, suitably between 20 and 50 keV, most suitably between 25 and 35 keV. The electron beam suitably has a current between 25 and 300 pA/beam (pA=pico amperes), suitably between 50 and 270 pA/beam, most suitably between 200 and 250 pA/beam. Where the electron beam is employed as a focused, targeted beam (i.e. for writing), the electron beam suitably has a write speed below 30 $\mu C/cm^2$ (uC=unit of electronic charge, uC/cm²=electronic charge per unit area), suitably below 20 $\mu C/cm^2$, more suitably below 10 $\mu C/cm^2$, most suitably below 5 $\mu C/cm^2$. The write speed may be as low as 0.5 $\mu C/cm^2$, but is suitably greater than or equal to 0.5 $\mu C/cm^2$, suitably greater than or equal to 1 $\mu C/cm^2$. In a particular embodiment, the radiation is an electron beam having an energy between 15 and 60 keV, a current between 25 and 300 pA/beam, and a write speed below 20 $\mu C/cm^2$. The present invention allows the use of low energy electron beams, thereby minimizing damage to components of the resist composition (e.g. to cross-linking agents), which may compromise the function of the resist. An electron beam can be generated by methods well known to those skilled in the art.

In an embodiment, the radiation is ultraviolet radiation, suitably having a wavelength between 10 and 400 nm.

Where ultraviolet radiation is used for exposure, the resist composition (and hence the resist coating) will suitably comprise additional ingredients (e.g. a photoacid and/or photocatalyst) which facilitate the coating transformation process upon exposure to ultraviolet radiation. The ultraviolet radiation may give rise to secondary electrons during exposure (in much the same manner as with electron beam radiation, albeit the secondary electrons may be generated more indirectly), especially in the presence of a secondary electron generator as defined herein. The ultraviolet radiation can be generated by methods well known to those skilled in the art. The ultraviolet radiation may be extreme-ultraviolet (EUV), suitably having a wavelength between 10 and 124 nm, suitably between 10 and 20 nm, suitably between 11 and 15 nm (most suitably about 13.4 nm). Alternatively, the ultraviolet radiation may suitably have a wavelength between 150 and 240 nm, suitably between 180 and 210 nm, suitably between 190 and 200 nm, suitably about 193 nm.

Effect of Secondary Electron Generator

Suitably, where a secondary electron generator is present within the resist composition (and resist coating), irradiation of the resist composition or coating thereof will trigger release of secondary electrons from the secondary electron generator. The release of such secondary electrons from the secondary electron generator suitably induces a transformational effect upon the base polymeric component (suitably a transformational effect as described hereinbefore—e.g. fragmentation thereof), suitably upon base polymeric component in close proximity to the site from which the secondary electrons were released (thereby causing a proximity effect). The release of such secondary electrons from the secondary electron generator suitably amplifies the transformational effect of the radiation upon the base polymeric component (suitably a transformational effect as described hereinbefore—e.g. fragmentation thereof), suitably amplifying the transformational impact of the primary radiation. Of course, the secondary electrons may also facilitate reactivity of any negative resist agents, such as cross-linking agents, so as to promote any necessary cross-linking of exposed part(s) (and fragments) of the base polymeric component. Moreover, since the secondary electrons generated by the secondary electron generator are generally scattered in directions (suitably within the resist composition or coating thereof) different to that of the incident radiation, such secondary electrons may be usefully deployed to provide a more consistent, thorough, and controlled exposure at the relevant exposure sites. As such, the secondary electron generators used with the present invention allow for increased sensitivity of the resist, thereby allowing lower energy incident radiation (i.e. primary radiation) to be used, which can in turn reduce over-exposure of certain vulnerable components within the resist, e.g. a cross-linking agent (where negative tone resists are desired), which may otherwise compromise subsequent developing of the exposed resist.

Patterned/Developed Substrate

The present invention provides a patterned substrate, and a method for its preparation (e.g. developing an exposed resist-coated material), as defined herein. Suitably, "development" forms grooves within the resist coating to thereby form a pattern layer.

The method of producing a patterned substrate suitably involves developing an exposed resist-coated material, suitably with a developing medium. As such, the exposed resist-coated material, or at least the exposed coating thereof, is suitably washed with and/or immersed within a developing medium (which is suitably liquid) in a manner sufficient to remove (suitably through dissolving) either the exposed part(s) (for positive resists) or non-exposed part(s) (for negative resists) of the coating of the resist composition.

As aforementioned, exposure of the resist-coated material generally causes exposed part(s) of the coating to have a different solubility (suitably in relation to a pre-determined developing medium) to non-exposed part(s) of the coating. This solubility differential between the exposed and non-exposed part(s) of the coating is instrumental in facilitating subsequent development of the exposed coated-resist material. As such, either the exposed or non-exposed part(s) of the coating may be selectively removed (preferably dissolved) to transform the coating into a pattern layer comprising an array of grooves extending through the pattern layer (i.e. through what was the original coating). The grooves of the pattern layer then correspond with the part(s) of the coating that have been removed, whereas the ridge/protrusion (i.e. non-groove) part(s) of the pattern layer correspond with the part(s) of the coating that remain. The pattern layer (suitably the non-groove part(s) thereof) therefore suitably comprises ridges or protrusions (i.e. between the grooves) which are either exposed part(s) (for positive resists) or non-exposed part(s) (for negative resists) of a coating of the resist composition.

The specific developing conditions may be tuned, for instance, to optimise the quality of the resulting patterned substrate, or optimise the developing process (whether in the interests of cost, speed, or ultimate product quality). Developing times (for instance, the time if immersion of the exposed coating) may, for example, be optimised to maximise removal of the part(s) of the coating intended for removal and to minimise removal or damage of part(s) of the coating intended to remain. Likewise, the developing medium may be tuned to optimise either or both the developing process or the resulting product.

Suitably, after developing, the method of preparing a patterned substrate comprises rinsing the pattern layer, suitably with a rinse medium, which suitably comprises an organic solvent.

Suitably, after developing, and optionally after rising, the method further comprises drying the patterned substrate.

Developing Medium

The developing medium used during developing may be any suitably developing medium known in the art. Suitably the developing medium complements the resist composition (or coating thereof), most suitably the base polymeric component therein. Most suitably the developing medium complements the solubility properties of the base polymeric component and its post-exposed counterpart (i.e. be it fragments of the base polymeric component, cross-linked base polymeric component, and/or cross-linked fragments of the base polymeric component), suitably to optimize contrast (i.e. the differential solubility and/or solubilization rates) between the base polymeric component and its post-exposed counterpart.

Where the resist composition (or coating thereof) is a negative resist, the developing medium suitably comprises a solvent within which the base polymeric component is (substantially) soluble, or is at least more soluble than a post-exposed counterpart of the base polymeric component. Where the resist composition (or coating thereof) is a negative resist, the developing medium suitably comprises a solvent within which the base polymeric component is (substantially) insoluble, or is at least less soluble than a post-exposed counterpart of the base polymeric component.

The developing medium may or may not dissolve all components of the exposed or non-exposed (depending on whether positive or negative resist) resist composition (or a coating thereof) intended for removal by development, but any insoluble (or less soluble) components may still be removed in slurry, suspension or dispersion following dissolution (or partial dissolution) of the base polymeric component or post-exposed counterpart thereof with which said insoluble components are mixed.

The developing medium suitably comprises or consists of an organic solvent, suitably a polar organic solvent, suitably which is an organic compound comprising one or more heteroatoms, such as ketones or alcohols. In a particular embodiment, the organic solvent is selected from the group including:

Ketone solvents (e.g. 1-octanone, 2-octanone, 1-nonanone, acetone, 4-heptanone, 1-hexanone, diisobutyl ketone, cyclohexanone, methylcyclohexanone, methyl ethyl ketone, methyl isobutyl ketone, acetylacetone, acetonylacetone, ionone, diacetonylalcohol, acetylcarbinol, acetophenone, methyl napthyl ketone, propylenecarbonate and γ-butyrolactone);

ester solvents (e.g. Methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-meth-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, butyl carbonate, methyl carbonate, ethyl carbonate, propyl carbonate, methyl pynuvate, ethyl pynuvate, propyl pynuvate, butyl pynuvate, methyl pynuvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate);

alcohol solvents (e.g. Monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, and 3-methoxy-1-butanol. Glycol solvents, such as ethylene glycol, diethylene glycol and triethylene glycol. Glycol ether solvents containing a hydroxyl group, such as ethylene glycol monomethyl ether, propylene glycol monomethyl ether, diethylene glycol monomethyl ether, triethylene glycol monoethyl ether, methoxymethylbutanol, ethylene glycol monoethyl ether, ethylene glycol monopropyl ether, ethylene glycol monobutylether, propylene glycol monoethyl ether, propylene glycol monopropyl ether, propylene glycol monobutyl ether and propylene glycol monophenyl ether);

ether solvents (e.g. glycol ether solvents that do not contain a hydroxyl group, such as propylene glycol dimethyl ether, propylene glycol diethyl ether, diethylene glycol dimethyl ether and diethylene glycol diethyl ether, dioxane, tetrahydrofuran, anisole, perfluoro-2-butyltetrahydrofuran, perfluorotetrahydrofuran, and 1,4-dioxane);

amide solvents (e.g. N-methyl-2-pyrrolidone, N, N-dimethylacetamide, N, N-dimethylformamide, hexamethylphosphoric amide and 1, 3-dimethyl-2-imidazolidinone);

hydrocarbon solvents (e.g. Pentane, hexane, octane, decane, 2, 2, 4-trimethylpentane, 2, 2, 3-trimethylpentane, perfluorohexane and perfluoropentane and aromatic hydrocarbon solvents, such as toluene, ethylmethpropylbenzene, dimethylbenzene, ethyldimethylbenzene and dipropylbenzene);

or mixtures of two or more thereof.

In a particular embodiment, the developing medium consists essentially of MIBK (methyl isobutyl ketone).

Pattern Layer and Groove Pattern

The pattern layer may be considered to comprises an array of grooves extending through the pattern layer (i.e. a groove pattern) and an array of ridges/protrusions (i.e. the non-groove part(s) of the pattern layer). The ridges suitably correspond with developer-insoluble coating portions whereas the grooves suitably correspond with developer-soluble coating portions (i.e. which are removed upon developing). The present invention allows extremely high resolutions to be achieved. For instance, the groove pattern may suitably have a resolution of 50 nm or less, suitably 20 nm or less, suitably 10 nm or less. Such resolutions may even be achieved with low energy radiation exposure, for instance, with electron beams of an energy of 35 keV (suitably around 30 keV) or less.

The aspect ratio of the grooves (i.e. width/height ratio) may be suitably greater than or equal to 1:1, suitably greater than or equal to 5:1, suitably greater than or equal to 10:1. The technology underlying the present invention allows extremely high aspect ratios to be achieved, especially where an secondary electron generator is employed to increase the sensitivity and/or reduce write times, thereby allowing for very shallow, and yet coherent grooves.

Plated Substrate

The present invention provides a plated substrate, and a method of its preparation, as defined herein.

Suitably, once a patterned substrate has been formed, a plating material may be laid down within the grooves of the pattern layer (or optionally instead laid down upon the ridges of the pattern layer). Most suitably, any plating material is laid down within the grooves of the pattern layer.

Any suitable plating material may be used, depending on the particular application of the plated substrate. In a particular embodiment, the plated substrate is or is for an electrical component, and thus the plated substrate suitably comprises a conductive material (including optionally semi-conductive material) as the plating material, thereby suitably forming an array of conductive tracks within the grooves of the pattern layer. The conductive tracks may be standard conductive tracks and/or semiconductive tracks. The conductive tracks may thus be suitably metallic conductive tracks, such as copper tracks, or semiconductive tracks, such as silicon tracks (optionally doped) or tracks comprising a silicon compound.

Many techniques are known in the art for plating materials with conductive tracks. For example, electroplating may be suitably used, and may optionally involve the intermediate step of laying down a catalytic layer in preparation for subsequent electroplating.

Lithography Using Compositions of the Invention

The present invention provides a method of performing lithography, the method comprising:
i) providing a resist-coated substrate as defined herein or applying a resist coating to a substrate;
ii) exposing part(s) of the resist coating to radiation (e.g. eBeam) to provide an exposed resist coating;
iii) developing the exposed resist coating to generate a resist pattern layer, the resist pattern layer comprising: developer-insoluble coating portions of the resist coating (i.e. ridges); and an array of grooves extending through the resist pattern layer;
iv) optionally modifying the substrate, substrate surface, or part(s) thereof, underlying the resist pattern layer;
v) optionally removing the resist pattern layer to provide a modified substrate;
vi) optionally repeating, one or more times, step iv) and/or steps i)-v) (optionally with an alternative resist coating, for example, where the resist coating of the invention is an eBeam resist coating the alternative resist coating may be a photoresist instead; and optionally using alternative radiation during exposure, for example, where the primary source of radiation is an electron beam, the alternative radiation may instead be visible or ultraviolet light) upon the modified substrate.

The resist-coated substrate, resist coating, radiation, exposed resist coating, and resist pattern layer, may pertain to any suitable resist or form of radiation. For example, in certain embodiments photoresists and photonic radiation (suitably UV or visible light radiation) may be employed. However, most suitably the resist-coated substrate, resist coating, radiation, exposed resist coating, and resist pattern layer are respectively an eBeam resist-coated substrate, an eBeam resist coating, electron beam radiation, eBeam-exposed resist coating, and eBeam resist pattern layer. In such embodiments, any alternative resist coating is suitably a photoresist coating and any alternative radiation is suitably photonic radiation (preferably UV or visible light).

Step (i) of the method is optionally preceded by performing steps (i) to (vi) (i.e. pre-steps (i)-(vi)), optionally repeated one or more times, using either a resist coating of the invention or an alternative resist coating and using either (electron beam) radiation or alternative radiation during exposure;

The resist coating suitably comprises or consists essentially of an optionally dried and/or cured resist composition; wherein the resist composition comprises a secondary electron generator and optionally a base component.

The invention further provides an imaged substrate obtainable by, obtained by, or directly obtained by this method.

Such methods may be used for imaging, for preparing patterned substrates, for selectively modifying a surface of a substrate, and for manufacturing a multi-layered substrate (e.g. integrated circuit), suitably as defined herein.

In a particular embodiment, the above method is used in the production of an integrated circuit (which is an example of a multi-layered substrate) or plurality thereof (e.g. on a wafer). The skilled person is well aware of standard manufacturing processes used in the production of integrated circuits. The method of the invention may be used to produce one or more layers of an integrated circuit, and in some embodiments may be used to produce all layers. However, since the benefits of the invention may only be required for one or some critical layers, alternative lithographic methods may be involved in the production of other layers (e.g. photolithography). In this manner, electron beam lithography may complement other forms of lithography (e.g. photolithography) in the fabrication of integrated circuits.

Substrate

The substrate upon which lithography (suitably electron beam or eBeam lithography) is performed may be any suitable substrate.

The substrate is suitably a single solid body, or a portion thereof. The substrate is suitably in the form of a (substantially rigid) plate, wafer, or sheet, most suitably a wafer.

Since, in accordance with the methods of the invention, certain processing steps may be "repeated" (including steps which refer to a "substrate"), the "substrate" may refer to the initial "input substrate" (i.e. before any method steps of the invention are performed) or a "modified substrate" (following certain method steps). As such, in principle the "substrate" may be any substrate (including partially fabricated products or integrated circuits) which is suitable for processing via the lithographic methods of the invention.

The substrate (whether the input substrate or modified substrate) is suitably either part of a pre-formed resist-coated substrate or is a substrate to which a resist coating is applied (e.g. in step i) of many of the methods disclosed herein). As such, the substrate may be defined (whether in terms of its nature, parameters, material form, etc.) without reference to the resist coating itself. The substrate or modified substrate may be planarized prior to coating with a resist coating.

In some embodiments, the substrate (or part thereof) to which the method(s) of the invention is applied is incorporated into a final (printed) product (e.g. integrated circuit), though this may itself be incorporated into products (e.g. circuit boards and/or electronic devices). In other words, the "imaged substrate" may be or become a consumable product or may otherwise be or become incorporated into a consumable product. Such consumable products include an integrated circuit, integrated circuit die or wafer, integrated circuit package, a circuit board, an electronic component or an electronic device or system.

In some embodiments, however, the substrate (or part thereof) to which the method(s) of the invention is applied is not incorporated into a final (printed) product (e.g. integrated circuit) but is rather incorporated into a tool, for example a lithographic mask (whether positive or negative) such as a photomask for use in photolithography, used to produce such a final (printed) product. In other words, the "imaged substrate" may be a tool for producing a consumable product. As such, the advantages of the invention may be imparted to a lithographic tool (e.g. a lithographic mask), which may thereafter be imparted to a final (printed) product made using said tool. As such, the lithographic methods of the invention may be used to produce a corresponding lithographic mask (e.g. photomask) which may in turn be used in lithography, such as photolithography, to produce integrated circuits (or one or more layers thereof). As such, the invention provides a method of manufacturing a lithographic mask and a lithographic mask (e.g. photomask) as defined herein; as well as a use of such a lithographic mask in the production of an integrated circuit, integrated circuit die or wafer, integrated circuit package, a circuit board, an electronic component or an electronic device or system).

The substrate suitably comprises or consists essentially of a substrate base material—this may be the aforementioned "base substrate".

The substrate base material may comprise or consist essentially of any suitable material for use in the method(s) of the invention. The substrate base material (and suitably also the substrate base layer as a whole) is suitably a single substance (element or compound) or a single composite material (mixture of two or more elements and/or compounds). However the substrate base material may be a multi-layered composite material.

Where the substrate (or part thereof) is not incorporated into a final (printed) product (e.g. integrated circuit) but is rather incorporated into a tool (e.g. lithographic mask), suitably the substrate base material is a material appropriate for the tool in question. Suitably, the substrate base material is a lithographic plate (potentially comprising one or more layers of one or more materials). Where the tool is a lithographic mask (e.g. a photomask), the substrate base material may be (substantially) transparent or (substantially) non-transparent to the relevant radiation (e.g. UV or visible light, if a photomask), depending on the ultimate nature of the mask. For instance, a substrate base material that is (substantially) transparent to the relevant radiation may be used where a lithographic mask is formed through generating opaque regions on the substrate base material during the mask manufacturing process (e.g. non-removed resist coating may provide opaque regions, or opaque regions may be generated by judicious surface modifications). Alternatively, a substrate base material that is (substantially) opaque or non-transparent to the relevant radiation may be used where a lithographic mask is formed through generating transparent regions on the substrate base material during the mask manufacturing process (e.g. where the process involves surface modifications which remove portions of substrate base material—e.g. via etching). In other embodiments, the substrate base material may be a laminated composite, comprising at least one layer of material which is (substantially) transparent to the relevant radiation (e.g. glass, transparent plastics) and at least one layer of material which is (substantially) opaque to the relevant radiation—under such circumstances, the process of manufacturing a lithographic mask may involve removal or regions of opaque material to leave transparent portions.

Lithographic masks, such as photomasks may comprise a layer of transparent fused silica covered by a pattern defined with a chrome metal-absorbing film, the pattern having been generated in accordance with methods of the invention to thereby afford high resolution patterns. Such masks may then be used in lithographical methods of the invention to produce high-resolution products, such as integrated circuits.

Where the substrate (or part thereof) is to be incorporated into a final (printed) product, suitably the substrate base material is a material appropriate for the product in question. In a particular embodiment, the base substrate is an electronic component substrate. A suitable electronic component substrate may include a substrate comprising or be (substantially) made of silicon (e.g. a silicon wafer), copper, chromium, iron, aluminium, or glass. The base substrate may itself comprise a surface coating, e.g. as an undercoat to the resist coating to be applied thereto. In a particular embodiment the base substrate is a silicon substrate. The substrate base material may comprise or consist essentially of a semiconductor material, most suitably silicon, most suitably a single monolithic silicon crystal. Most suitably, the substrate base layer is a silicon wafer. Suitably, where the resist coatings and compositions of the invention are used in the fabrication of integrated circuits, the input substrate may be a partially-fabricated integrated circuit, wherein some layers of the integrated circuit have already been formed (optionally with or without using the resist coating or composition of the invention—other layers may be formed using traditional IC fabrication techniques, such as standard photolithography). Furthermore, after the resist coatings of the invention have been used (and suitably removed) during the fabrication of part of an integrated circuit, further layers of the integrated circuit may be formed (optionally with or without using the resist coating or composition of the invention—again other layers may be formed using traditional IC fabrication techniques, such as standard photolithography)

The substrate may consist essentially of a substrate base material (e.g. where the input substrate is yet to be modified, for example, via surface oxidation, lithography and/or other substrate modification step(s)).

However, alternatively the substrate (which may include the input substrate) suitably comprises a substrate base material (suitably consisting essentially of substrate base material) that has been subject to modification (e.g. a modified substrate). Such a modified substrate may include a substrate base material that has been modified by a pre-processing or pre-coating step (e.g. thermal oxidation of a surface, e.g. to produce a silicon oxide insulation layer prior to coating with a resist coating) before being subjected to the method(s) of the invention; otherwise modified prior to being subjected to the method(s) of the invention (e.g. a partially formed integrated circuit formed using alternative technologies, e.g. using photolithography); or else modified during or after the substrate has been subjected to the method(s) (or some of the step(s) thereof) of the invention. Each further substrate layer suitably comprises or consists essentially of a further substrate material, which may be the same as or different from the substrate base material. In a particular embodiment, one nor more of the further substrate layers comprises or consists essentially of the substrate base material, albeit not necessarily part of the substrate base layer.

Suitably the substrate base layer is disposed towards (or at) the base of the substrate, suitably relative to an exposure surface thereof (i.e. the surface whose resist coating is to be exposed to radiation—this may be considered a top of the substrate, regardless of the ultimate orientation of the resist-coated substrate during processing).

Suitably the method(s) of the invention involve generating additional layer(s) (including partial layer(s)) upon the substrate base layer and optionally thereafter upon each other; incorporating additional layer(s) within either the substrate base layer or any further substrate layer(s) (e.g. via doping); and/or removing part(s) of the substrate base layer and/or part(s) of further substrate layer(s) (e.g. via etching). Suitably the method(s) of the invention produce a multi-layered substrate comprising a substrate base material towards (or at) the bottom thereof. The substrate base layer is suitably the foundation upon which the other layers are built.

In preferred embodiments, the input substrate comprises a substrate base layer underlying a layer of oxidised (preferably thermally oxidised) substrate base material. In a particular embodiment, the input substrate comprises a wafer of silicon (suitably a single crystal of silicon) underlying a silicon oxide (or silicon dioxide) layer.

As will be appreciated by the skilled person, where a lithographic mask (e.g. photomask) formed by the method(s)

of the invention (i.e. using the relevant resist coating of the invention and appropriate radiation) is used in subsequent lithography (e.g. to form an alternative imaged substrate, multi-layered substrate, integrated circuit, etc.), the same substrate base material (e.g. silicon wafer) may be used. Moreover the same lithographic methods defined herein may be used, though alternative resist coating(s), lithographic methods (e.g. exposure and development methods) may be used with the lithographic mask instead of or in addition to (e.g. in repeated steps) the resist coating(s) and method steps of the invention.

Although the methods of the invention are especially applicable for the production of silicon-based integrated circuits, and products derived therefrom, the present invention will be equally applicable to future materials used in the construction of electronic components—for instance graphene based materials.

Resist-Coated Material and its Formation

The present invention provides a resist-coated material, and a method of forming a resist-coated material, as defined herein. A resist-coated material or substrate is a "substrate" as defined herein with a resist coating of the invention on a surface (or part of a surface) thereof.

The resist-coated material suitably involves coating the input substrate with a resist composition as defined herein, and optionally thereafter curing and/or drying the coating, to form a coating of resist composition upon the substrate.

Coating the input substrate, which suitably involves applying the resist composition (whether a resist or alternative resist) to a surface(s) of the input substrate, may be performed by any number of methods well known to the person skilled in the art. Applying a resist coating to a substrate (be it a single body of substrate base material, a multilayered substrate, an input substrate, or a modified substrate) suitably involves applying a resist composition (suitably as defined herein, though alternative resist compositions outside the scope of the invention may be used in addition, so long as the resist composition of the invention is used at least once in the method(s) of the invention) to a surface (or part of a surface) thereof and optionally thereafter curing and/or drying the applied resist composition to form the resist coating. The resist composition may be applied in any suitable manner though most suitably the resist composition is applied via dipping, spraying, brushing, roller coating, and/or spin coating. Most preferably the resist composition is applied to the substrate via spin coating, which is especially suitable during the fabrication of integrated circuits. In a particular embodiment, the resist composition is applied to the base substrate or input substrate via spin-coating (e.g. using a spinner), suitably to thereby form a resist spin-coated input substrate. Most suitably the applied resist composition is cured and/or dried (suitably through baking). The resist coating suitably has a (substantially) uniform thickness. The skilled person is well versed in how to apply a resist coating to a substrate prior to lithography.

Where a substrate is said to comprise or be coated by a coating, such as a resist coating, said coating suitably covers a surface (or part thereof) of said substrate.

After coating the base substrate or input substrate with the resist composition, the coating is preferably cured and/or dried. Suitably, the coating is dried at a temperature and pressure and for a time suitable to form a resist film upon the base substrate or input substrate. The temperature (and pressure, especially where reduced pressure is used) may be chosen for compatibility with the particular solvent of the resist composition (e.g. to boil off the solvent). In a particular embodiment, the coating (or coated-base substrate or coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds). Suitably such curing/drying may remove some, most, or all solvent(s) present in the resist composition. Where the secondary electron generators are associated with a solvate, suitably some, most, or all of said solvate is removed by said curing and/or drying.

The average thickness of the coating is suitably 10-500 nm, suitably 50-200 nm. The maximum thickness of the coating is suitably 1000 nm, suitably 500 nm. The minimum thickness of the coating is suitably 5 nm, suitably 20 nm. The technology of the present invention allows effective, high quality patterning of extremely thin resist coatings.

The resist coatings of the invention provide good adhesion to base substrates and input substrates, especially those suitable for electronic components.

Though the above description of the application of a resist coating may suitably pertain to eBeam resist coatings, any of the descriptions may equally apply (where compatible) to the application of alternative resist coatings, such as photoresists, though the skilled person will be well able to adapt solvents and coating techniques to suit the resist coating in question.

Exposure and Radiation

Exposing part(s) of the resist coating to radiation (most suitably electron beam radiation) provides an exposed resist coating. In pre-steps and/or repeat steps, where an alternative resist coating and optionally alternative radiation is used, exposing part(s) of the relevant resist coating to radiation provides an exposed resist coating.

Exposing part(s) of the coating of the resist-coated material to radiation suitably involves selectively exposing said part(s), whilst other part(s) are selectively non-exposed. As such, the method suitably excludes exposing all of the coating to radiation.

Selective exposure of part(s) of the coating may involve direct irradiation of the relevant part(s) with a focused or targeted beam (e.g. such as an electron beam or laser beam, e.g. a UV-laser beam, preferred when using eBeam resists) or blanket flood exposure (i.e. unfocussed/untargeted) exposure of the coating through a mask (e.g. photomask, preferred when using photoresists) comprising pre-determined apertures corresponding with the position of the exposed part(s) of the coating. The particular exposure technique used may depend on the particular radiation being employed.

Suitably the exposed part(s) of the coating undergo a transformation, suitably a chemical transformation, suitably which changes the solubility properties thereof (suitably in relation to a pre-determined developing medium, for example, one of the developing media described herein), suitably whether before or after an optional post-exposure bake, suitably even before any such post-exposure bake.

Suitably, parts of the coating which are "radiation-exposed" have different solubility properties to parts of the coating which are not "radiation-exposed". This solubility differential suitably allows for development and selective removal of either the "radiation-exposed" or "non-radiation-exposed" parts of the coating (depending on whether the resist is positive or negative tone resist).

In general, the resist material(s) in the exposed part(s) of the coating is, at least partially, fragmented (i.e. through chemical bond-breakages, suitably via chain scission methods, suitably caused by irradiation), suitably into shorter or smaller fragments. Such fragmentation is suitably caused by primary radiation (e.g. primary electrons of an eBeam) and/or secondary electrons (produced by a secondary electron generator in response to primary radiation). Suitably, such smaller fragments suitably have a higher solubility in the developing medium than their original non-fragmented counterparts.

Where the resist composition or resist coating is positive tone (i.e. a positive resist), suitably the exposed part(s) of the coating become more soluble (suitably in relation to a pre-determined developing medium, for example, one of the developing media described herein). As such, the net effect of irradiation (and optionally a post-exposure bake) is to increase the solubility of exposed part(s) of the resist coating. As such, suitably the exposed part(s) are intended to be removed after subsequent developing. Suitably, the increase solubility of the resist coating is the result of the aforementioned break down of the base component (suitably base polymeric component).

Where the resist composition or resist coating is negative tone (i.e. a negative resist), suitably the exposed part(s) of the coating become less soluble (suitably in relation to a pre-determined developing medium, for example, one of the developing media described herein). As such, the net effect of irradiation (and optionally a post-exposure bake) is to reduce the solubility of exposed part(s) of the resist coating. As such, suitably the exposed part(s) are intended to remain after subsequent developing. Since the aforementioned break down of the base component generally leads to elevated solubility, negative tone resist compositions suitably additionally comprise a negative resist agent, such as a cross linking agent. Such a cross-linking agent may suitably cross-link the base component, or any fragments thereof (see above), during irradiation and/or during any optional post-exposure bake, to thereby provide a cross-linked base component that is less soluble than the original base component. It will be readily recognized, by those skilled in the art, that radiation above a certain energy and/or intensity threshold may lead to negative resists becoming positive resist, merely because the negative resist agent (e.g. cross-linking agent) may itself be broken down and/or destroyed, thereby preventing it from performing its intended function. As such, a negative resist may only act as a negative resist within certain limits, which are straightforward for the skilled person to determine.

Exposure of the coating may lead directly to a developable substrate (i.e. a substrate which can undergo development to produce a patterned substrate). However, additional subsequent processing steps may be employed. Suitably, radiation exposure of the coating may be followed by a post-exposure bake. The post-exposure bake may comprise baking at a temperature and pressure and for a time suitable to form a developable substrate. The temperature (and pressure, especially where reduced pressure is used) may be chosen for compatibility with the particular solvent of the resist composition (e.g. to boil off the solvent). In a particular embodiment, the exposed coating (or exposed coated-base substrate or exposed coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds).

Any radiation suitable for use with resist compositions may be used. Suitably resist compositions are formulated for exposure with particular radiation, so the radiation may be selected base on the resist composition question. Suitably the radiation in question is either electromagnetic radiation (especially ultraviolet) or an electron beam. The resist compositions and coatings of the invention are especially suited for exposure to electron beam radiation. Alternative resist compositions and coatings are most suitably designed for exposure by light, suitably UV or visible light (i.e. as in photolithography), most suitably via a photomask.

Suitably the radiation is electron beam radiation (i.e. provided by an electron beam). Suitably the electron beam radiation is a focused, targeted beam, thereby allowing direct irradiation of the relevant part(s) of the coating (i.e. without any masking). As such, exposure of the coating using an electron beam may involve (effectively) writing upon the coating with the beam. The energy (or acceleration voltage), current, and write speed of the electron beam may be judiciously selected by the skilled person, depending on the circumstances. However, to expose the coatings of the invention, the electron beam radiation (i.e. primary electrons) suitably may have an initial energy (or acceleration voltage) between 10 and 300 keV, suitably between 30 and 200 keV, suitably between 50 and 150 keV, most suitably between 90 and 110 keV. The electron beam suitably has a current between 25 and 300 pA/beam (pA=pico amperes), suitably between 50 and 270 pA/beam, most suitably between 200 and 250 pA/beam. Where the electron beam is employed as a focused, targeted beam (i.e. for writing), the electron beam suitably has a write speed (or exposure dose) below 700 $\mu C/cm^2$ (uC=unit of electronic charge, uC/cm$^2$=electronic charge per unit area), suitably below 600 $\mu C/cm^2$, suitably below 500 $\mu C/cm^2$, more suitably below 400 $\mu C/cm^2$. The present invention allows the use of low energy electron beams, thereby minimizing damage to components of the resist composition (e.g. to cross-linking agents), which may compromise the function of the resist. An electron beam can be generated by methods well known to those skilled in the art.

Clearance doses (or clearance write times) and optimum exposure doses (or optimum write times) may be judiciously derived by the person skilled in the art to suit the system in question. Suitably, where an electron beam is employed as the exposure radiation, the write speed (or exposure dose) is below 800 ($\mu C/cm^2$), suitably below 700 $\mu C/cm^2$, suitably below 600 $\mu C/cm^2$, suitably below 500 $\mu C/cm^2$, more suitably below 400 $\mu C/cm^2$. Suitably, where an electron beam is employed as the exposure radiation, the write speed (or exposure dose) is above 50 ($\mu C/cm^2$), suitably above 100 $\mu C/cm^2$, suitably above 200 $\mu C/cm^2$, suitably above 300 $\mu C/cm^2$, more suitably above 350 $\mu C/cm^2$.

The Examples which follow, in conjunction with the skilled persons general knowledge, allows the skilled person to operate within the full scope of the invention and to enjoy the benefits thereof. In particular, the examples provide the skilled person with tools to adapt the SEG coatings (and originator compositions), radiation type, radiation properties, and write times to achieve excellent exposure results.

In an embodiment, where alternative resist coatings are used alongside non-eBeam radiation (e.g. ultraviolet radiation), suitably said radiation has a wavelength between 10 and 400 nm. Where ultraviolet radiation is used for exposure, the resist composition (and hence the resist coating) will suitably comprise additional ingredients (e.g. a photoacid and/or photocatalyst) which facilitate the coating transformation process upon exposure to ultraviolet radiation. The ultraviolet radiation may give rise to secondary electrons during exposure (in much the same manner as with electron beam radiation, albeit the secondary electrons may be generated more indirectly), especially in the presence of a secondary electron generator as defined herein. The ultraviolet radiation can be generated by methods well known to those skilled in the art. The ultraviolet radiation may be extreme-ultraviolet (EUV), suitably having a wavelength between 10 and 124 nm, suitably between 10 and 20 nm, suitably between 11 and 15 nm (most suitably about 13.4 nm). Alternatively, the ultraviolet radiation may suitably have a wavelength between 150 and 240 nm, suitably between 180 and 210 nm, suitably between 190 and 200 nm, suitably about 193 nm.

Developing the Resist Coating and the Developing Medium

The present invention provides a patterned substrate, and a method for its preparation (e.g. developing an exposed resist-coated material), as defined herein. Suitably, "development" forms grooves within the resist coating to thereby form a pattern layer.

The step of developing the exposed resist coating generates a resist pattern layer comprising developer-insoluble coating portions of the resist coating (i.e. ridges) and an array of grooves extending through the resist pattern layer. In certain embodiments, a surface of the substrate underlying the resist pattern layer is exposed in/by the grooves, though is suitably masked by the ridges.

Developing the exposed resist-coated material is suitably performed with a developing medium. As such, the exposed resist-coated material, or at least the exposed coating thereof, is suitably contacted with (e.g. washed with and/or immersed within) a developing medium (which is suitably liquid) in a manner sufficient to remove (suitably through dissolving) either the exposed part(s) (for positive resists) or non-exposed part(s) (for negative resists) of the coating of the resist composition. For resist coatings of the invention, the developing medium suitably removes non-exposed part(s).

As aforementioned, exposure of the resist-coated material generally causes exposed part(s) of the coating to have a different solubility (suitably in relation to a pre-determined developing medium) to non-exposed part(s) of the coating. This solubility differential between the exposed and non-exposed part(s) of the coating is instrumental in facilitating subsequent development of the exposed coated-resist material. As such, either the exposed or non-exposed part(s) of the coating may be selectively removed (preferably dissolved) to transform the coating into a pattern layer comprising an array of grooves extending through the pattern layer (i.e. through what was the original coating). The grooves of the pattern layer then correspond with the part(s) of the coating that have been removed, whereas the ridge/protrusion (i.e. non-groove) part(s) of the pattern layer correspond with the part(s) of the coating that remain. The pattern layer (suitably the non-groove part(s) thereof) therefore suitably comprises ridges or protrusions (i.e. between the grooves) which are either exposed part(s) (for positive resists) or non-exposed part(s) (for negative resists) of a coating of the resist composition.

The specific developing conditions may be tuned, for instance, to optimise the quality of the resulting patterned substrate, or optimise the developing process (whether in the interests of cost, speed, or ultimate product quality). Developing times (for instance, the time if immersion of the exposed coating) may, for example, be optimised to maximise removal of the part(s) of the coating intended for removal and to minimise removal or damage of part(s) of the coating intended to remain. Likewise, the developing medium may be tuned to optimise either or both the developing process or the resulting product.

Suitably, after developing, the method of preparing a patterned substrate comprises rinsing the pattern layer, suitably with a rinse medium, which suitably comprises an organic solvent.

Suitably, after developing, and optionally after rising, the method further comprises drying (or baking) the patterned substrate.

The developing medium itself may be any suitable developing medium known in the art. Suitably the developing medium complements the resist composition (or coating thereof). Most suitably the developing medium complements the solubility properties of the resist composition and its post-exposed counterpart, suitably to optimize contrast (i.e. the differential solubility and/or solubilization rates) between exposed and unexposed parts of the resist coating. Where the resist composition/coating is a resist composition/coating of the invention, suitably the developing medium dissolves unexposed resist coating compound.

Where the resist composition (or coating thereof) is a negative resist, the developing medium suitably comprises a solvent within which the secondary electron generator and/or base component is (substantially) soluble, or is/are at least more soluble than a post-exposed counterpart(s). Where the resist composition (or coating thereof) is a positive resist, the developing medium suitably comprises a solvent within which the secondary electron generator and/or base component is (substantially) insoluble, or at least less soluble than a post-exposed counterpart(s).

The developing medium may or may not dissolve all components of the exposed or non-exposed (depending on whether positive or negative resist) resist composition (or a coating thereof) intended for removal by development, but any insoluble (or less soluble) components may still be removed in slurry, suspension or dispersion following dissolution (or partial dissolution) of the base component or post-exposed counterpart thereof with which said insoluble components are mixed.

The developing medium for the resist coatings of the invention suitably comprise or consist of an organic solvent, suitably a non-polar organic solvent, suitably which is an organic compound. The organic solvent is suitably selected from one or more hydrocarbon solvents, suitably one or more (4-12C)hydrocarbon solvents. For example, the organic solvent may be selected from one or more of pentane, hexane, octane, decane, 2, 2, 4-trimethylpentane, 2, 2, 3-trimethylpentane, perfluorohexane and perfluoropentane and aromatic hydrocarbon solvents, such as toluene, ethylmethpropylbenzene, dimethylbenzene, ethyldimethylbenzene, dipropylbenzene), and methylisobutylketone (MIBK). In a particular embodiment, the developing medium for resist coatings of the invention is hexane.

The pattern layer may be considered to comprise an array of grooves extending through the pattern layer (i.e. a groove pattern) and an array of ridges/protrusions (i.e. the non-groove part(s) of the pattern layer). The ridges suitably correspond with developer-insoluble coating portions whereas the grooves suitably correspond with developer-soluble coating portions (i.e. which are removed upon developing).

Further Processing of Patterned/Developed Substrate

After developing the exposed resist coating, the surface of the substrate underlying the patent layer may be selectively modified in any one or more of a number of ways. Since the step of selectively modifying the substrate, substrate surface, or part(s) thereof, may be repeated indefinitely (before or after removing any residual resist pattern layer, and optionally after further lithography stages), one or more successive selective substrate/surface modification steps may ensue, which may optionally be selected from any of those detailed herein, or a combination thereof.

Suitably the part(s) of the substrate/surface modified during such selective modification are the part(s) exposed by or underlying the grooves in the pattern layer (i.e. the underlying surface to be modified may be exposed/visible or have only a relatively thin layer of resist remaining thereupon).

Selectively modifying the substrate/surface may involve removing part(s) of the substrate/substrate surface, adding or depositing a material to (or upon) the substrate/substrate surface, and/or changing part(s) of the substrate/substrate surface.

Modifying the substrate/surface may by removing part(s) of the substrate/substrate surface may, for instance, involve etching the substrate/surface. In the context of integrated circuit fabrication, typically such etching is performed to remove an insulating material (e.g. silicon oxide/dioxide layer, e.g. suitably which protects underlying conductive material), suitably to thereby uncover an underlying conductive material (e.g. silicon). Alternatively or additionally, etching may involve etching a conductive material (e.g. silicon)—e.g. capacitors may be produced via trenches etched deep into a silicon surface.

In the context of manufacturing a lithographic mask (e.g. a photomask), such etching may remove an opaque material or layer to reveal an underlying transparent material through which radiation may pass (e.g. during lithographic exposure through said resulting lithographic mask).

Etching would suitably selectively etch the part(s) of the substrate/surface underlying the groove(s) of the pattern layer rather than the part(s) of the substrate/surface underlying the ridges (which are essentially protected).

Modifying the substrate/surface by changing part(s) of the substrate/substrate surface may, for instance, involve altering the transparency properties of the substrate/surface (e.g. in producing a lithographic mask) or altering the electrical properties of the substrate/surface (or the relevant part(s) thereof) (e.g. when producing an integrated circuit). Altering the electrical properties of the substrate/surface is particularly applicable where the underlying substrate/surface being modified (e.g. that exposed by the grooves) is a semiconductor (e.g. silicon). Alteration of the substrate/surface(s) electrical properties may involve "doping" of the relevant part(s) of the substrate/surface. Doping is a well known phenomenon in the field of semiconductor technology, and facilitates the creation of electronic components within an integrated circuit (e.g. diodes, logic gates, transistors, etc.). Such doping can be performed using techniques well known in the art, such as diffusion (e.g. where a dopant is diffused into the substrate so that it becomes embedded therein), ion implantation (e.g. where an ion beam implants ions into the substrate).

Doping can, however, be achieved through pre-deposition, such as by epitaxial growth of a doped deposit (e.g. epitaxial growth of an Si—Ge layer).

Modifying the substrate/surface by changing part(s) of the substrate/substrate surface may alternatively or additionally involve forming an insulation layer (or isolation layer), or gate, suitably by transforming part(s) of the substrate/surface—e.g. through thermal oxidation (e.g. thermal oxidation of a conductor, such as silicon, produces the insulator silicon dioxide).

Modifying the substrate/surface by adding or depositing a material to (or upon) the substrate/substrate surface may, for instance, involve deposition of an insulating material, for instance, to isolate an electronic component or conductive element. Alternatively it may involve deposition of a conductive material (e.g. metal plating etc.).

Any, some, or all of the aforementioned surface modification steps may be deployed (suitably in succession, though optionally interspersed with lithographic steps—e.g. recoating, re-exposure, re-development) to form a multi-layered substrate, such as an integrated circuit (e.g. die or wafer).

Suitably, at a certain stage (e.g. following one or more surface modifications), one or more resist pattern layers (which may or may not be an eBeam resist pattern layer) are removed. A variety of techniques known in the art may be deployed for such removal (e.g. chemical removal, physical removal, thermal treatment, radiative removal or plasma ashing, or a combination.), though plasma ashing may be employed in the context of integrated circuit fabrication. Alternatively, the residual resist pattern layer(s) may be removed with a solvent (e.g. through dissolution) or via a selective etching process.

In some embodiments, once a resist pattern layer is removed, the entire modified surface may be treated/modified in toto.

Step (vi) allows for repetition of a surface modification step, so that successive surface modification steps may be performed (before and/or after pattern layer removal). In addition, step (vi) allows all lithography steps (steps i)-iii))), further surface modification steps (step iv)), and optional pattern layer removal (step v)) steps, to be repeated any number of times. So long as the method comprises at least one step involving a resist composition/coating of the invention or at least one step involving a tool (e.g. lithographic mask) of the invention, any or all of the repeated steps may employ an alternative resist coating and where appropriate alternative radiation (during exposure) instead of the resist coatings of the invention and corresponding radiation (during exposure). Alternatively, any or all of the repeated steps may employ the resist coating of the invention and corresponding radiation. It should therefore be evident that the repeating steps are not limited, and permit a multiplicity of method steps outside the scope of the invention, suitably in the production of integrated circuits and the like.

In the context of fabricating an integrated circuit, selectively modifying the substrate/surface (or part(s) thereof) may involve front-end-of-line (FEOL) processing (e.g. formation of electronic components, such as transistors, directly in the substrate, i.e. silicon). In fact, steps (i) to (vi) may collectively constitute front-end-of-line (FEOL) processing. It will be appreciated that a multi-layered substrate, of which an integrated circuit is an example, can be fashioned by multiple repeat steps and optionally also pre-steps. The present invention is being employed wherever a resist coating of the invention is used at least once, or wherever a lithographic mask obtained by using said resist coating is used at least once, in the method(s) of the invention.

The aforementioned processing options and features may apply equally to a method of manufacturing a lithographic mask (though features relating to integrated circuit fabrication are obviously not especially applicable to the creation of a lithographic mask), a method of performing lithography (using a lithographic mask formed by a method of the invention), a method of manufacturing a multi-layered substrate, or a method of fabricating an integrated circuit die or an integrated circuit wafer comprising a plurality of integrated circuit dice.

Typically, step (vi) may be followed by one or more finishing steps, such as back-end-if-line (BEOL) processing (as used in the fabrication of integrated circuits). This may involve conductively interconnecting electronic components and/or providing external contact terminals.

It will be evident that any number of pre-steps may precede step (i) of this method. In a particular embodiment, the input substrate is itself a partially built integrated circuit die (or wafer of dice) which has already been subjected to a plurality of pre-treatment steps.

According to a further aspect of the invention, there is provided a method of selectively modifying a surface of a substrate, the method comprising:
  i) providing a resist-coated substrate as defined herein or applying a resist coating to a substrate;
  ii) exposing part(s) of the resist coating to radiation (e.g. electron beam) to provide an exposed resist coating;
  iii) developing the exposed resist coating to generate an resist pattern layer, the resist pattern layer comprising: developer-insoluble coating portions of the resist coating (i.e. ridges); and an array of grooves extending through the resist pattern layer;
  iv) selectively modifying the substrate, substrate surface, or part(s) thereof, underlying the resist pattern layer,
  v) optionally removing the resist pattern layer to provide a modified substrate;
  vi) optionally repeating, one or more times, step iv) and/or steps i)-v) (optionally with an alternative resist coating; and optionally using alternative radiation during exposure) upon the modified substrate;
wherein step (i) of the method is optionally preceded by performing steps (i) to (vi) (i.e. pre-steps (i)-(vi)), optionally repeated one or more times, optionally using an alternative resist coating instead of the resist coating and optionally using alternative radiation during exposure;
wherein the resist coating comprises an optionally dried and/or cured resist composition;
wherein the resist composition comprises a secondary electron generator.

Lithography Using Lithographic Masks Produced Using Resist Compositions of the Invention As previously explained, resist compositions of the invention can be used to produce a lithographic mask. The lithographic mask is suitably produced by the lithography methods of the invention, which may optionally involve any further processing steps required to provide the lithographic mask. The lithographic mask comprises a mask pattern (which is suitably either a negative or positive image of the intended ridge pattern of a pattern layer to be produced using said mask). The mask pattern is suitably characterised by regions of surface/substrate transparency juxtaposed with regions of surface/substrate opacity. Such a mask is typically used in a method of performing lithography as defined herein (where step ii) involves exposure via the lithographic mask). The combination of transparent and opaque regions of the mask suitably allows relevant radiation (for exposing a resist coating, whether one of the invention or not) to pass through the transparent regions (and thereby expose a resist coating) and be blocked by the opaque regions (thereby leaving non-exposed resist coating portions). The exposed resist coating may then be developed as usual to yield a resist pattern layer.

Since such lithographic masks benefit from the invention in that they comprise a mask pattern of ultra high resolution, suitably ultra high resolution resist pattern layers can be produced using said masks. Such masks may be used in any of the methods defined herein, in conjunction or in the absence of steps involving a resist coating of the invention.

According to a further aspect of the invention, there is provided a method of manufacturing a lithographic mask (e.g. a photomask), the method comprising:
  i) providing an resist-coated substrate as defined herein or applying an resist coating to a substrate (suitably a substrate suitable for use in lithography);
  ii) exposing part(s) of the resist coating to radiation (e.g. electron beam) to provide an exposed resist coating;
  iii) developing the exposed resist coating to generate an resist pattern layer, the resist pattern layer comprising: developer-insoluble coating portions of the resist coating (i.e. ridges); and an array of grooves extending through the resist pattern layer;
  iv) optionally selectively modifying the substrate, substrate surface, or part(s) thereof, underlying the resist pattern layer (suitably such that the modified part(s) of the substrate or substrate surface have increased or decreased transparency to a pre-determined type of radiation, e.g. radiation used in photolithography, relative to the original substrate or unmodified part(s) of the substrate or substrate surface);
  v) optionally removing the resist pattern layer to provide a modified substrate;
wherein the resist coating comprises an optionally dried and/or cured resist composition;
wherein the resist composition comprises a secondary electron generator.

According to a further aspect of the invention, there is provided a lithographic mask (e.g. a photomask) obtainable by, obtained by, or directly obtained by the method of manufacturing a lithographic mask (e.g. a photomask) defined herein.

In an aspect of the invention, there is provided a lithographic mask with a mask pattern having a resolution as defined herein in relation to a product obtained from the lithographic method(s) of the invention.

Most suitably the lithographic mask is a photomask, which is suitable for use in photolithography (i.e. where the radiation is electromagnetic radiation, suitably UV or visible light).

Multilayered Substrates

According to a further aspect of the invention, there is provided a method of manufacturing a multi-layered substrate, the method comprising:
  i) providing a resist-coated substrate or applying a resist coating to a substrate (the resist coating may be any resist coating suitable for exposing via a lithographic mask, e.g. a photoresist);
  ii) exposing part(s) of the resist coating, through a lithographic mask (e.g. photomask) as defined herein (or obtainable by a method defined herein), to radiation (e.g. UV or visible light) to provide an exposed resist coating;
  iii) developing the exposed resist coating to generate a resist pattern layer, the resist pattern layer comprising: developer-insoluble coating portions of the resist coating (i.e. ridges); and an array of grooves extending through the resist pattern layer;
  iv) selectively modifying the substrate, substrate surface, or part(s) thereof, underlying the resist pattern layer,
  v) removing the resist pattern layer to provide a modified substrate;
  vi) optionally repeating, one or more times, step iv) and/or steps i)-v) (with either a resist coating of the invention or an alternative resist coating, such as a photoresist; and optionally using radiation, optionally eBeam, with or without a lithographic mask or alternative radiation during exposure, such as visible or ultraviolet light) upon the modified substrate;

wherein step (i) of the method is optionally preceded by performing steps (i) to (vi) of this method and/or of the method of performing lithography (i.e. pre-steps (i)-(vi)), optionally repeated one or more times, using either a resist coating of the invention or an alternative resist coating and using either electron beam radiation or alternative radiation during exposure;

wherein the resist coating comprises an optionally dried and/or cured resist composition;

wherein the resist composition comprises a secondary electron generator.

According to a further aspect of the invention, there is provided a method of manufacturing a multi-layered substrate, the method comprising:

i) providing an resist-coated substrate as defined herein or applying an resist coating to a substrate;

ii) exposing part(s) of the resist coating to radiation (e.g. eBeam) to provide an exposed resist coating;

iii) developing the exposed resist coating to generate an resist pattern layer, the resist pattern layer comprising: developer-insoluble coating portions of the resist coating (i.e. ridges); and an array of grooves extending through the resist pattern layer;

iv) selectively modifying the substrate, substrate surface, or part(s) thereof, underlying the resist pattern layer, v) removing the resist pattern layer to provide a modified substrate;

vi) optionally repeating, at least once, step iv) and/or steps i)-v) (optionally with an alternative resist coating; and optionally using alternative radiation during exposure) upon the modified substrate;

wherein step (i) of the method is optionally preceded by performing steps (i) to (vi) of this method and/or of the method of performing lithography (i.e. pre-steps (i)-(vi)), optionally repeated one or more times, using either a resist coating of the invention or an alternative resist coating and using either electron beam radiation or alternative radiation during exposure;

wherein the resist coating comprises an optionally dried and/or cured resist composition;

wherein the resist composition comprises a secondary electron generator.

According to a further aspect of the invention, there is provided a method of manufacturing a multi-layered substrate, the method comprising:

i) providing an resist-coated substrate as defined herein or applying an resist coating to a substrate; and ii) exposing part(s) of the resist coating to radiation (e.g. electron beam) to provide an exposed resist coating; OR i) providing a resist-coated substrate or applying a resist coating to a substrate (wherein the resist coating is either as defined herein or is any alternative resist coating suitable for exposing via a lithographic mask, e.g. a photoresist); and ii) exposing part(s) of the resist coating, through a lithographic mask (e.g. photomask) as defined herein (or obtainable by a method defined herein), to radiation (e.g. UV or visible light) to provide an exposed resist coating;
AND iii) developing the exposed resist coating to generate an resist pattern layer, the resist pattern layer comprising: developer-insoluble coating portions of the resist coating (i.e. ridges); and an array of grooves extending through the resist pattern layer;

iv) selectively modifying the substrate, substrate surface, or part(s) thereof, underlying the resist pattern layer, v) removing the resist pattern layer to provide a modified substrate;

vi) optionally repeating, one or more times, step iv) and/or steps i)-v) (with either a resist coating of the invention or an alternative resist coating, such as a photoresist; and optionally using radiation, optionally eBeam, with or without a lithographic mask or alternative radiation during exposure, such as visible or ultraviolet light) upon the modified substrate;

wherein step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing lithography, optionally repeated one or more times, using either a resist coating of the invention or an alternative resist coating and using either electron beam radiation or alternative radiation during exposure;

wherein the resist coating comprises an optionally dried and/or cured resist composition;

wherein the resist composition comprises a secondary electron generator.

According to a further aspect of the invention, there is provided a multi-layered substrate obtainable by, obtained by, or directly obtained by a method of manufacturing a multi-layered substrate as defined herein.

Integrated Circuit Wafers and Dice

The present invention provides a method of fabricating an integrated circuit die or an integrated circuit wafer comprising a plurality of integrated circuit dice, the or each die comprising a plurality of electronic components, wherein the method comprises:

i) providing an resist-coated substrate as defined herein or applying an resist coating to a substrate; and ii) exposing part(s) of the resist coating to radiation (e.g. electron beam) to provide an exposed resist coating;
OR i) providing a resist-coated substrate or applying a resist coating to a substrate (the resist coating may be any resist coating suitable for exposing via a lithographic mask, e.g. a photoresist); and ii) exposing part(s) of the resist coating, through a lithographic mask (e.g. photomask) as defined herein (or obtainable by a method defined herein), to radiation (e.g. UV or visible light) to provide an exposed resist coating;
AND iii) developing the exposed resist coating to generate an resist pattern layer, the resist pattern layer comprising: developer-insoluble coating portions of the resist coating (i.e. ridges); and an array of grooves extending through the resist pattern layer;

iv) modifying the substrate, substrate surface, or part(s) thereof, underlying the resist pattern layer (this may involve conductively interconnecting the electronic components of the or each die with conductor(s));

v) removing the resist pattern layer to provide a modified substrate;

vi) optionally repeating, one or more times, step iv) and/or steps i)-v) (with either a resist coating of the invention or an alternative resist coating, such as a photoresist; and optionally using radiation (e.g. electron beam) with or without a lithographic mask or alternative radiation during exposure, such as visible or ultraviolet light) upon the modified substrate;

vii) optionally conductively interconnecting the electronic components of the or each die with conductor(s) (if not already performed during one or more substrate/substrate-surface modifying steps) to provide an integrated circuit with external contact terminals;

viii) optionally performing one or more further finishing steps;

ix) optionally separating an integrated circuit die from a wafer comprising a plurality of integrated circuit dice.

Step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing lithography (e.g. eBeam), optionally repeated one or more times, using either a resist coating of the invention or an alternative resist coating and using either electron beam radiation or alternative radiation during exposure.

The resist coating suitably comprises an optionally dried and/or cured resist composition; wherein the resist composition comprises a secondary electron generator.

In a particular embodiment, steps (i) and (ii) comprise:

i) providing an (eBeam) resist-coated substrate as defined herein or applying an (eBeam) resist coating to a substrate; and ii) exposing part(s) of the (eBeam) resist coating to electron beam radiation to provide an exposed (eBeam) resist coating;

In a particular embodiment, steps (i) and (ii) comprise:

i) providing a resist-coated substrate or applying a resist coating to a substrate (the resist coating may be any resist coating suitable for exposing via a lithographic mask, e.g. a photoresist); and ii) exposing part(s) of the resist coating, through a lithographic mask (e.g. photomask) as defined herein (or obtainable by a method defined herein), to radiation (e.g. UV or visible light) to provide an exposed resist coating;

Features, including optional, suitable, and preferred features, relating to this method of fabricating an integrated circuit die or an integrated circuit wafer comprising a plurality of integrated circuit dice are described in relation to a method of performing lithography (e.g. eBeam) hereinbefore.

However, it is important to appreciate that the fabrication of integrated circuit dies or dice may involve many processing steps, and may involve the production of a multi-layered substrate.

As will be appreciated by those skilled in the art, producing an integrated circuit (for inclusion in a circuit board) typically involves wafer processing (i.e. processing of a silicon wafer), die preparation (e.g. cutting/separating individual dice from the processed wafer), integrated circuit packaging (where each dice is package so that it may be used in an circuit board), and suitably also integrated circuit testing.

Though wafer processing is well understood in the art, it is worth noting that in certain embodiments wafer processing comprises wet cleaning; photolithography; ion implantation; dry etching and/or wet etching; plasma ashing; thermal treatment (e.g. annealing or thermal oxidation); chemical vapour deposition (CVD), physical vapour deposition (PVD), molecular beam epitaxy (MBE), and/or electrochemical deposition (ECD); wafer testing (e.g. to validate electrical performance); and wafer backgrinding (to reduce thickness of the wafer and resulting die and chip). The methods, resist compositions/coatings, and lithographic masks of the invention are suitably used at least once during wafer processing. Where a resist coating of the invention is used during wafer processing, suitably at least one photolithography operation (which combines substrate resist coating, exposure, and development) is replaced by a lithography operation (e.g. eBeam) of the invention that uses a resist coating of the invention in place of a photoresist. Where a lithographic mask, produced using a resist coating of the invention (i.e. one characterised by the levels of resolution only achievable using the invention), is used during wafer processing, suitably at least one photolithography operation is replaced by a lithography operation (which may itself involve photolithography or any other type of lithography, including eBeam, though most preferably photolithography) that utilises said lithographic mask during exposure. However, it will be appreciated that the benefits of the invention may be realised even if the resist coating or lithographic mask of the invention is used only once (or to produce only a single layer or only a single electronic component or single set of electronic components), and conceivably any further lithography operations (e.g. photolithography) may employ standard techniques known in the art of fabricating integrated circuits. Hence the methods of the invention provide the option for any or all repeat steps (and even any or all of any pre-steps) to be performed without the coating or lithographic mask of the invention.

As aforementioned, steps (i)-(vi) of the method may constitute front-end-of-line (FEOL) processing. Optionally, this processing does, at least to an extent, involve conductively interconnecting the electronic components of the or each die. However, most suitably, steps vii) to ix) constitute back-end-of-line (BEOL) processing.

Suitably conductively interconnecting the electronic components involves metallisation. Suitably, conductively interconnecting the electronic components involves creating metal interconnecting wires isolated by one or more dielectric (i.e. insulating) layers, where the insulating material is typically silicon dioxide (typically formed by thermal oxidation of silicon) or a silicate glass, though the material is not limited.

Metallisation may involve generating a network of metal wires, such as copper or aluminium wires. Such a process may suitably involve: a) blanket coating of a modified substrate with a metal (e.g. copper or aluminium), patterning (e.g. using lithography to generate a resist pattern layer), etching the metal underlying a resist pattern layer (i.e. to produce discrete metal wires), and forming or depositing an insulating material over the metal wires. It will be appreciated that, for instance, where multiple layers of metal wires are required to generate a viable integrated circuit, some or all of such metal wire layers may be formed instead during a surface modification step, which may involve this same procedure.

After a wafer of dice is produced, die cutting may ensure to separate all of the dies ready for packaging.

Wafers and dice produced by the method of the invention are characterised by high performance owing, not least, to the high resolutions obtained. They may also be smaller than standard IC dice.

Integrated Circuit Packages

The skilled person in the field of integrated circuits is well able, using standard workshop techniques, to produce an integrated circuit package from an integrated circuit die. However, the present invention provides an a method of manufacturing an integrated circuit package, the integrated circuit package comprising a plurality of pins and an integrated circuit die with external contact terminals conductively connected to the corresponding plurality of pins, wherein the method comprises:
   i) providing an integrated circuit die as defined herein or fabricating an integrated circuit die by a method of fabricating an integrated circuit die as defined herein;
   ii) attaching the integrated circuit die to a package substrate, wherein the package substrate comprises electrical contacts, each of the electrical contacts being optionally connected or connectable to a corresponding pin;
   iii) conductively connecting each of the external contact terminals of the integrated circuit die to corresponding electrical contacts of the package substrate;
   iv) optionally (and if necessary) connecting the electrical contacts of the package substrate to corresponding pins;
   v) encapsulating the integrated circuit die.

Conductively Connecting Die and Package Substrate

Typically the method involves conductively connecting a die to a package substrate by one of a variety of methods known in the art, such as wire bonding, thermosonic bonding, flip chip, wafer bonding, or tab bonding.

Connecting pins render IC's practical and straightforward to incorporate into a circuit board. Therefore, the method suitably involve electrically connecting the IC package pins to the die via appropriate contacts. Typically, the connecting pins are part of an encapsulation device, and so this step may be combined with encapsulation step.

Dice can be air/moisture sensitive, hence why they are usually encapsulated. An encapsulated IC package is suitably baked, plated, laster marked, and trimmed. Finally, an IC package is suitably electronically tested for quality assurance.

Circuit Boards, Electronic Devices or Systems

Suitably, a circuit board incorporating an integrated circuit package (with a plurality of pins) of the invention may be readily produced by simply conductively connecting the integrated circuit package to a circuit board.

Furthermore, said circuit board may be readily incorporated into an electronic device or system as defined herein. As such, consumer products that are or incorporate an electronic device or system of the invention, reap the benefits of the high resolution (and other notable advantages) integrated circuits afforded by methods of the invention, and the novel resist coatings described herein.

Uses of Compositions

According to a further aspect of the invention, there is provided a use of a resist composition for coating a substrate with a resist coating of the invention; for patterning a substrate; as a resist coating in electron-beam lithography; for selectively modifying a surface of a substrate; for manufacturing a lithographic mask (such as those used in performing lithography or the production of integrated circuits etc.); for manufacturing a multi-layered substrate; for fabricating an integrated circuit die; for fabricating an integrated circuit wafer; for manufacturing an integrated circuit package; for manufacturing a circuit board; or for manufacturing an electronic device or system.

Electronic Component

The present invention also provides an electronic component comprising or consisting of a plated substrate as defined herein. Moreover, the present invention provides a use of a resist composition, a resist-coated material, an exposed resist-coated material, a patterned substrate, or a plated substrate, as defined herein, for use in producing an electronic component. In such an aspect, the relevant plated substrate suitably comprises a conductive plating material within some or all of the grooves of the pattern layer.

The electronic component may be any suitable electronic component known in the art which can benefit from the resist technology of the present invention. For instance, the electronic component may be a circuit board (e.g. a printed circuit board or integrated circuit board), a microchip, or a touch screen (e.g. for mobile phones, tablets, screens, etc.).

Specific Uses and Benefits

As aforementioned, the present invention provides a use of a secondary electron generator, or a resist composition for obtained one or more of any of the aforementioned benefits. In particular, resist compositions of the present invention allow for increased exposure sensitivity of a resist composition or coating thereof; decreased energy and/or intensity of incident exposure radiation; increased write-speed during electron beam exposure; decreased resist-coating thickness; increased etch resistance; and increased resolution. The resist compositions of the invention also have an excellent shelf-life, and also adhere well to base substrates, especially base substrates suitably for use in the production of electronic components.

An aspect of the invention provides a use of a secondary electron generator or a resist composition as defined herein, for amplifying the production of secondary electrons during exposure of a resist coating to radiation and/or primary electrons.

EXAMPLES

The invention will now be further described by way of the following further, non-limiting, examples.

Materials and Equipment

Poly(methmethylacrylate) (PMMA) ($M_W$~996 kDa) was obtained from Sigma Aldrich. Poly(methmethylacrylate) (PMMA) was used as the resist polymer (or base polymeric component), though the skilled person will appreciate that this is one of many suitably resist polymers that may be effectively used in conjunction with the invention.

Chloroauric acid tetrahydrate ($HAuCl_4.4H_2O$), referred to hereinafter as $HAuCl_4$, was obtained from Sigma Aldrich. Chloroauric acid was used as a secondary electron generator in model studies for the following two reasons: 1) Gold's electron orbital cloud is dense and so upon inspection the difficulty in verifying the nanostructures is dramatically decreased; and 2) The oxidation state is stable and should not change when the resist is soft baked at a temperature of 180°. However, it will be understood by those skilled in the art, especially in view of the predictive models outlined herein, that this particular secondary electron generator is illustrative of a generally applicable principle, and it is well within the skilled person's capability to judiciously modify the resist compositions disclosed herein to afford a whole range of resist compositions according to the invention.

Pentaerythritol tetraacrylate was obtained from Sigma Aldrich. Pentaerythritol tetraacrylate was used as a crosslinker in negative tone resist compositions.

Solvents, such as acetone, anisole, and 2-propanol were all commercially sourced and used as supplied.

Silicon wafer substrates (wafers 500 μm thick) 10 mm×10 mm were commercially sourced from University wafer.com and used as supplied.

The spin-coating equipment included an SCS G3P-8 spin coater, with an 8 inch bowl and spin speeds of 100 to 10000 rpm.

A FEI Sirion Scanning Electron Microscope (SEM) was used to provide a source of an electron beam.

MIBK (Methyl IsoButyl Ketone) was commercially sourced and used as supplied. MIBK was used as the developing medium to remove any developer-soluble resist coating post-exposure.

Post-developed patterned substrates were inspected and analysed using a Leica optical microscope using a 10× objective lens.

Herein, various positive and negative tone resist compositions are disclosed along with their method of manufacture.

Example 1—Formation of Positive Tone Resist Composition

All Positive Tone Resist films are cast from Anisole and Acetone (1 g and 50 mg respectively)

To fabricate all of the positive resist formulations, add 30 mg of PMMA granules to 1 g of Anisole and shake it at 1500 rpm using a IKA shaker for 24 hrs, repeat this four times to make four samples. To prepare each nanocomposite resist, add 3 mg of the HAuCl$_4$ to 50 mg Acetone, the HAuCl$_4$ is soluble in Acetone and they will mix. Once this has been done, then introduce this mixture to one of the PMMA/Anisole samples. Shake it at 1000 rpm for 2 mins to ensure that it mixes thoroughly. Repeat this for the 6 and 9 mg of the HAuCl$_4$. This procedure yielded metal organic nanocomposite materials (as shown in Table 1) comprising Poly(methmethylacrylate) (PMMA) and chloroauric acid (HAuCl4.4H$_2$O).

TABLE 1

Positive Tone Resist Formulations.

| PMMA (%) | HAuCl$_4$ (%) | PMMA (mg) | HAuCl$_4$ (mg) | Total (mg) |
|---|---|---|---|---|
| 100 | 0 | 30 | 0 | 30 |
| 90 | 10 | 30 | 3 | 33 |
| 84 | 16 | 30 | 6 | 36 |
| 77 | 23 | 30 | 9 | 39 |

Example 1A—Further Formations of Positive Tone Resist Compositions

Further examples of the positive tone nanocomposite resist comprise of Poly(methmethylacrylate) and Titanium Terta Chloride, Indium TriChloride, Yttrium TriChloride and Mercuric Chloride. From this, the resist polymer is a PMMA based nanocomposite resist that exhibits different physical properties when compared to PMMA. The physical geometry of the molecules is shown in Table 1A.

TABLE 1A

A schematic of the molecules that are used to fabricate the UoM positive tone resist.

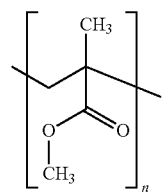

TiCl$_4$
Titanium TetraChloride

PMMA, The molecular weight 96K.

TABLE 1A-continued

A schematic of the molecules that are used to fabricate the UoM positive tone resist.

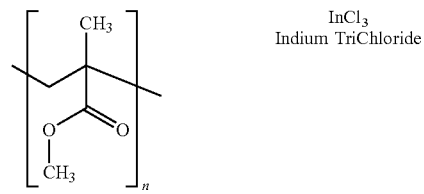

InCl$_3$
Indium TriChloride

PMMA, The molecular weight 96K.

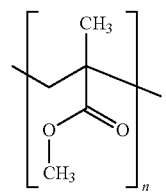

YCl$_3$
Yttrium TriChloride

PMMA, The molecular weight 96K.

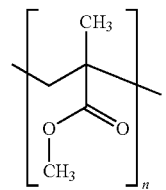

HgCl$_2$
Mercuric Chloride

PMMA, The molecular weight 96K.

The fabrication process is as follows: To fabricate all of the positive resist formulations, add 50 mg of PMMA$_{96K}$ granules to 1 g of Anisole and it was stirred for 12 hrs. To prepare each nanocomposite resist, add 12.5 mg of the TiCl$_4$ or HgCl$_2$ into 100 mg Acetone, as the TiCl$_4$ and HgCl$_2$ is soluble in Acetone. It was found that the InCl$_3$ and YCl$_3$ were soluble in MethoxyEthanol. Therefore, 12.5 mg of the InCl$_3$ or YCl$_3$ was introduced to 200 mg MethoxyEthanol. Once this has been done, then introduce this mixture to one of the PMMA/Anisole samples. Shake it for 2 mins to ensure that it mixes thoroughly. Table 1B shows the formulation for the positive tone nanocomposite resists.

TABLE 1B

Nanocomposite resist formulations.

| PMMA (mg) | TiCl$_4$ (mg) | InCl$_3$ (mg) | YCl$_3$ (mg) | HgCl$_2$ (mg) |
|---|---|---|---|---|
| 50 | 12.5 | 0 | 0 | 0 |
| 50 | 0 | 12.5 | 0 | 0 |
| 50 | 0 | 0 | 12.5 | 0 |
| 50 | 0 | 0 | 0 | 12.5 |
| 50 | 0 | 0 | 0 | 0 |

The Positive Tone Resist films that contained TiCl$_4$ and HgCl$_2$ were cast from Ansiole and Acetone (1 g and 100 mg respectively), while the Positive Tone Resist films that contained InCl$_3$ and YCl$_3$ were cast from Ansiole and MethoxyEthanol (1 g and 200 mg respectively).

Example 2—Formation of Negative Tone Resist Composition

Negative Tone Resist films are cast from Ansiole and 2 Propanol (1 g and 50 mg respectively)

To fabricate the negative tone resist, repeat the procedure to produce the PMMA/Anisole samples, simply add 12 mg of the pentaerythritol tetraacrylate to the mixture and shake it at 1000 rpm for 5 mins. The pentaerythritol tetraacrylate is soluble in this mixture. Then repeat the HAuCl$_4$/Acetone procedure, but replace 50 mg of Acetone with 50 mg of 2 Propanol (Acetone destroys the pentaerythritol tetraacrylate material) to produce the HAuCl$_4$/2 Propanol mixture and introduce it to the PMMA/Anisole/Pentaerythritol tetraacrylate mixture and shake it at 1000 rpm for 5 mins. This procedure yielded metal-organic nanocomposite materials (as shown in Table 2) comprising Poly(methmethylacrylate) (PMMA), chloroauric acid (HAuCl4.4H$_2$O), and pentaerythritol tetraacrylate (PET) material.

TABLE 2

Negative Tone Resist Formulations.

| PMMA (%) | HAuCl$_4$ (%) | PET (%) | PMMA (mg) | HAuCl$_4$ (mg) | PET (mg) | Total (mg) |
|---|---|---|---|---|---|---|
| 71.5 | 0 | 28.5 | 30 | 0 | 12 | 42 |
| 63.4 | 10 | 26.6 | 30 | 3 | 12 | 45 |
| 59 | 16 | 25 | 30 | 6 | 12 | 48 |
| 53.5 | 23 | 23.5 | 30 | 9 | 12 | 51 |

Example 3—Formation of Resist-Coated Materials

Both positive and negative tone resists were spun onto 10 mm×10 mm silicon substrates. The resist was spun using a spin cycle of 4000 rpm for 60 seconds, which was followed by a soft-bake at 180° C. for 3 minutes, allowing the cast solvents to evaporate. All resist films resulted with a thickness of 100 nm. The test pattern that was used to obtain the exposure clearing doses of each resist was determined from a matrix of a 20 40 μm squares. These were exposed with a dose scale in incremental steps of 1 second, and hence the clearing dose could be determined of each resist.

Example 3A—Formation of Resist-Coated Materials with Compositions of Example 1A The positive tone nanocomposite resists of Example 1A were each spun onto 10 mm×10 mm silicon substrates. The resist was spun using a spin cycle of 4000 rpm for 60 seconds, which was followed by a soft-bake at 180° C. for 2 minutes, allowing the cast solvents to evaporate. All resist films resulted with a thickness of 100 nm. The exposure clearing doses of each resist material were determined from a 1 dimensional matrix of a 50 nm by 200 μm boxes (the width of the boxes was 50 nm), each structure had a period of 250 nm. These were exposed with a dose scale from 1 to 10 in incremental steps of 0.1 μC/cm$^2$, and this test pattern is shown in FIG. 5A.

Example 4—Formation of Exposed Resist-Coated Materials (i.e. e-Beam Exposure)

All resists were then exposed using a FEI Sirion Scanning Electron Microscope (SEM). The exposed pattern was written using an acceleration voltage of 30 keV, a probe current of 50 pA, the linescan was 1.68 mS and the step size was 8.5 nm. Each pattern was exposed using a write field of 100 μm.

Example 4A—Formation of Exposed Resist-Coated Materials from Example 3A

All resists of Example 3A were then exposed using a FEI Sirion Scanning Electron Microscope (SEM). The exposed pattern was written using an acceleration voltage of 30 keV, a probe current of 25 pA, the dwell time was 3 μS and the step size was 6.1 nm. From these exposure parameters, the base dose was calculated to be 201 μC/cm$^2$. Each pattern was exposed using a write field of 200 μm.

Example 5—Formation of Patterned Substrate (i.e. Developing Exposed Resist Coatinq)

Each resist was developed using a solution of MIBK (Methyl IsoButyl Ketone), for 30 s followed by an N$_2$ blow dry. All patterns fabricated in all of the resist were inspected using a Leica optical microscope using a 10× objective lens.

Example 5A—Formation of Patterned Substrate from Exposed Resists of Example 4A Each of the PMMA nanocomposite resist that had PMMA with a molecular weight of 96K was developed using a solution of MIBK (Methyl IsoButyl Ketone) and IPA with the ratio of 1:3, for 30 s followed by an N$_2$ blow dry. This is the standard process of both industrial and research institutions and will serve as the bench mark for comparison.

Example 6—Predictive Models

Monte Carlo Simulation

The Monte Carlo simulation presented is based on the model developed by Joy[1]. When electrons are incident on a resist film they are scattered elastically and inelastically with the molecule throughout the resist. These two scattering events are governed by two different sets of equations. Elastic scattering is determined by the screened Rutherford cross section, $$\sigma_{elastic} = \frac{Z^2}{E^2} \frac{4\pi}{\alpha(1+\alpha)} \left(\frac{E+511}{E+1024}\right)^2 \text{cm}^2/\text{atom}, \quad (2)$$

where E is the electron energy in keV, Z is the atomic number of the material (and may optionally be replaced by $Z_{eff}$ optionally multiplied by an appropriate correction constant) and a is the screening factor, this compensates for the fact that the electron does not 'see' the all of the atom's charge as it is surrounded by a cloud of electrons. The mean free path is calculated from the scattering cross section is given by $$\lambda_{elastic} = \frac{A}{N_a \rho \sigma_{elastic}}, \quad (3)$$

where A is the atomic weight of the material and Na is Avogadro's number. Inelastic scattering however, must use a different relationship because there is a high probability that a secondary electron (SE) is produced from this scattering event. Therefore, the inelastic scattering cross section is calculated using.

$$\frac{d\sigma_{inelastic}}{d\Omega} = \frac{\pi e^4}{E^2}\left(\frac{1}{\Omega^2 + (1-\Omega)^2}\right), \quad (4)$$

Where ΩE is the energy of the secondary electron produced. The inelastic scattering event causes the primary electron to be deflected by an angle α given by $$\sin^2\alpha = \frac{2\Omega}{2+t-t\Omega}, \quad (5)$$

Where t is the kinetic energy of the electron (in units of its rest mass). However the secondary electron created exits the collision at an angle γ given by, $$\sin^2\gamma = \frac{2(1-\Omega)}{2+t\Omega}, \quad (6)$$

Once the inelastic scattering cross section is calculated, the mean free path of the electron must be calculated using, $$\lambda_{inelastic} = \frac{A}{N_a Z \rho \sigma_{inelastic}}, \quad (7)$$

The total mean free path of the electron in resist is the sum of the elastic and inelastic mean free paths $$\frac{1}{\lambda_{total}} = \frac{1}{\lambda_{elastic}} + \frac{1}{\lambda_{inelastic}}. \quad (8)$$

From the value of the mean free path, the statistical distance the electron will travel before it collides again can be calculated. This is achieved using the step size equation given by, $$s = -\lambda \ln(RND), \quad (9)$$

where λ is the total mean free path and RND is a random number between 0 and 1. This gives a distribution of step sizes with an average step size of λ.

The final step of the Monte Carlo simulation is to calculate the energy lost by the electron during the scattering event. This was done using the modified Bethe equation, which governs the stopping power of a material and is given by, $$\frac{dE}{dS} = 78500 \frac{Z}{AE} \ln\left(\frac{1.166(E+0.85J)}{J}\right), \quad (10)$$

Where J is the mean ionization potential of the material. The mean ionization potential describes the energy losses the electron experiences in a given material, it can be calculated by, $$J = 9.76(Z) + \frac{58.5}{Z^{0.19}}, \quad (11)$$

Every time an electron scatters, this energy loss value is calculated and subtracted from the current energy of the electron. Once the electron's energy falls below 0.5 KeV, the electron was no longer tracked as the distance it travels in the material is negligible.

For the inclusion of the nanocomposite material to the base material a weighted average distribution was used, here the percentage (by weight) of the two materials was compared to a random number generator to calculate the material the electron effectively scatters off for each step.

$$\sigma_{total} = \omega \sigma_{HAuCl_4} + (1-\omega)\sigma_{PMMA}, \quad (12)$$

where ω is the relative weight of the $HAuCl_4$ to PMMA.

The electron beam resists modeled here had thickness of 100 nm. All resists systems are on 600 nm of Silicon and their physical properties are given in Table 1.

TABLE 3

Physical properties of the materials used in the Monte Carlo model.

| Physical property | PMMA | $HAuCl_4 \cdot 4H_2O$ | Silicon |
|---|---|---|---|
| Density (g/cm$^3$) | 1.19 | 2.89 | 2.33 |
| Effective Atomic Number | 5.85 | 40.76 | 14 |
| Average Atomic Weight (g/mol) | 100.116 | 409 | 28.0855 |
| Mean Ionization Potential (eV) | 74 | 217 | 174 |

The density, average Atomic number [when defining the invention, as in the above non-example section, and the average Atomic weight of the each material are well known [2][3][4], where as the mean ionization potential was calculated from equation 11. The Monte Carlo simulation used here can be found in reference [5] and [6]. The incident electron beam that the simulation used had a Gaussian distribution, where the spot size had a diameter of 3 nm.

The number of electrons that were used to model the PMMA, PMMA loaded with 3 mg, 6 mg and 9 mg of $HAuCl_4$ were 2016, 1558, 1120 and 784 respectively. It was calculated that this number of electrons equated to the dose of 72 μC/cm$^2$, 56 μC/cm$^2$, 36 μC/cm$^2$ and 28 μC/cm$^2$ for PMMA and PMMA based nanocomposite resist loaded with 3, 6 and 9 mg of $HAuCl_4$ respectively and this is the correct dose that is used to expose these materials. The simulation was run 1,000,000 times and averaged to reduce the statistical error.

Example 6A—Further Monte Carlo Simulations Based on Examples 1A

The Monte Carlo simulation presented is based on the model developed by Joy[1]. The electron beam resists modeled here had thickness of 100 nm. All resists systems are on 600 nm of Silicon and their physical properties are given in Table 3A.

TABLE 3A

Physical properties of the materials used in the Monte Carlo model.

| Physical property | PMMA | TiCl$_4$ | InCl$_3$ | YCl$_3$ | HgCl$_2$ | Silicon |
|---|---|---|---|---|---|---|
| Density (g/cm$^3$) | 1.19 | 1.726 | 3.4 | 2.67 | 5.43 | 2.33 |
| Effective Atomic Number | 5.85 | 23.123 | 32.68 | 26.509 | 61.1 | 14 |
| Average Atomic Weight (g/mol) | 100.116 | 189.679 | 221.18 | 195.26 | 271.52 | 28.0855 |
| Mean Ionization Potential (eV) | 74 | 257.88 | 349.1 | 290.11 | 623.12 | 174 |

The density, effective Atomic number and the average Atomic weight of the each material are well known. The incident electron beam that the simulation used had a Gaussian distribution of 3σ, where the spot size had a diameter of 3 nm. The simulation was run with a 100,000 electrons and was run 1,000,000 times and averaged to reduce the statistical error.

Results & Discussion 1—Resists of Examples 1, 2, 3, 4, 5, and 6

FIG. 1 shows internal electron scattering interactions inside (a) PMMA (representing a control or standard resist) exposed to an acceleration voltage of 30 KeV; and (b) PMMA films that were loaded with 23% HAuCl$_4$ (i.e. nanocomposite resist doped with secondary electron generator) exposed to an acceleration voltage of 30 KeV. In all cases, the electrons diverge away from the incident beam. It was observed from FIG. 1(b) that the nanocomposite resist doped with secondary electron generator experiences increased electron scattering compared to the PMMA resist shown in FIG. 1(a) and this can be seen, as the point electron spread is same.

This is because the density of the HAuCl$_4$ is larger than that of the PMMA material, due to that the mean free path between the atoms of the molecule is smaller. Therefore, the primary electrons (PE) experience more collisions as they travel through the resist film. A consequence of this is that the PE's lose a small amount of energy, for the case of HAuCl$_4$ it is 217 eV per collision when compared to that of PMMA material, which is 74 eV. Upon each collision, more and more energy is lost from the incident PE's and they will slow down and come to rest. As the energy associated with the PE is greatly reduced, a secondary electron (SE) is created because the Z$_{eff}$ of the HAuCl$_4$ material is considerably larger than PMMA, electrons in the outer orbital shell are available and therefore, the probability of an inelastic scattering event is high. These SE will experience an increased number of scattering events (due to that their associated energy is considerably lower than that of the PE) and these collisions generate even more SE. This is significant, as it can be seen from FIGS. 1(a) and 1(b) that the SE, are scattered at angles larger than 80° in arbitrary trajectories away from the primary beam. These electrons expose the nanocomposite resist doped with secondary electron generator laterally. This is why the SE plays a major role in producing the nano structure. Hence, this will have an affect of producing a faster resist material because to fabricate sub-100 nm structures a lower exposure dose will be required.

Figure 2:
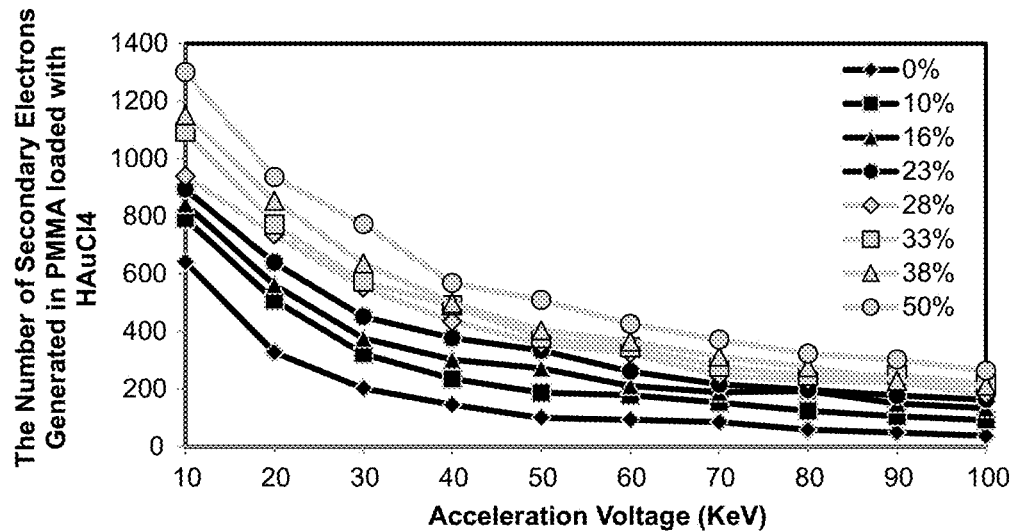
FIG. 2 is a line graph showing how the number of Secondary Electrons generated varies with acceleration voltage for various 100 nm thick PMMA-based resist films having concentrations of 0, 10, 16, 23, 28, 33, 38, and 50 weight percent $HAuCl_4.4H_2O$.

FIG. 2 is a line graph showing the number of Secondary Electrons generated in various 100 nm thick PMMA-based resist films having concentrations of 0, 10, 16, 23, 28, 33, 38, and 50 weight percent HAuCl$_4$. The number of SE generated is given by $$SE_{coefficient} = \frac{\text{total number of } SE \text{ created}}{\text{total number of } PE}. \quad (13)$$

It is evident that as the concentration of the HAuCl$_4$ is increased, the number of SE's that are generated increases. This is because the molecular weight of the HAuCl$_4$ is small (below 500 g/mol) and a larger the concentration of scattering centers (with the properties of a larger average atomic number, density and ionization potential than that of PMMA) can be incorporated into the polymer film. It can be seen that at the lower energies of 10 to 50 KeV, the PE is slow enough to cause multiple inelastic scattering events and generate more and more SE, this is expected from equation 4.

However, at the larger energies of 50 KeV to 100 KeV, the incident electron has more energy associated with it, and therefore, to generate a secondary electron it needs to have more collisions with the atoms in the resist material to lose most of its energy to generate a SE. However, as the film is a 100 nm thick, there are not enough atoms in the film (in the z direction) to scatter off to lose a large proportion of its energy. The consequence of this is that the a substantial number of PE's will come to rest deep into the silicon substrate below or they will be back scattered into the underside of the resist material, approximately 30-40 μm away from the immediate exposure area. Thus, higher resolution can be achieved by exposing the resist with 100 KeV tool by confining the forward scattering electrons to the incident beam inside the resist, but at the expense of larger writing times. Currently, 50 KeV tools are employed by the semiconductor industry. This is because it is seen that the threshold of resolution vs writing times is at this acceleration voltage, and FIG. 2 reflects this philosophy.

Figure 3:
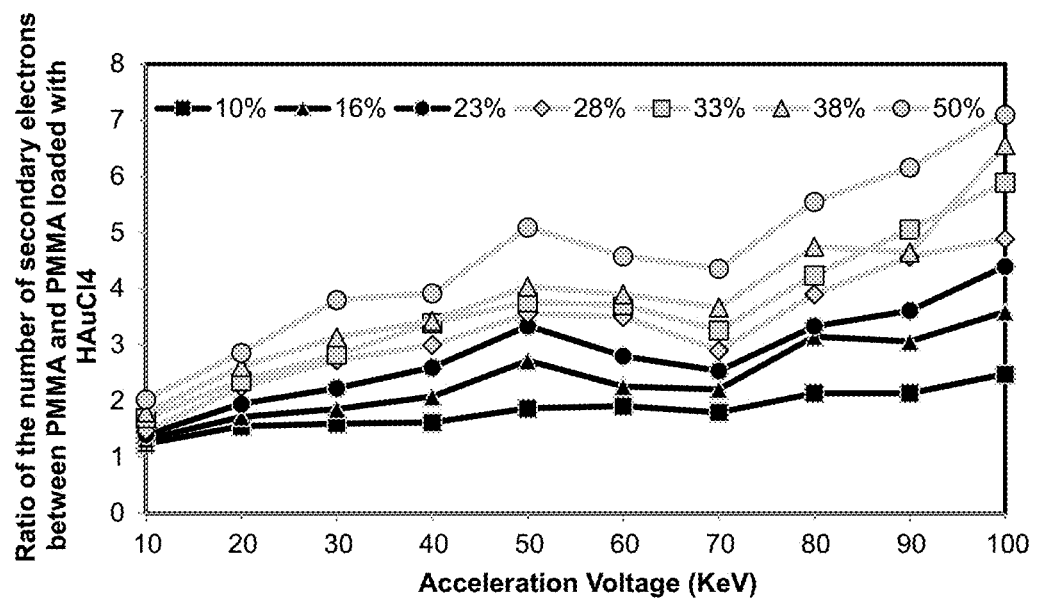
FIG. 3 is a line graph showing how the ratio of Secondary Electrons between $HAuCl_4.4H_2O$-doped resists and pure PMMA resists varies with acceleration voltage for various 100 nm thick PMMA-based resist films having concentrations of 10, 16, 23, 28, 33, 38, and 50 weight percent $HAuCl_4.4H_2O$.

To build on the result and the explanation of FIG. 2, FIG. 3 shows the number of secondary electrons generated in the nanocomposite resist doped with secondary electron generator compared to the amount of secondary electrons generated in purely PMMA film. This was achieved to understand the overall exposure performance when compared to a known standard. Again, it was found that as the concentration of HAuCl$_4$ material increased the sensitivity of the resist material became more sensitive. Thus, reducing the exposure doses required to produce a pattern. This was expected from the results previously given in FIGS. 1 and 2.

However, from the previous figure, it was clearly seen that more SE's were generated at the lower energies than that of the higher energies. But FIG. 3 shows the opposite trend, this was because at the larger energies the interaction between the PE and the PMMA material was greatly was reduced and the amount of collisions with the $HAuCl_4$ material remained relatively constant. Hence, the trend of the characteristic has an increasing gradient.

Figure 4:
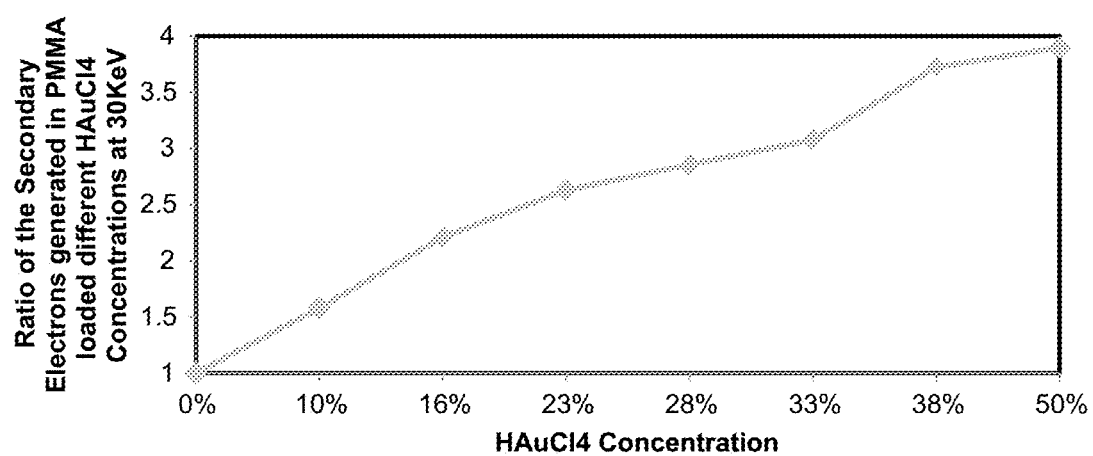
FIG. 4 is a line graph showing how the ratio of Secondary Electrons between $HAuCl_4$-doped resists and pure PMMA resists varies with $HAuCl_4.4H_2O$ concentration for various 100 nm thick PMMA based nanocomposite films with a constant acceleration voltage of 30 KeV, as determined by the Monte Carlo Simulation (suitably as present in this document).

FIG. 4 is a line graph showing how the ratio of Secondary Electrons between $HAuCl_4$-doped resists and pure PMMA resists varies with $HAuCl_4$ concentration 100 nm thick PMMA based nanocomposite films with a constant acceleration voltage (for the incident/primary electrons) of 30 KeV. This particular acceleration voltage was used for the predictive models disclosed herein in order to validate theoretical results and thus justify the credible extrapolations made from the predictive models.

The immediate observation is that as the concentration of $HAuCl_4$ increases, the number of SE's is amplified from 1.5 at 10% concentration to almost 4 at a concentration of 50%. This amplification increases the speed of the write times because they increase the solubility of the polymer upon the development process. Thus, to achieve the maximum resolution by avoiding over exposure, the exposure dose must be decreased to compensate for the extra concentration of electrons in the immediate exposure area. From this, the maximum write speed that can be theoretically achieved is approximately 4 times faster than the PMMA polymer, providing that 50% of $HAuCl_4$ can be incorporated into the polymer film.

Figure 5:
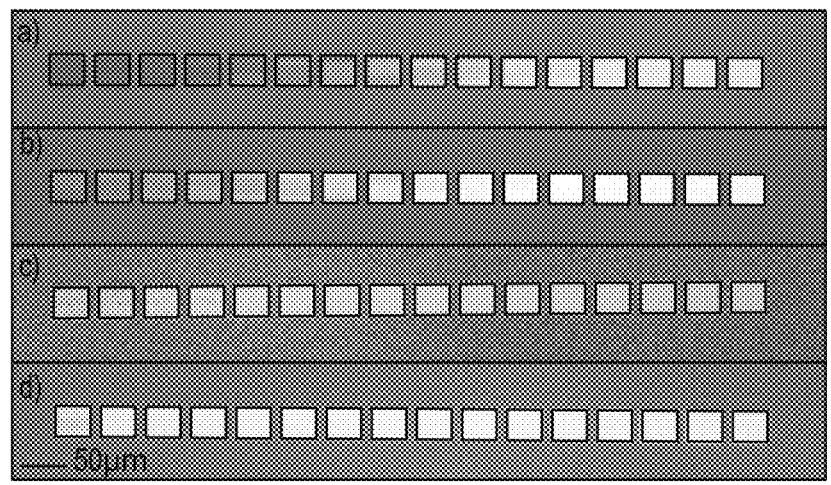
FIG. 5 shows an optical micrograph of developed 40 μm squares directly written into positive tone PMMA based nanocomposite resist with a thickness 100 nm. a) PMMA, b) PMMA loaded with 10% (by weight) $HAuCl_4.4H_2O$, c) PMMA loaded with 16% $HAuCl_4.4H_2O$, d) PMMA loaded with 23% $HAuCl_4.4H_2O$ (Each box is 40 μm$^2$) Exposure of 40 μm boxes using 30 KeV, 50 pA and a line scan time of 1.68 mS. Exposure times 5→20 second with incremental steps of 1 Second. All resist were developed for 30 seconds in MIBK.
Figure 5A:
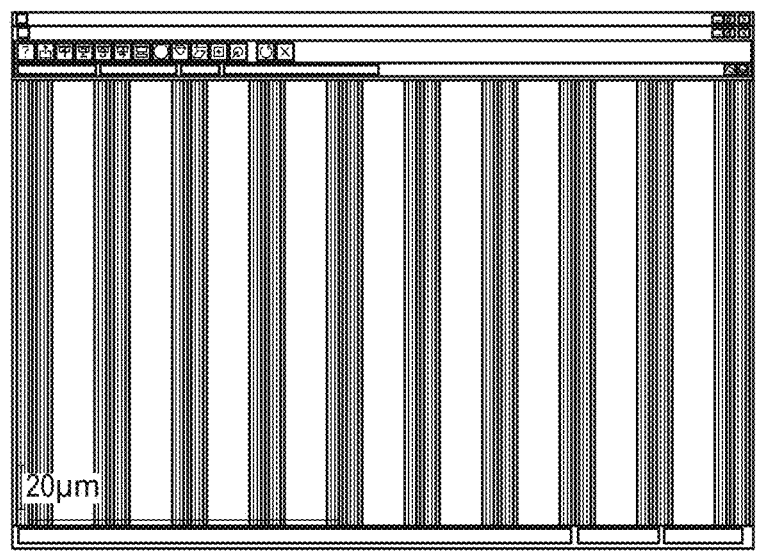
FIG. 5A shows the pre-designed exposure pattern (produced in Elphy Quantum. Software) used to test certain exposure clearance doses.

FIG. 5 shows an optical micrograph of developed 40 µm squares directly written into positive tone PMMA based nanocomposite resist. This had a typical grey scale profile with a varied electron beam exposure dose as explained on page 56. FIG. 5(a) depicts the PMMA without $HAuCl_4$ embedded within it, whereas FIG. 5(b), (c), and (d) had 3 mg, 6 mg and 9 mg of $HAuCl_4$ embedded within it respectively. The conditions of the fabrication are given in the caption. Exposure of 40 µm boxes using 30 KeV, 50 pA and a line scan time of 1.68 mS. Exposure times 5→20 Second with incremental steps of 1 Second. All resist were developed for 30 Seconds in MIBK.

Comparing the PMMA without any $HAuCl_4$ with that of PMMA loaded with 9 mg $HAuCl_4$, it was evident that the loaded PMMA needed an exposure dose lower than the PMMA. Where the time required to produce the patterns in all of the samples was 18, 14, 10 and 7 seconds in the PMMA, PMMA loaded with 3, 6 and 9 mg of $HAuCl_4$ respectively. However, FIG. 7a, b, c and d shows that the patterns appear to have cleared the resist at exposure times of 17, 13, 9 and 6. Thus, the thickness of the resist that remains is so thin that it beyond the resolution of the optical microscope objective lens, which was 10×. This remaining resist residue was detected using the SEM.

The clearing dose in all of the nanocomposite resists had decreased due to the introduction of the $HAuCl_4$, thus becoming more sensitive than the PMMA. This was because the $HAuCl_4$ have a larger electron energy stopping power and therefore reduces the energy of the electron (217 eV per collision). As the energy reduction of the primary electron passes the threshold of which a secondary electron is created and will scatter at angle of larger than 80°. As they collide with the polymer and $HAuCl_4$ atoms, their energy will be reduced. Hence, more secondary electrons will be generated and this will create an avalanche effect. As a result of the scattering angle the secondary electron penetrates through the PMMA polymer it exposes it laterally. This has the affect of reducing the exposure time required to fabricate the pattern as more and more $HAuCl_4$ is added into the nanocomposite resist.

Figure 6:
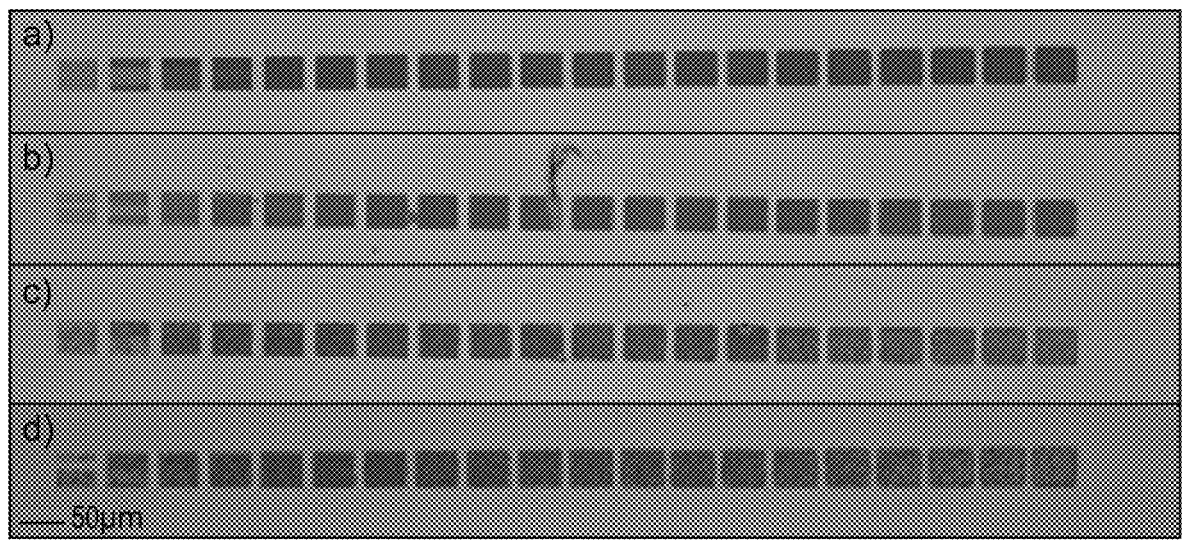
FIG. 6 shows an optical micrograph of developed 40 μm squares directly written into negative tone PMMA based nanocomposite resist with a thickness 100 nm. a) PMMA, b) PMMA loaded with 10% (by weight) $HAuCl_4.4H_2O$, c) PMMA loaded with 16% $HAuCl_4.4H_2O$, d) PMMA loaded with 23% $HAuCl_4.4H_2O$ (Each box is 40 μm$^2$). Exposure of 40 μm boxes using 30 KeV, 50 pA and a line scan time of 1.68 mS. Exposure times 1→20 second with incremental steps of 1 second. All resist were developed for 30 seconds in MIBK.

FIG. 6 shows an optical micrograph of developed 40 µm squares directly written into negative tone PMMA based nanocomposite resist. Again, FIG. 6(a) depicts the PMMA without $HAuCl_4$ embedded within it, whereas FIG. 8(b), (c), and (d) had 3 mg, 6 mg and 9 mg of $HAuCl_4$ embedded within it respectively. The conditions of the fabrication are given in the caption. Exposure of 40 µm boxes using 30 KeV, 50 pA and a line scan time of 1.68 mS. Exposure times 1→20 Second with incremental steps of 1 Second. All resist were developed for 30 Seconds in MIBK.

Just as the positive tone nanocomposite resist, it was found that the PMMA loaded with 9 mg $HauCl_4$ required a lower exposure dose than the standard PMMA without any $HAuCl_4$. The time required to produce the patterns in all of the samples was 6, 5, 4 and 3 seconds in the PMMA, PMMA loaded with 3, 6 and 9 mg of $HAuCl_4$ respectively. It was expected that the negative tone resists would require a lower exposure doses than the positive tone resists because the negative tone resist has approximately 25% cross linker (which was Pentaerythritol tetraacrylate) in it and these produce free radicals. From this, even more secondary electrons are created in the immediately exposure area. Hence producing a faster writing material.

Figure 7:
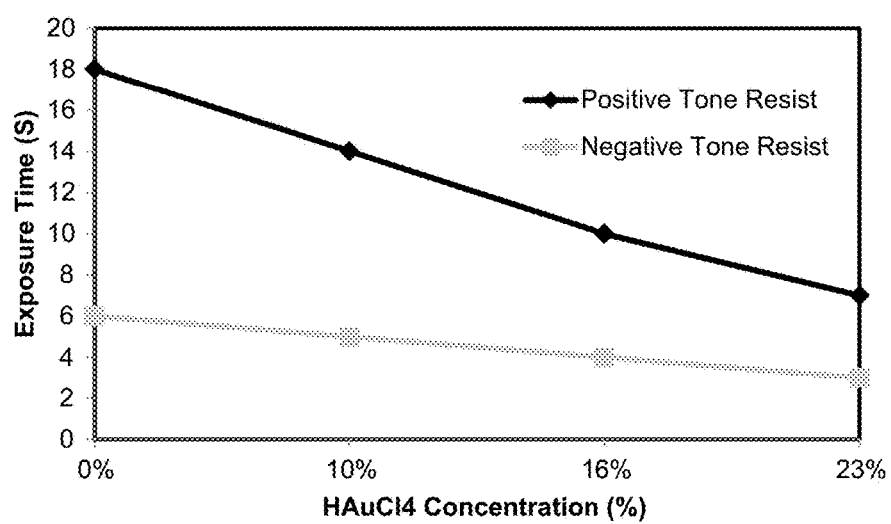
FIG. 7 is a line graph showing how exposure time vary with $HAuCl_4.4H_2O$ concentration in each PMMA-base nanocomposite material.

FIG. 7 shows the time taken for the exposure to produce the pattern of 40 µm box in each material, this was determined from FIGS. 5 and 6. It is evident that as the concentration of $HAuCl_4$ was increased, the exposure time decreased. The relationship appears to be linear, which is in agreement with FIG. 4.

Figure 10:
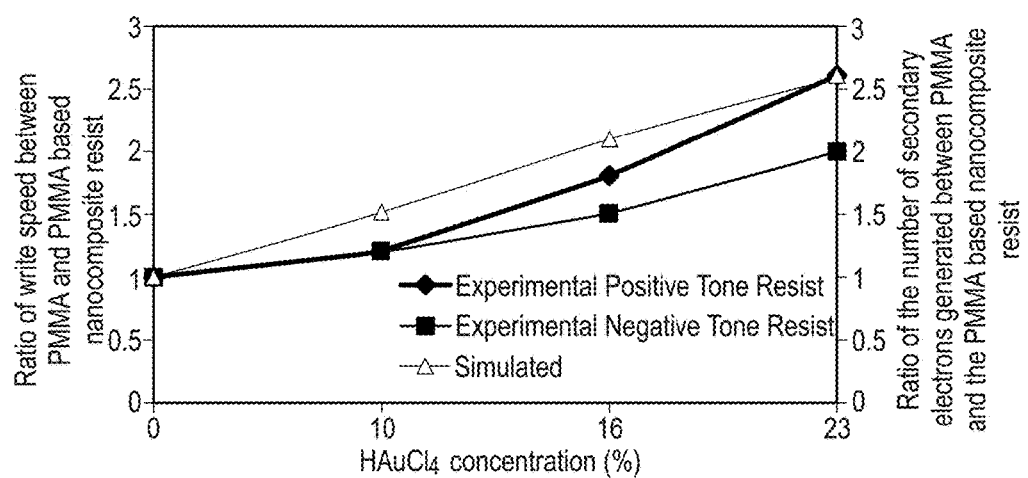
FIG. 10 is a line graph showing how the ratio of write speed between $HAuCl_4 \cdot 4H_2O$-doped resists and pure PMMA resists varies with $HAuCl_4 \cdot 4H_2O$ concentration for various 100 nm thick PMMA-based resist films, with experimental positive tone resists (diamonds), experimental negative tone resists (squares), and with the simulated results of the Monte Carlo model (triangles).

It was found that the gradient of the positive and negative tone resist are different. This was due that the negative tone resist has approximately 25% cross linker in it. Unfortunately the Monte Carlo simulation does not model the process of free radicals and their interaction with the creation of SE. However, the effect of the $HAuCl_4$ can be clearly seen. Using the standard PMMA (without $HAuCl_4$ in it) as the reference. It was found that when 3, 6 and 9 mg $HAuCl_4$ was added to the PMMA material, the exposure time was decreased by a factor of 1.2, 1.8 and 2.6 for the positive tone resist and for the negative tone resist the writing speed was faster by a factor of 1.2, 1.5 and 2 and this is shown in FIG. 10.

Figure 8:
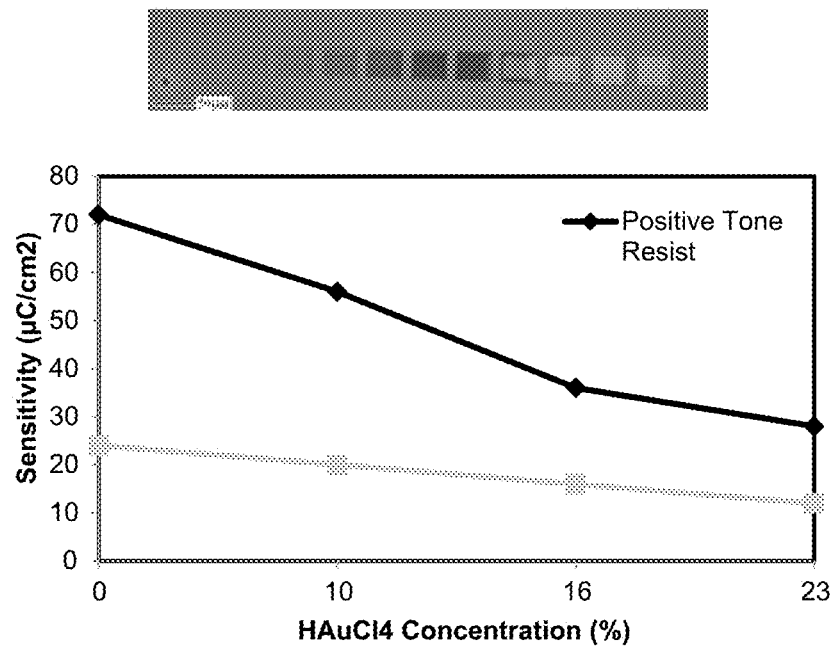
FIG. 8 is a line graph showing how exposure clearing doses vary with $HAuCl_4.4H_2O$ concentration in each PMMA-base nanocomposite material. Inset: PMMA with a thickness 100 nm. Exposure of 40 μm boxes using 30 KeV, 50 pA and a line scan time of 1.68 mS. Exposure times 10→60 second with incremental steps of 5 second.

To calculate the exposure dose from the results shown in FIG. 7, it must achieved using a known sample of standard PMMA as the reference. The inset of FIG. 8 shows a standard PMMA film. This pattern was developed using the standard developer of IPA:MIBK with the ratio of 3:1. The sample was developed for 30 Seconds, which was followed by a 15 second IPA rinse and then it was blow dried using Nitrogen.

Figure 9:
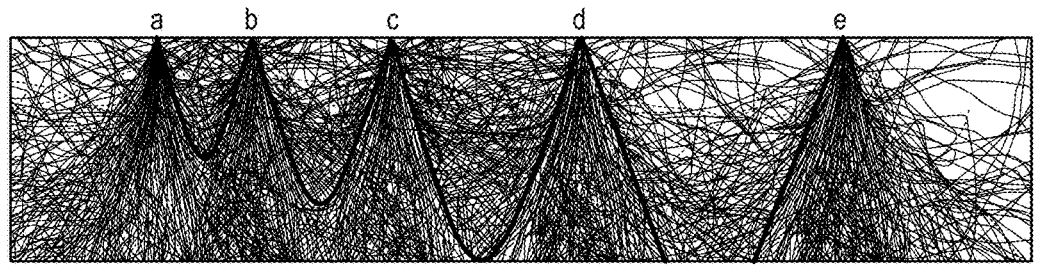
FIG. 9 shows a schematic representation of the step size parameter to demonstrate its impact to the proximity effect.

It can be seen that the pattern was produced by an exposure time of 50 Seconds. From this, it was calculated that the total exposure dose required to produce the pattern was 200 µC/cm². This was based on that each line scan length was 40 µm and the step size between each exposure spot was 8.5 nm. Therefore, 4705 exposure spots exist in that line scan. By dividing the time taken to perform an entire line scan by the total number of points gives the dwell time per exposure spot, which was 357 nS. From this, the base dose can be calculated using the following equation:

$$\text{Area Dose} = \frac{I * t}{S^2}, \tag{14}$$

Where I is the current of the incident beam, t is the dwell time, which is the time taken for the electrons to penetrate the resist and S is the step size. This is the parameter that governs the position that the beam moves from one position to its next position. FIG. 9 shows a schematic representation of the step size parameter to demonstrate its impact to the proximity effect. As the electron beam is rastered over the surface of the resist to position A, the electrons penetrate the resist and it can be seen that the foot print is larger at the bottom of the resist than at the top, therefore, if the electron beam is placed too close to the previous position (as indicated by position b) that was already exposed, then the new exposure will intersect (illustrated by the red line) with the last exposure and this contributes to the proximity effect. Thus has been over exposed. This will have direct effect on the definition of the pattern. However, if the electron beam is placed too far away from the previous exposure as shown by position d and e in FIG. 9. The result of the pattern will become under exposed. Therefore, the step size must be balanced as seen by c and d. Here both exposures are placed by enough distance part from each other, so that they intersect at the bottom of the resist and this is illustrated by the red line.

Over exposure may also result if the current (I) is too large as more SE can be generated as they scatter from the atoms at an angle of 80°. As the resist profile has an under cut. If the current density is reduced then this may result in under exposure, where the electrons have not completely penetrated through the resist.

Of course, in reality this is dependent upon thickness. The current and step size can be reduced, if the thickness was decreased then the scattering events inside the resist would also be decreased. This reduces the proximity effect because the number of electrons (current density) must be enough to overcome the stopping power of the atoms in the resist. These parameters values will change depending on the incident energy associated to the electrons. This is due to as an electron collides with the atoms in the resist molecule, they will scatter in arbitrary directions. As this occurs, a fraction of this energy associated to that electron will be lost. This process will be repeated more frequently from this point onward until all its energy has been lost. If the resist thickness is large and associated energy is small (e.g. 10 KeV) the then more collisions will happen and the electrons will scatter in directions and generate SE which will damage the resist in a lateral direction as well as a vertical direction, thus, contributing to the proximity effect.

For all experiments, the current used was 50 pA and the dwell time was 357 nS and the step size was 8.5 nm. In order to obtain the required dose, simply divide the total time taken to expose the material in this case it was 50 Seconds (as it is already known) by the based dose to achieve a dose of 202 $\mu C/cm^2$.

As all materials in FIGS. 5 and 6 were developed with MIBK ONLY, the exposure time was dramatically reduced due to the fact that MIBK is more aggressive than the diluted standard developer mixture. Hence, it increases the solubility of the polymer. Therefore the required dose was determined by applying the known standard that was calculated above. From FIG. 7, it was found that by dividing the exposure time of the standard PMMA (which was 50 Seconds) with the exposure time of each nanocomposite materials for the positive tone, which were 14, 10 and 7 respectively. This resulted with a ratio of 2.7, 3.57, 5 and 7.2 respectively. As the dose required the expose the standard resist was 200 $\mu C/cm^2$, therefore, this can be divided by the ratio obtained to achieve the required exposure dose in each material. As seen in FIG. 8, after the resist was developed, the exposure clearing doses of the positive tone PMMA loaded with 0 mg, 3 mg, 6 mg and 9 mg of $HAuCl_4$ this gave clearance doses of 72 $\mu C/cm^2$, 56 $\mu C/cm^2$, 36 $\mu C/cm^2$ and 28 $\mu C/cm^2$ respectively. Whereas, the negative tone resist materials produced clearing doses of 24 $\mu C/cm^2$, 20 $\mu C/cm^2$, 16 $\mu C/cm^2$ and 12 $\mu C/cm^2$ respectively. These sensitivities that are demonstrated here, are well within the next generation resist technology specification of 60 $\mu C/cm^2$.[7, 8]

FIG. 10 is a line graph showing how the ratio of write speed between $HAuCl_4$-doped resists and pure PMMA resists varies with $HAuCl_4$ concentration for various 100 nm thick PMMA-based resist films, with experimental positive tone resists (diamonds), experimental negative tone resists (squares), and with the simulated results of the Monte Carlo model (triangles).

FIG. 10 shows that when the experimental results of FIG. 7 were super imposed on to the result generated by the Monte Carlo simulation that was shown in FIG. 4, good agreement is found. Indeed, the overall exposure time can be reduced by systematically generating secondary electrons, which are produced by the heavy additive.

Conclusions 1—Resists of Examples 1, 2, 3, 4, 5, and 6

A metal organic positive and negative tone electron beam resist have been investigated. Introducing the chloroauric acid to the PMMA film improved the exposure sensitivity of the material. Where it was found that the positive tone PMMA based nanocomposite resists exhibited clearing doses of 56, 36 and 28 $\mu C/cm^2$ for when 3 mg, 6 mg and 9 mg of $HAuCl_4$ were introduced into the PMMA polymer matrix respectively. This increased writing speed of each nanocomposite material by a factor of 1.2, 1.8 and 2.6 when compared to the standard PMMA resist. When the pentaerythritol tetraacrylate was introduced to the nanocomposite resist, it created a negative tone resist. Experimental results showed that by introducing pentaerythritol tetraacrylate to the nanocomposite resist material, further increased the sensitivity of producing clearing doses of 20, 16 and 12 $\mu C/cm^2$ for when 3 mg, 6 mg and 9 mg of $HAuCl_4$ were introduced into the PMMA polymer matrix respectively.

It was shown by the Monte Carlo simulations that by introducing $HAuCl_4$ compound with the PMMA material generated a significant amount of secondary electrons within the resist. These were responsible for 'exposing' the resist. This demonstrated strong agreement between the simulation and the experimental results.

From these observations, one can credibly conclude that the most suitable secondary electron generators will have a larger average/effective atomic number and density than that of the resist polymer itself. If the average atomic number is large then the ionization potential value will be large, which is desirable because as the PE travels through the resist, on each collision it will lose a proportion of its energy at a faster rate than if the energy loss was small. Thus, more SE will be generated and they will be created near the surface of the resist. Thus, producing a uniform exposure. As such, this general principle can be extrapolated as set forth herein.

Another observation is that the average molecular weight of the secondary electron generator is advantageously quite low (preferably less than 500 g/mol) so that the maximum concentration of the additive is at its largest to produce scattering centres in order for the incident electrons to scatter from and in turn create secondary electrons.

Results & Discussion 1A—Resists of Examples 1A, 3A, 4A, 5A, and 6A

Figure 2A:
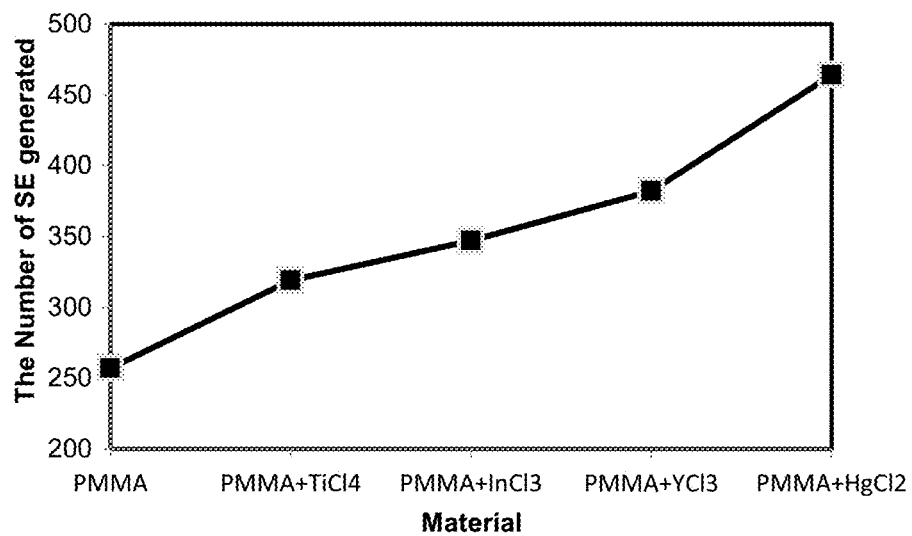
FIG. 2A is a line graph showing the number of secondary electrons generated in the standard PMMA resist films and PMMA-based nanocomposite resist films containing $TiCl_4$, $InCl_3$, $YCl_3$, and $HgCl_2$, where the resist films are in each case 100 nm thick.

From the Monte Carlo model, FIG. 2A is a line graph showing the number of secondary electrons generated in the standard PMMA resist films and PMMA-based nanocomposite resist films containing $TiCl_4$, $InCl_3$, $YCl_3$, and $HgCl_2$.

This was achieved to understand the overall exposure performance when compared to a known standard. It was found that the $HgCl_2$ material increased the sensitivity of the resist material. Thus, reducing the exposure doses required to produce a pattern.

The immediate observation is that as the effective atomic number and the density of metal compound increases, the number of SE's is amplified from 1.24 ($TiCl_4$) to 1.81 ($HgCl_2$). This amplification increases the speed of the write times because they increase the solubility of the polymer upon the development process. Thus, to achieve the maximum resolution by avoiding over exposure, the exposure dose must be decreased to compensate for the extra concentration of electrons in the immediate exposure area.

Figure 3A:
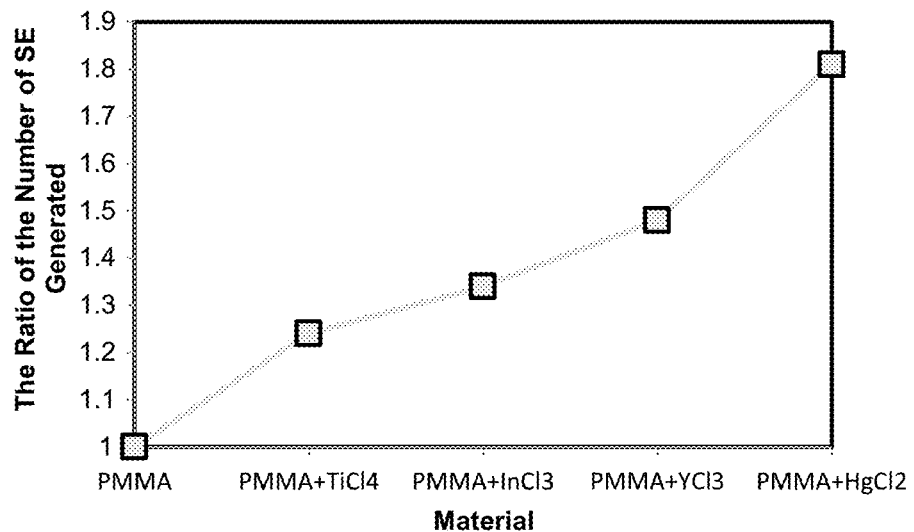
FIG. 3A is a line graph showing how the ratio of Secondary Electrons at 30 KeV between 100 nm-thick PMMA-based nanocomposite resist films containing $TiCl_4$, $InCl_3$, $YCl_3$, and $HgCl_2$, and pure PMMA resist films.

FIG. 3A is a line graph showing how the ratio of Secondary Electrons at 30 KeV between 100 nm-thick PMMA-based nanocomposite resist films containing $TiCl_4$, $InCl_3$, $YCl_3$, and $HgCl_2$, and pure PMMA resist films.

Figure 5B:
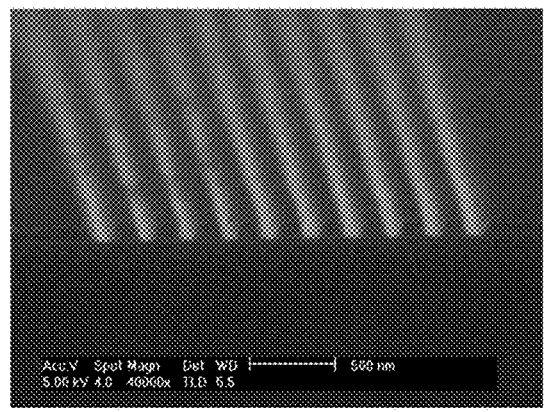
FIG. 5B shows an SEM micrograph of developed 50 nm lines (trenches) on a pitch of 250 nm directly written into 100 nm-thick positive tone PMMA and PMMA based nanocomposite resists a) Standard PMMA optimum dose is 724 μC/cm2; b) PMMA96K loaded with 25% TiCl4, the optimum dose is 644 μC/cm2; c) PMMA96K loaded with 25% InCl3, the optimum dose is 562 μC/cm2; d) PMMA96K loaded with 25% YCl3, the optimum dose is 484 μC/cm2; and e) PMMA96K loaded with 25% HgCl3, the optimum dose is 382 μC/cm2. All samples were developed with MIBK:IPA with the ratio of 1:3. This had a typical grey scale profile with a varied electron beam exposure dose as explained. All resist materials were developed with MIBK and IPA with the ratio of 1:3.
Figure 5B:
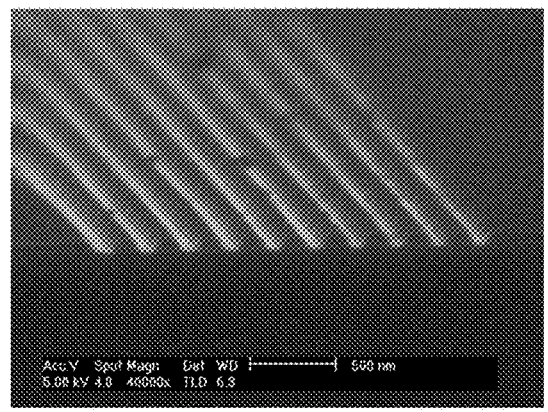
Figure 5B:
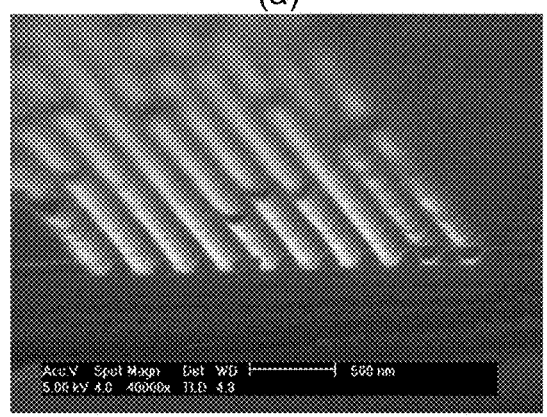
Figure 5B:
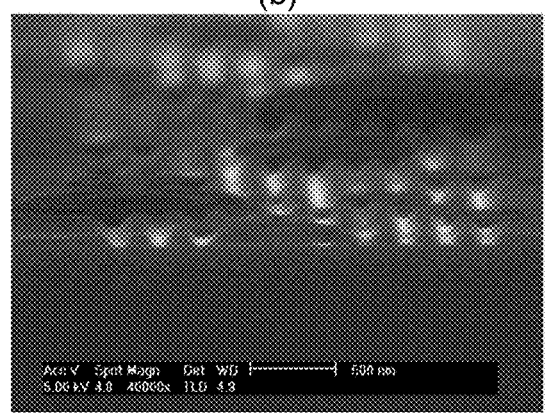
Figure 5B:
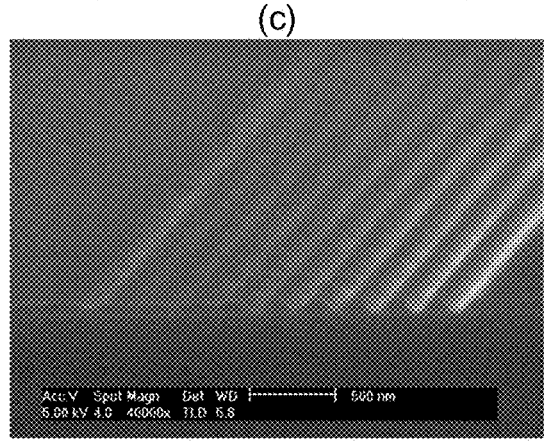

FIG. 5B shows an SEM micrograph of developed 50 nm lines (trenches) on a pitch of 250 nm directly written into 100 nm-thick positive tone PMMA and PMMA based nanocomposite resists a) Standard PMMA optimum dose is 724 μC/cm2; b) PMMA96K loaded with 25% TiCl4, the optimum dose is 644 μC/cm2; c) PMMA96K loaded with 25% InCl3, the optimum dose is 562 μC/cm2; d) PMMA96K loaded with 25% YCl3, the optimum dose is 484 μC/cm2; and e) PMMA96K loaded with 25% HgCl2, the optimum dose is 382 μC/cm2. All samples were developed with MIBK:IPA with the ratio of 1:3. This had a typical grey scale profile with a varied electron beam exposure dose as explained. All resist materials were developed with MIBK and IPA with the ratio of 1:3.

Figure 8A:
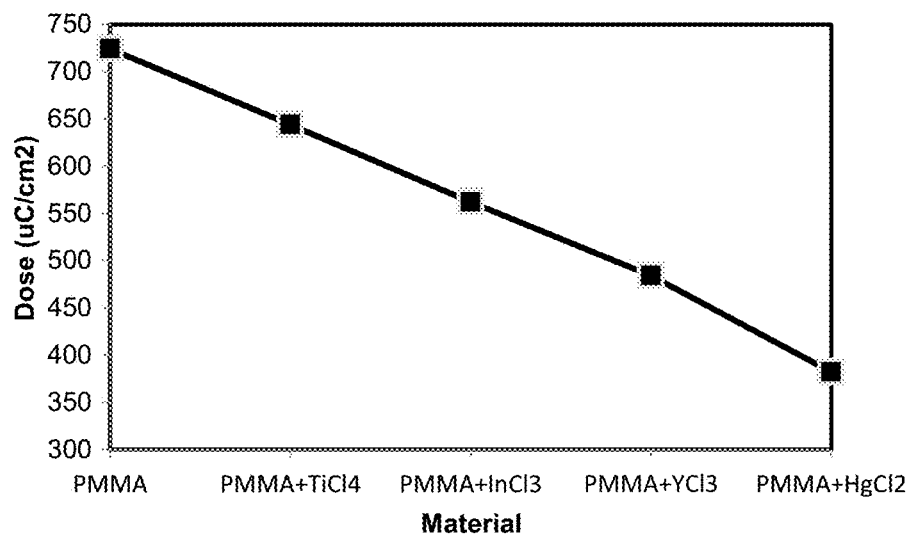
FIG. 8A is a line graph showing how exposure clearing doses at 30 KeV vary with the PMMA based nanocomposite resists, namely: PMMA without any metal compounds and PMMA loaded with 25% of $TiCl_4$, $InCl_3$, $YCl_3$ and $HgCl_2$.

FIG. 8A is a line graph showing how exposure clearing doses at 30 KeV vary with the PMMA based nanocomposite resists, namely: PMMA without any metal compounds and PMMA loaded with 25% of $TiCl_4$, $InCl_3$, $YCl_3$ and $HgCl_2$.

Comparing the PMMA without any metal compounds and PMMA loaded with 25% of $TiCl_4$, $InCl_3$, $YCl_3$ and $HgCl_2$, it was evident that the loaded PMMA required an exposure dose lower than the standard PMMA. The exposure dose that was required to produce the patterns in the samples was determined to be 724, 644, 562, 484 and 382 $\mu C/cm^2$ respectively. This linear relationship is shown in FIG. 8A.

The clearing dose in the nanocomposite resists had decreased due to the introduction of the $HgCl_2$, thus becoming more sensitive than the PMMA. This was because the $HgCl_2$ have a larger electron energy stopping power and therefore reduces the energy of the electron (623.12 eV per collision). As the energy reduction of the primary electron passes the threshold of which a secondary electron is created and will scatter at angle of larger than 80°. As they collide with the polymer and $HgCl_2$ atoms, their energy will be reduced. Hence, more secondary electrons will be generated and this will create an avalanche effect. As a result of the scattering angle the secondary electron penetrates through the PMMA polymer it exposes it laterally. This has the effect of reducing the exposure time required to fabricate the pattern as more and more $HgCl_2$ is added into the nanocomposite resist.

Figure 8B:
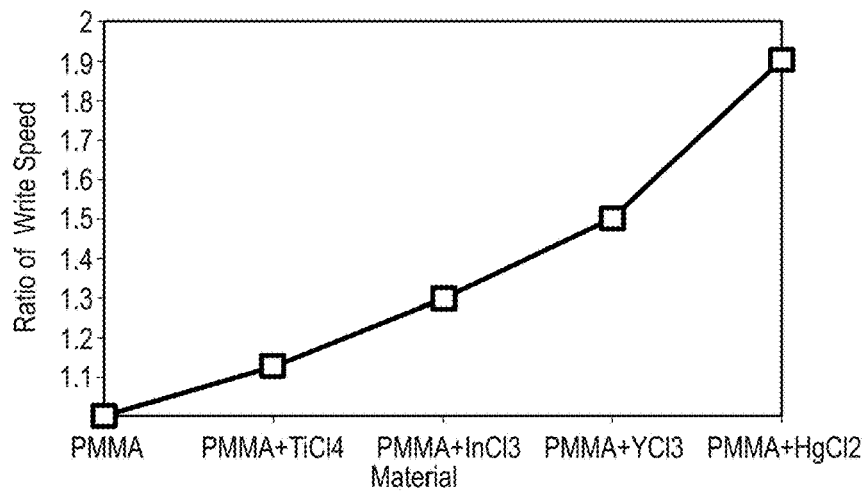
FIG. 8B is a line graph showing the number of secondary electrons generated in the PMMA based nanocomposite resist films compared to the amount of secondary electrons generated in PMMA film (i.e. as a ratio generated from FIG. 8A), based on the respective electron exposure clearing doses in a 100 nm thick films at 30 KeV.

FIG. 8B is a line graph showing the number of secondary electrons generated in the PMMA based nanocomposite resist films compared to the amount of secondary electrons generated in PMMA film (i.e. as a ratio generated from FIG. 8A), based on the respective electron exposure clearing doses in a 100 nm thick films at 30 KeV. It can be determined that as the atomic number of the metal organic compound increases along with its density, the number of secondary electrons that are available to be emitted from the outer shell is increased. Therefore, this increases the speed of the write times by a factor of 1.9. Thus, the exposure dose must be decreased to compensate for the extra concentration of electrons in the immediate exposure area.

From the exposure doses presented in FIG. 8A, it was possible the calculate the number of electrons that were incident on each of the PMMA 96K and PMMA (96K) loaded with 25% of $TiCl_4$, $InCl_3$, $YCl_3$ and $HgCl_2$, these were 1688, 1594, 1313, 1125 and 891 respectively. Consequently, the resist systems can be modelled to produce the nanostructures that were produced in FIG. 5B(a-e).

Figure 9A:
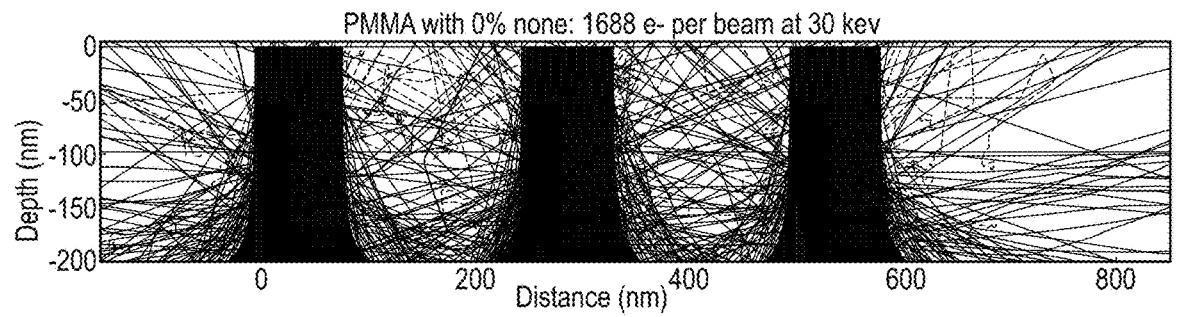
FIG. 9A-9E shows scattering trajectory plots of the PMMA nanocomposite resist. 9A) Standard $PMMA_{96K}$ optimum dose is 724 $\mu C/cm^2$, 9B) $PMMA_{96K}$ loaded with 25% $TiCl_4$, the optimum dose is 644 $\mu C/cm^2$, 9C) $PMMA_{96K}$ loaded with 25% $InCl_3$, the optimum dose is 562 $\mu C/cm^2$, 9D) $PMMA_{96K}$ loaded with 25% $YCl_3$, the optimum dose is 484 $\mu C/cm^2$, 9E) $PMMA_{96K}$ loaded with 25% $HgCl_3$, the optimum dose is 382 $\mu C/cm^2$.
Figure 9B:
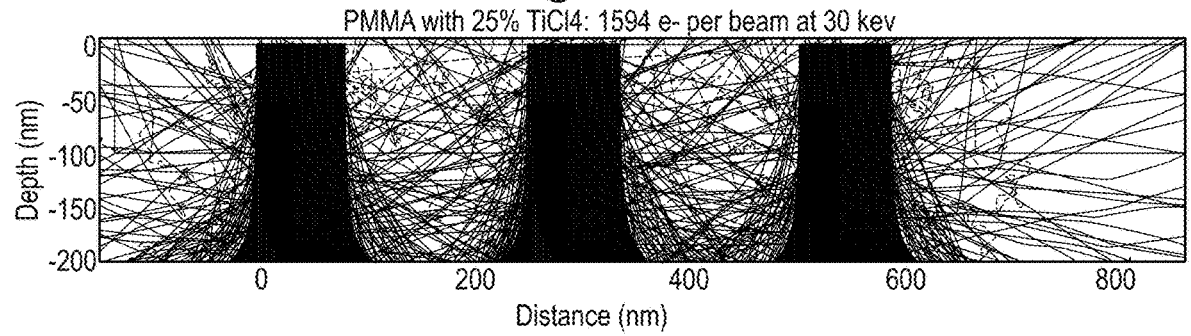
Figure 9C:
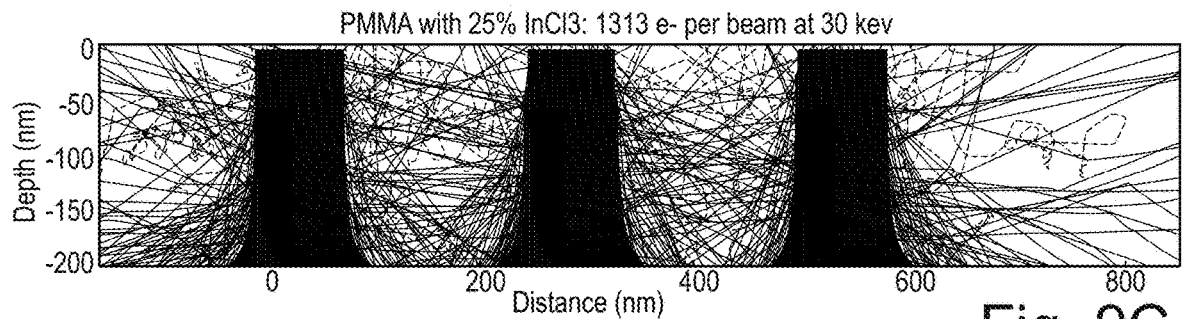
Figure 9D:
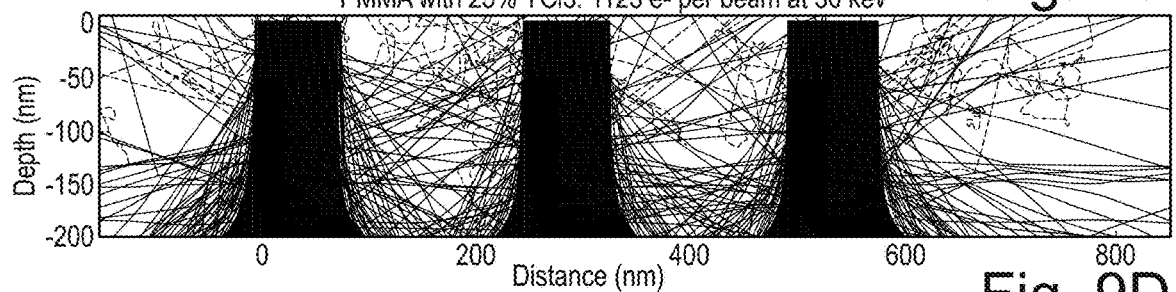
Figure 9E:
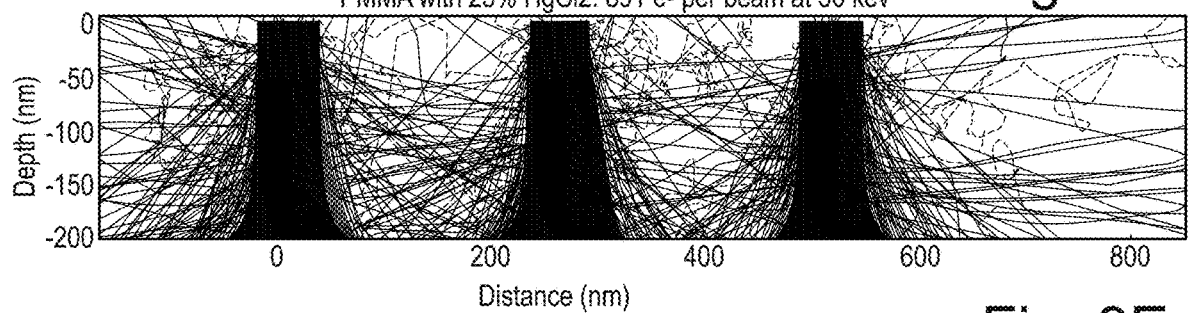

FIG. 9A shows scattering trajectory plots of the PMMA nanocomposite resist. a) Standard $PMMA_{96K}$ optimum dose is 724 μC/cm², b) $PMMA_{96K}$ loaded with 25% $TiCl_4$, the optimum dose is 644 μC/cm², c) $PMMA_{96K}$ loaded with 25% $InCl_3$, the optimum dose is 562 μC/cm², d) $PMMA_{96K}$ loaded with 25% $YCl_3$, the optimum dose is 484 μC/cm², e) $PMMA_{96K}$ loaded with 25% $HgCl_3$, the optimum dose is 382 μC/cm².

FIG. 9A(a-e) shows scattering trajectory cross sections of the resist systems and PMMA and PMMA loaded with 25% of $TiCl_4$, $InCl_3$, $YCl_3$ and $HgCl_2$. Using the exposure parameters that produced FIG. 5B(a-e), the step size between each exposure is 6.1 nm and the current and dwell time is 25 pA and 3 μS respectively.

Figure 11:
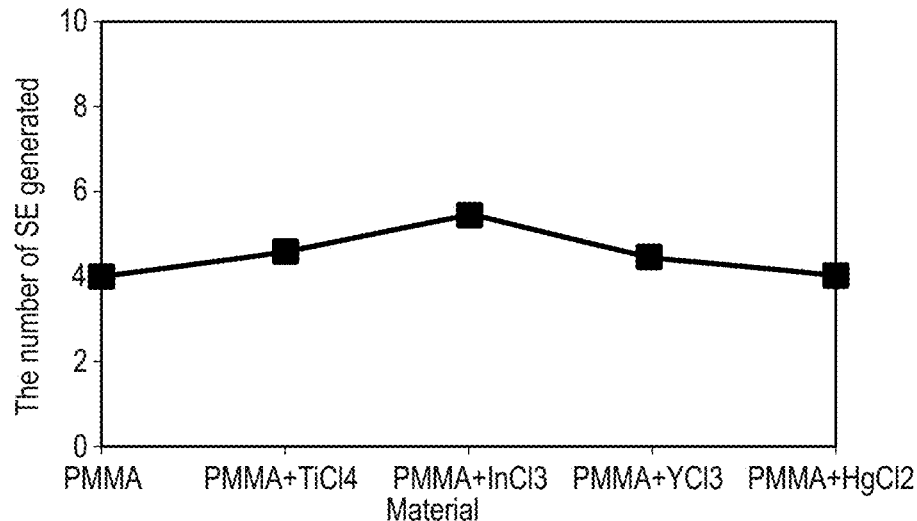
FIG. 11 is a line graph showing the number of secondary electrons generated in the PMMA based nanocomposite resist films compared to the amount of secondary electrons generated in PMMA film, based on the respective optimum electron exposure doses in a 100 nm thick films at 30 KeV.

It can be seen in FIG. 9A(a-e) that by reducing the number of incident electrons and keeping the concentration of the metal organic compounds the same in all resist systems proves that the number of SE generated was increased substantially (by each metal compound) to produce the same nanostructure in the standard PMMA material and this can be seen in FIG. 11. This observation leads to a reduction in exposure dose which results with a decrease in the overall direct write times and confirms the role of secondary electrons.

FIG. 11 is a line graph showing the number of secondary electrons generated in the PMMA based nanocomposite resist films compared to the amount of secondary electrons generated in PMMA film, based on the respective optimum electron exposure doses defined in FIG. 9A in a 100 nm thick films.

Figure 12:
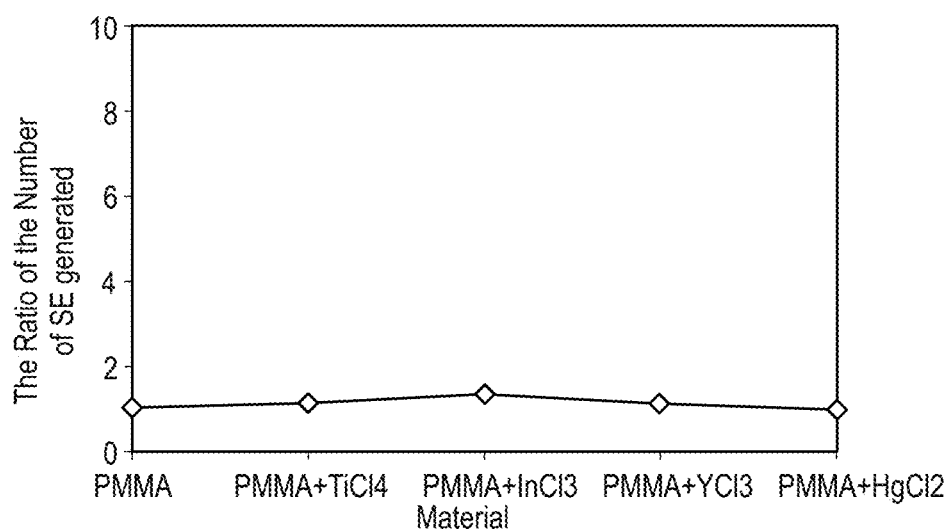
FIG. 12 is a line graph showing the ratio between the number of secondary electrons generated within the 100 nm-thick PMMA-based nanocomposite resist films (as defined in FIG. 9A) and a pure 100 nm-thick PMMA resist film, all at the optimum exposure doses detailed of FIG. 9A.

FIG. 12 is a line graph showing the ratio between the number of secondary electrons generated within the 100 nm-thick PMMA-based nanocomposite resist films (as defined in FIG. 9A) and a pure 100 nm-thick PMMA resist film, all at the optimum exposure doses detailed of FIG. 9A.

As a comparison, it is clear that FIG. 12 shows that the number of SE that are generated inside the PMMA based nanocomposite resist films is the same as the standard PMMA films when the exposure dose is compensated to produce the nanostructure with the same dimensions.

Figure 13:
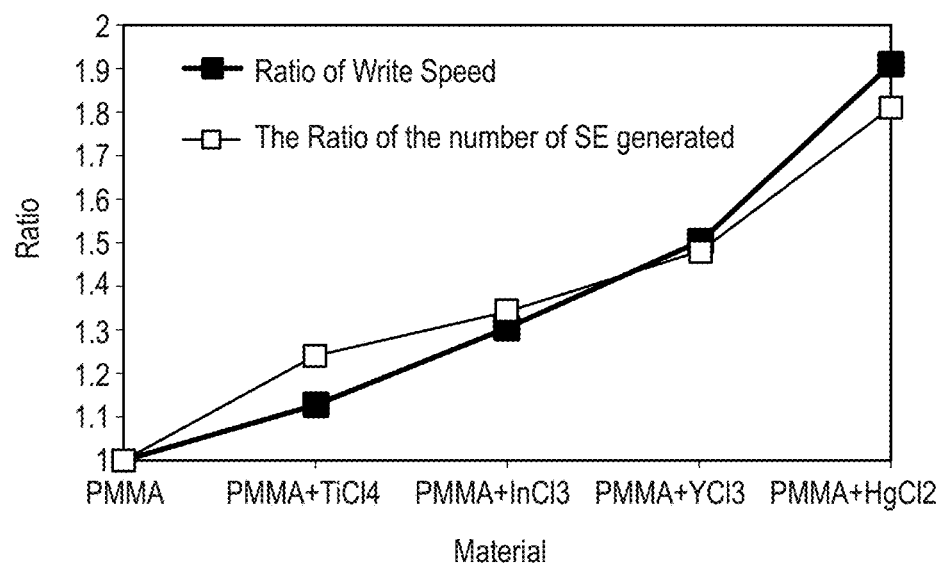
FIG. 13 is a line graph showing two different superimposed ratios between the 100 nm-thick PMMA-based nanocomposite resist films (as defined in FIG. 9A) and a pure 100 nm-thick PMMA resist film; the first ratio (grey/hollow squares) is the ratio of secondary electrons generated as per the FIG. 3A model studies; the second ratio (black solid squares) is a ratio of write speeds at 30 kV, as per the experimentally-generated results of FIG. 8B; where each of the ratios relates to 100 nm-thick films at the optimum exposure doses as per FIG. 9A.

FIG. 13 is a line graph showing two different superimposed ratios between the 100 nm-thick PMMA-based nanocomposite resist films (as defined in FIG. 9A) and a pure 100 nm-thick PMMA resist film; the first ratio (grey/hollow squares) is the ratio of secondary electrons generated as per the FIG. 3A model studies; the second ratio (black solid squares) is a ratio of write speeds at 30 kV, as per the experimentally-generated results of FIG. 8B; where each of the ratios relates to 100 nm-thick films at the optimum exposure doses as per FIG. 9A.

Comparing the write speed of each nanocomposite material with the simulated results of the Monte Carlo model, FIG. 13 shows that when the experimental results of FIG. 5B were super imposed on to the result generated by the Monte Carlo simulation that was shown in FIG. 3A, good agreement is found. Indeed, the overall exposure time can be reduced by systematically generating secondary electrons, which are produced by the heavy additive. This performance is approximately 2 times faster.

Conclusions 1A—Resists of Examples 1A, 3A, 4A, 5A, and 6A

A metal organic positive tone electron beam resist have been investigated. Introducing the Mercuric Chloride to the PMMA film improved the exposure sensitivity of the material. Where it was found that the positive tone PMMA based nanocomposite resists exhibited clearing doses of 724 and 382 µC/cm² for when 12.5 mg of $HgCl_2$ was introduced into the PMMA polymer matrix respectively.

It was found that by adding metal compounds with an increased effective atomic number and density the write speed of the material was increased. This increased the writing speed of each nanocomposite material by a factor of 1.125 ($TiCl_4$), 1.3 ($InCl_3$), 1.5 ($YCl_3$) and 1.9 ($HgCl_2$) when compared to the respective standard PMMA resist. It was shown by the Monte Carlo simulations that by introducing metal organic compounds with the PMMA material generated a significant amount of secondary electrons within the resist. These were responsible for 'exposing' the resist. This demonstrated strong agreement between the simulation and the experimental results and thereby validates the broad applicability of the present invention.

REFERENCES

[1] D. C. Joy, 'Monte Carlo Modeling for Electron Microscopy and Microanalysis', pp. 33, Oxford University Press, (1995).
[2] en.wikipedia.org/wiki/Poly(methyl_methacrylate), accessed (March 2004).
[3] en.wikipedia.org/wiki/Chloroauric_acid, accessed (September 2012).
[4] en.wikipedia.org/wiki/Silicon, accessed (March 2004).
[5] S. Lewis, L. Piccirillo, 'Influence of nanocomposite materials for next generation nanolithography', Advances in diverse industrial applications of nanocomposite', Intech, pp 503-528, March 2011, ISBN: 978-953-307-202-9.
[6] S. Lewis, D. Jeanmaire, V. Haynes, L. Piccirillo, 'Characterization of an ultra high aspect ratio electron beam resist for nanolithography', Nanotechnology 2010: Electronics, Devices, Fabrication, MEMS, Fludics & Computational, Vol 2, pp 195-198, ISBN: 978-1-4398-3402-2.
[7] E. Platzgummer, C. Klein, H. Loeschner, 'Electron multibeam technology for mask and wafer writing at 0.1 nm address grid', J. Micro/Nanolith MEMS MOEMS 12 (3), 031108 (July-September 2013).
[8] C. Klein, H. Loeschner, E. Platzgummer, '50 KeV electron multibeam mask writer the 11-nm HP node: first results of the proof-of-concept electron multibeam mask exposure tools', J. Micro/Nanolith MEMS MOEMS 11 (3), 031402 (August 2012).

The invention claimed is:

1. A resist composition comprising:
(i) a secondary electron generator, which increases the radiation-sensitivity of the resist composition, comprising a compound having an effective atomic number ($Z_{eff}$) greater than or equal to 40; and
(ii) a base component which is a radiation-sensitive resist material that undergoes a change upon exposure to radiation, such that radiation-exposed base component has different solubility properties to unexposed base component,
wherein the effective atomic number ($Z_{eff}$) is calculated as:

$$Z_{eff} = \Sigma a_i Z_i$$

where $Z_i$ is the atomic number of the ith element in the compound, and $a_i$ is the fraction of the sum total of the atomic numbers of all atoms in the compound constituted by said ith element, and wherein the secondary electron generator comprises a d-block, p-block, or f-block metal species.

2. The resist composition as claimed in claim 1, wherein the resist composition is an electron beam resist composition and/or a photoresist composition.

3. The resist composition as claimed in claim 1, wherein the secondary electron generator or compound(s) thereof has a $Z_{eff}$ of at least 20 units higher than the resist material, a density greater than that of the resist material, or a density greater than or equal to 2.5 g/cm³.

4. The resist composition as claimed in claim 1, wherein the secondary electron generator is or comprises a metal compound comprising a metal species having an oxidation state of +1 or higher and an atomic number (Z) greater than or equal to 57.

5. The resist composition as claimed in claim 1, wherein the secondary electron generator is soluble in the resist composition.

6. The resist composition as claimed in claim 1, wherein the resist material is or comprises a compound having an effective atomic number ($Z_{eff}$) less than or equal to 10.

7. The resist composition as claimed in claim 1, wherein the resist composition is a resist composition comprising:
(i) a resist material having an effective atomic number ($Z_{eff}$) less than or equal to 15 and having a density less than or equal to 2 g/cm³;
(ii) a secondary electron generator comprising a compound having an effective atomic number ($Z_{eff}$) greater than or equal to 40 and a density greater than or equal to 2.5 g/cm³; and
(iii) optionally a cross-linking agent;
wherein the secondary electron generator is soluble in the resist composition and the resist composition is a solution.

8. The resist composition as claimed in claim 7, wherein the $Z_{eff}$ excludes any solvates having a boiling point less than or equal to 150° C. at 100 kPa pressure.

9. The resist composition as claimed in claim 1, wherein the resist composition is free of any particulate matter.

10. The resist composition as claimed in claim 1, wherein the resist material has a density less than or equal to 2.0 g/cm³, and a $Z_{eff}$ less than or equal to 15.

11. The resist composition as claimed in claim 1, wherein the secondary electron generator is a metal halide.

12. The resist composition as claimed in claim 11, wherein the metal halide is part of a complex.

13. The resist composition as claimed in claim 1, wherein the secondary electron generator is a gold-based compound or a mercury-based compound.

14. The resist composition as claimed in claim 1, wherein the resist material acts as a vehicle for the secondary electron generator.

15. The resist composition as claimed in claim 1, wherein the resist material is or comprises a non-polymeric complex.

16. The resist composition as claimed in claim 1, wherein the $Z_{eff}$ excludes any solvates having a boiling point less than or equal to 150° C. at 100 kPa pressure.

17. A method of preparing a resist composition, the method comprising mixing together:
(i) a secondary electron generator, which increases the radiation-sensitivity of the resist composition, comprising a compound having an effective atomic number ($Z_{eff}$) greater than or equal to 40; and
(ii) a base component which is a radiation-sensitive resist material that undergoes a change upon exposure to radiation, such that radiation-exposed base component has different solubility properties to unexposed base component, wherein the effective atomic number ($Z_{eff}$) is calculated as:

$$Z_{eff} = \Sigma a_i Z_i$$

where $Z_i$ is the atomic number of the ith element in the compound, and $a_i$ is the fraction of the sum total of the atomic numbers of all atoms in the compound constituted by said ith element, and wherein the secondary electron generator comprises a d-block, p-block, or f-block metal species.

* * * * *